(12) United States Patent
Ditty et al.

(10) Patent No.: US 11,573,856 B1
(45) Date of Patent: Feb. 7, 2023

(54) TRANSMITTING DATA BETWEEN REGIONS OF VARYING SAFETY INTEGRITY LEVELS IN A SYSTEM ON A CHIP

(71) Applicant: NVIDIA Corporation, Santa Clara, CA (US)

(72) Inventors: Michael Ditty, Los Gatos, CA (US); Hari U. Krishnan, San Carlos, CA (US); Padam Patt Krishnani, Bangalore (IN); Jyotirmaya Swain, Bangalore (IN); Anirban Ghosh, Bangalore (IN); Shraddha Manohar Gondkar, San Jose, CA (US); Avinash J V, Bangalore (IN); Phanikumar Parvatham, Hyderabad (IN)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 17/477,360

(22) Filed: Sep. 16, 2021

(30) Foreign Application Priority Data

Jul. 30, 2021 (IN) .............................. 202111034491

(51) Int. Cl.
G06F 11/00 (2006.01)
G06F 11/10 (2006.01)
H03M 13/00 (2006.01)
H03M 13/09 (2006.01)
G06F 9/4401 (2018.01)

(52) U.S. Cl.
CPC ........ *G06F 11/1044* (2013.01); *G06F 9/4401* (2013.01); *H03M 13/09* (2013.01); *H03M 13/613* (2013.01)

(58) Field of Classification Search
None
See application file for complete search history.

(56) References Cited

U.S. PATENT DOCUMENTS

| 10,140,615 | B2 * | 11/2018 | Carpenter | .......... G06Q 20/3821 |
| 10,885,698 | B2 | 1/2021 | Muthler et al. | |
| 11,061,453 | B1 * | 7/2021 | Ruiz, III | ............. G06F 11/0751 |
| 11,217,323 | B1 * | 1/2022 | Sharma | .................. G11C 29/42 |

(Continued)

FOREIGN PATENT DOCUMENTS

DE 102019102573 A1 8/2019

OTHER PUBLICATIONS

Society of Automotive Engineers on-Road Automated Vehicle Standards Committee, "Taxonomy and Definitions for Terms Related to Driving Automation Systems for on-Road Motor Vehicles," Standard No. J3016-201609, issued Jan. 2014, revised Sep. 2016, 30 pages.

(Continued)

*Primary Examiner* — Mujtaba M Chaudry
(74) *Attorney, Agent, or Firm* — Davis Wright Tremaine LLP

(57) ABSTRACT

In various examples, a system includes a memory operating within a first risk level and circuitry operating within a second risk level that indicates more risk than the first risk level. The circuitry reads and/or writes data to a first memory address within the memory, and reads and/or writes an error detection code to a second memory address within the memory.

48 Claims, 19 Drawing Sheets

(56) References Cited

U.S. PATENT DOCUMENTS

| | | | | |
|---|---|---|---|---|
| 2014/0040695 A1* | 2/2014 | Iwasaki | ............... | G06F 11/1008 |
| | | | | 714/755 |
| 2015/0112730 A1* | 4/2015 | Binion | ................... | G07C 5/008 |
| | | | | 705/4 |
| 2016/0092306 A1* | 3/2016 | Benedict | ............... | G06F 11/106 |
| | | | | 714/764 |
| 2019/0235943 A1* | 8/2019 | Gordani | .............. | G06F 11/0793 |
| 2021/0089453 A1 | 3/2021 | Hayakawa et al. | | |
| 2021/0119780 A1 | 4/2021 | Hassan et al. | | |

OTHER PUBLICATIONS

Society of Automotive Engineers on-Road Automated Vehicle Standards Committee, "Taxonomy and Definitions for Terms Related to Driving Automation Systems for on-Road Motor Vehicles," Standard No. J3016-201806, issued Jan. 2014, revised Jun. 2018, 35 pages.

International Search Report and Written Opinion for Application No. PCT/US2022/038405, dated Oct. 28, 2022, filed Jul. 26, 2022, 12 pages.

* cited by examiner

TRANSMITTING DATA BETWEEN REGIONS OF VARYING SAFETY INTEGRITY LEVELS IN A SYSTEM ON A CHIP

CLAIM OF PRIORITY

This application claims the benefit of India Provisional Application No. 202111034491 titled "TRANSMITTING DATA BETWEEN REGIONS OF VARYING SAFETY INTEGRITY LEVELS IN A SYSTEM ON A CHIP," filed Jul. 30, 2021, the entire contents of which is incorporated herein by reference.

TECHNICAL FIELD

At least one embodiment pertains to accessing, by a first region of a circuit, memory in a second region of the circuit. For example, at least one embodiment pertains to a System on a Chip that implement various novel techniques described herein. By way of another example, at least one embodiment pertains to an autonomous vehicle including such a System on a Chip.

BACKGROUND

Automotive Safety Integrity Level ("ASIL") is a risk classification system for the functional safety of road vehicles defined by International Organization for Standardization ("ISO") 26262 Functional Safety Standard. There are four risk classification levels in this risk classification system identified as ASIL-A, ASIL-B, ASIL-C, and ASIL-D, with ASIL-D being the highest risk classification level. Thus, components specified as ASIL-D have higher safety requirements than components specified with a lower risk classification level (such as ASIL-B) and may be more expensive. Within many automotive platforms, at least some safety services are performed by an external control unit when particular faults are detected in an automotive System on a Chip ("SoC") that controls various driving functions of an autonomous or semi-autonomous vehicle. Generally speaking, the external control unit may operate at a higher risk level (e.g., ASIL-D) than the automotive SoC (e.g., ASIL-B). Unfortunately, such external control units introduce latency and can be expensive because they require separate components that are also present in the automotive SoC, such as DRAM, non-volatile memory, etc., and that each occupy space within the automotive platform (e.g., on a circuit board).

BRIEF DESCRIPTION OF THE DRAWINGS

The present systems and methods for isolating a region of a System on a Chip are described in detail below with reference to the attached drawing figures, wherein.

DETAILED DESCRIPTION

Figure 1:
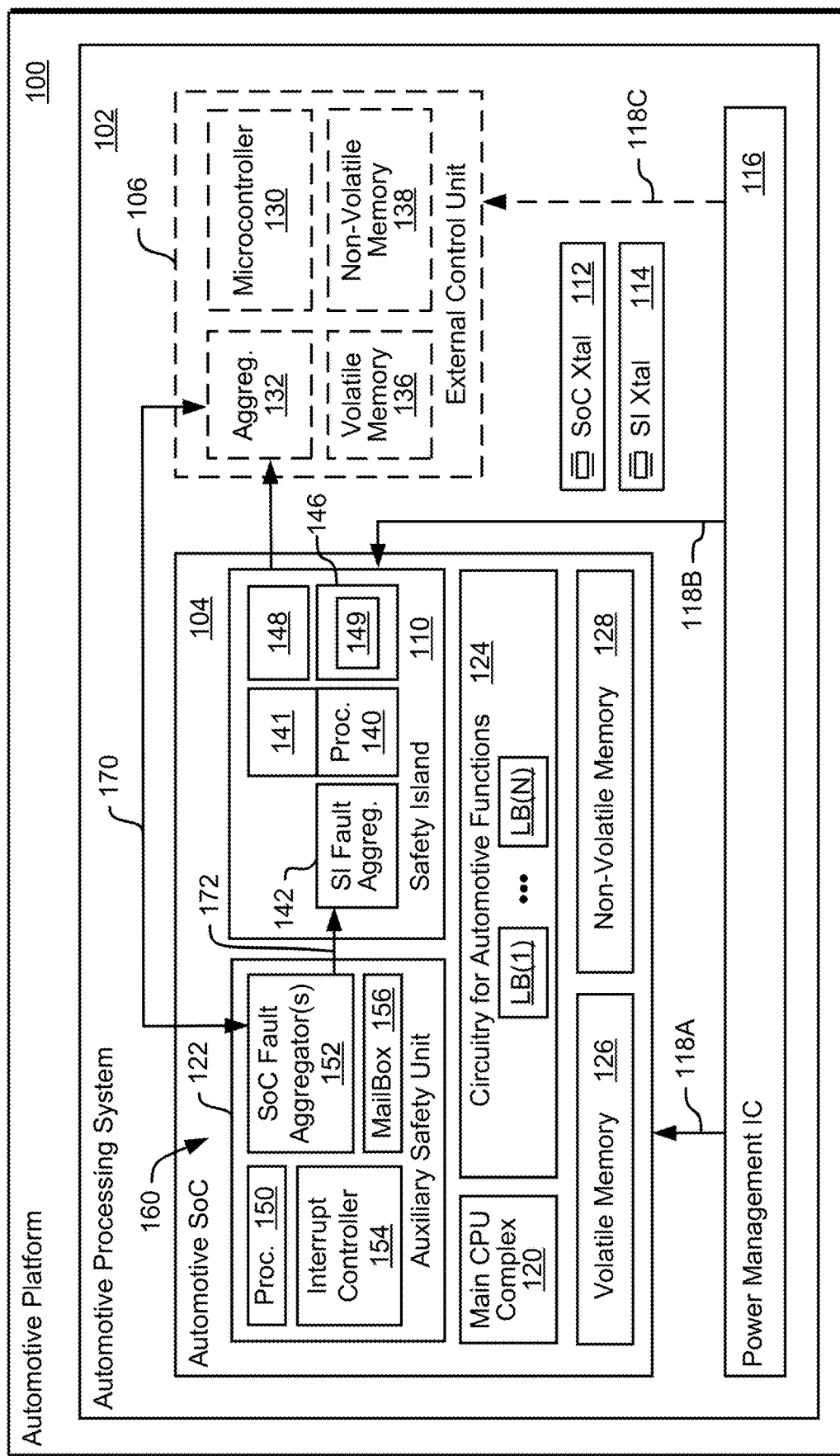
FIG. 1 is an illustration of an example automotive platform, in accordance with some embodiments of the present disclosure.

Systems and methods are disclosed related to isolating a region of a circuit operating at a higher risk level (e.g., ASIL-D) from other regions of the circuit operating at a lower risk level (e.g., ASIL-B). For example, a region or "island" dedicated to functional safety may be isolated (e.g., communicatively) from other components on a System on a Chip ("SoC"), such as an automotive SoC. FIG. 1 is an illustration of an example automotive platform 100, in accordance with at least one embodiment. The automotive platform 100 may implement an autonomous or semi-autonomous vehicle, such as an example autonomous vehicle 1200 (see FIG. 12). The automotive platform 100 includes an automotive processing system 102 which may implement a level of driving autonomy that is greater than Level 0 (no driving automation) as defined by the Society of Automotive Engineers ("SAE"). For example, the automotive processing system 102 may implement Level 2 (partial driving automation) to Level 5 (full driving automation) as defined by SAE. A Level 2 system may be referred to as an advanced driver assistance system ("ADAS").

The automotive processing system 102 includes at least one automotive SoC 104. The automotive SoC 104 performs at least some functions but may offload one or more safety functions to an optional external control unit 106 (e.g., including an external ASIL-D microcontroller unit). The optional external control unit 106 may operate under, and be compliant with, a higher risk classification level (e.g., ASIL-D) than the automotive SoC 104. In embodiments that include the optional external control unit 106, when a fault occurs in the automotive SoC 104, that fault is communicated to the optional external control unit 106, which may take one or more actions to return the automotive platform 100 to a safe state. Thus, at least a portion of the safety functions may be performed by the optional external control unit 106. However, the optional external control unit 106 may introduce latency and can be expensive because it may require separate components, such as DRAM, non-volatile memory, etc., that each occupy space within the automotive platform 100 (e.g., on a circuit board).

To avoid at least some of the latency and expense introduced by the optional external control unit 106, the automotive platform 100 of FIG. 1 includes a functional safety island or safety island ("SI") 110 integrated into the automotive SoC 104. The SI 110 may be implemented as a compute cluster that operates under, and is compliant with, a higher risk classification level (e.g., ASIL-D) compared to the rest of the automotive SoC 104. The SI 110 may perform at least a portion of the functions typically performed by the optional external control unit 106. The presence of the SI 110 allows the optional external control unit 106 to be omitted entirely or implemented using a less sophisticated and/or lower cost external control unit. For example, when the optional external control unit 106 is present it may perform one or more legacy functions, such as providing communication on a Controller Area Network ("CAN" bus) bus, providing a reset controller for the automotive SoC 104, and/or performing on-board voltage monitoring.

In addition to the automotive SoC 104 and the optional external control unit 106 (when present), the automotive processing system 102 may include a first (SoC) clock 112 for the automotive SoC 104, a second (SI) clock 114 for the SI 110, and a power management integrated circuit ("IC") 116. Each of the components of the automotive processing system 102 is at least partially implemented in hardware. Logic components of the automotive processing system 102 (e.g., the automotive SoC 104 and the optional external control unit 106) are each typically implemented in hardware logic circuits within one or more integrated circuit chips. The logic may be hard-wired or programmable, or a combination of hard-wired and programmable elements. Additionally or alternatively, certain functions of the automotive processing system 102 may be implemented in software or firmware executed by an embedded microprocessor or microcontroller.

The first and second clocks 112 and 114 provide two separate clock signals to the automotive SoC 104. Specifically, a first clock signal generated by the first (SoC) clock 112 is provided to components 160 of the automotive SoC 104 other than the SI 110, and a second clock signal generated by the second (SI) clock 114 is provided to the SI 110. Thus, the SI 110 and the other components 160 may be characterized as operating within separate clock domains. The clock domain of the SI 110 will be referred to as a SI clock domain and the clock domain of the other components 160 will be referred to as a SoC clock domain. The first and second clocks 112 and 114 may each be implemented at least in part as crystal oscillators. The first (SoC) clock 112 may be connected to each of at least some of the other components 160 of the automotive SoC 104 via a first clock connection (not shown), such as a wire, a signal trace, and the like. Thus, the first (SoC) clock 112 may provide the first clock signal to the other components 160 of the automotive SoC 104 via the first clock connection (not shown). The second (SI) clock 114 may be connected to each of at least some of the components of the SI 110 via a second clock connection (not shown), such as a wire, a signal trace, and the like. Thus, the second (SI) clock 114 may provide the second clock signal to the SI 110 via the second clock connection (not shown).

The power management IC 116 supplies power to other components of the automotive processing system 102. For example, power rails or connections 118A-118C connect the power management IC 116 to the other components 160 of the automotive SoC 104, the SI 110, and the optional external control unit 106, respectively. The power connections 118A-118C help electrically isolate the other components 160 of the automotive SoC 104, the SI 110, and the optional external control unit 106 (when present), respectively, from one another. Thus, the SI 110 may operate within a separate voltage domain from the other components 160 and the optional external control unit 106 (when present). The voltage domain of the SI 110 will be referred to as a SI voltage domain and the voltage domain of the other components 160 will be referred to as a SoC voltage domain. The power management IC 116 may be implemented as one or more integrated circuits that supply adequate power to components of the automotive processing system 102. The power connections 118A-118C may each be implemented as a conductive element, such as an electrical transmission line, a wire, a power trace, and the like.

As mentioned above, the SI 110 operates in the SI clock domain and the SI voltage domain. Together, the SI clock domain and the SI voltage domain will be referred to as a SI domain. Similarly, the other components 160 operate in the SoC clock domain and the SoC voltage domain. Together, the SoC clock domain and the SoC voltage domain will be referred to as a SoC domain The other components 160 of the automotive SoC 104 may include a main central processing unit ("CPU") complex 120, an auxiliary safety unit 122, circuitry 124 for performing automotive SoC functions, volatile data storage or memory 126 (e.g., dynamic random-access memory ("DRAM")), and non-volatile data storage or memory 128. The main CPU complex 120 may be implemented as one or more processor operating at ASIL-B. In such embodiments, the automotive SoC 104 may operate at multiple or mixed ASILs because the SI 110 may operate at a higher level ASIL (e.g., ASIL-D). By way of non-limiting examples, the circuitry 124 may include hardware implementing one or more displays, one or more automotive input/output ("I/O") controllers, one or more memory controller, one or more interconnect, etc. In the embodiment illustrated, the circuitry 124 is depicted as including or implementing a plurality of logic blocks LB(1)-LB(N), which are often each referred to as an Intellectual Property "IP." The logic blocks LB(1)-LB (N) may implement various functions within the autonomous vehicle (e.g., the autonomous vehicle 1200 illustrated in FIG. 12).

The optional external control unit 106 may include a controller 130, a fault aggregator 132, volatile data storage or memory 136 (e.g., DRAM), and non-volatile data storage or memory 138. The optional external control unit 106 may also include one or more logic blocks (not shown) that implement those safety functions performed by the optional external control unit 106. The controller 130 may be implemented as one or more processors (e.g., microcontroller(s)) operating at ASIL-D. The controller 130 executes instructions, such as instructions compliant with one or more Automotive Open System Architecture ("AUTOSAR") software standards, stored in the non-volatile memory 138. The instructions may instruct the controller 130 to take appropriate actions when the fault aggregator 132 receives a fault from the automotive SoC 104.

In one or more embodiments, the SI 110 includes a processor 140, an interrupt controller 141, a SI fault aggregator 142, volatile data storage or memory 146 (e.g., static random-access memory ("SRAM")), and one or more logic blocks 148. The processor 140 may be implemented as a cluster of processors, such as highly rated ASIL-D safety processors. The processor 140 executes instructions 149, such as instructions compliant with the AUTOSAR software standard(s), obtained from the non-volatile memory 128 at boot-up and stored in the volatile memory 146. The instructions 149 may instruct the processor 140 to take appropriate actions when the SI fault aggregator 142 receives a fault from the other components 160 of the automotive SoC 104. The logic block(s) 148 may help implement those safety functions performed by the SI 110.

The auxiliary safety unit 122 may be implemented as a real-time safety auxiliary processing unit and/or may be rated ASIL-B or higher. In other words, the auxiliary safety unit 122 may operate at the same risk classification level as or at a higher risk classification level than other components within the SoC domain. The auxiliary safety unit 122 includes a processor 150, one or more SoC fault aggregators 152, an interrupt controller 154, and one or more logic blocks, that will be referred to as mailbox(es) 156. The SI fault aggregator 142 and the fault aggregator 132 (when present) may each receive faults from the SoC fault aggregator(s) 152. Thus, the SoC fault aggregator(s) 152 may be connected to the fault aggregator 132 via one or more fault interfaces 170, and is connected to the SI fault aggregator 142 via one or more fault interfaces 172. Each of the fault interfaces 170 and 172 includes a connection, such as a wire, a signal trace, and the like, that physically connects each of the SoC fault aggregator(s) 152 to a respective one of the fault aggregator 132 or the SI fault aggregator 142.

The mailbox(es) 156 may include a first mailbox to which the processor 150 writes and from which the processor 140 reads and a second mailbox to which the processor 140 writes and from which the processor 150 reads. The mailbox(es) 156 may be used by the processor 150 (e.g., a central processing unit ("CPU") rated ASIL-B or higher) to report mailbox interrupts to the interrupt controller 141 and receive interrupts from the interrupt controller 141. Thus, the fault interface(s) 172 includes at least one signal conductor that connects the mailbox(es) 156 to the interrupt controller 141. Each mailbox interrupt includes a severity identifier indicating a severity of the error. By way of a non-limiting example, the severity identifier may be a numerical value ranging from a minimum value (e.g., zero) to a maximum value (e.g., seven). By way of another non-limiting example, the interrupt may have an interrupt number that is a-priori encoded to indicate the severity. The processor 140 and/or the processor 150 may write fault information to the mailbox(es) 156. The fault information includes information about the error(s) that generated the fault, such as logic block name(s) where the error(s) arose, logic block diagnostic identifier(s), nature of the fault, the severity identifier, and the like.

Integrating the SI 110 into the automotive SoC 104 may allow a number of separate components (e.g., the volatile memory 136 and the non-volatile memory 138) to be omitted from the automotive processing system 102 if the optional external control unit 106 is also omitted. Nevertheless, it is necessary to isolate the SI 110 from the other components 160 (e.g., the main CPU complex 120, the auxiliary safety unit 122, the circuitry 124, the volatile memory 126 and the non-volatile memory 128) of the automotive SoC 104 so that potential issues arising in one or more of the other components 160 will not negatively affect the SI 110. Such isolation, for example, may help prevent the SI 110 from being affected by an outage occurring in one or more of the other components 160 of the automotive SoC 104. Non-limiting examples of the types of outages that might occur in one or more of the other components 160 include random faults, clock issues, power issues, and/or voltage issues. Due to spatial proximity and one or more interfaces 200 (see FIG. 2) that SI 110 shares with the other components 160 of the automotive SoC 104, such outages may migrate to the SI 110 and prevent the SI 110 from performing fallback and/or failsafe functionality for which the SI 110 was integrated into the automotive SoC 104. Thus, the automotive processing system 102 insulates the SI 110 from the other components 160 of the automotive SoC 104 to achieve isolation comparable to that between the automotive SoC 104 and the optional external control unit 106. Such isolation may be achieved by the first and second clocks 112 and 114, the first and second power connections 118A and 118B, and the interface(s) 200.

The first (SoC) clock 112 is separate from the second (SI) clock 114 (e.g., includes a separate reference crystal) which helps to isolate the SI 110 from the other components 160 of the automotive SoC 104. Likewise, the first power connection 118A is separate from the second power connection 118B, which helps to isolate the SI 110 from the other components 160 of the automotive SoC 104. As mentioned above, the SI 110 may operate in the separate SI voltage domain from the other components 160 of the automotive SoC 104. But, even with the separate second (SI) clock 114 and separate second power connection 118B, the SI 110 communicates with the other components 160 of the automotive SoC 104 via the interface(s) 200 (see FIG. 2).

The logic block(s) 148 include(s) clock and reset circuitry 230 (see FIG. 2) that is connected to the dedicated second (SI) clock 114. The dedicated second (SI) clock 114 may be used as a reference clock for clock and reset circuitry 230. For example, the clock and reset circuitry 230 may include an internal dedicated phase-locked loop ("PLL"), which is used to derive other functional and debug clocks of the SI 110. By way of non-limiting examples, the clock and reset circuitry 230 may provide a debug clock signal and a test clock signal that may be derived from the PLL. The clock and reset circuitry 230 may generate all clock and reset signals used within the SI 110. In other words, the clock and reset circuitry 230 may generate the clock signal(s) and reset(s) used within the SI domain. Additionally or alternatively, the second (SI) clock 114 may be used directly as a functional clock for one or more of the logic block(s) 148. In this manner, the SI 110 uses the locally generated clock signal(s) and reset(s) and/or the clock signal provided by the second (SI) clock 114. No clock signals or resets from the other components 160 are used in SI 110. The clock and reset circuitry 230 helps ensure that no perturbance from logic generating resets (e.g., reset blocks) within the other components 160 will reach the components of the SI 110.

Figure 2:
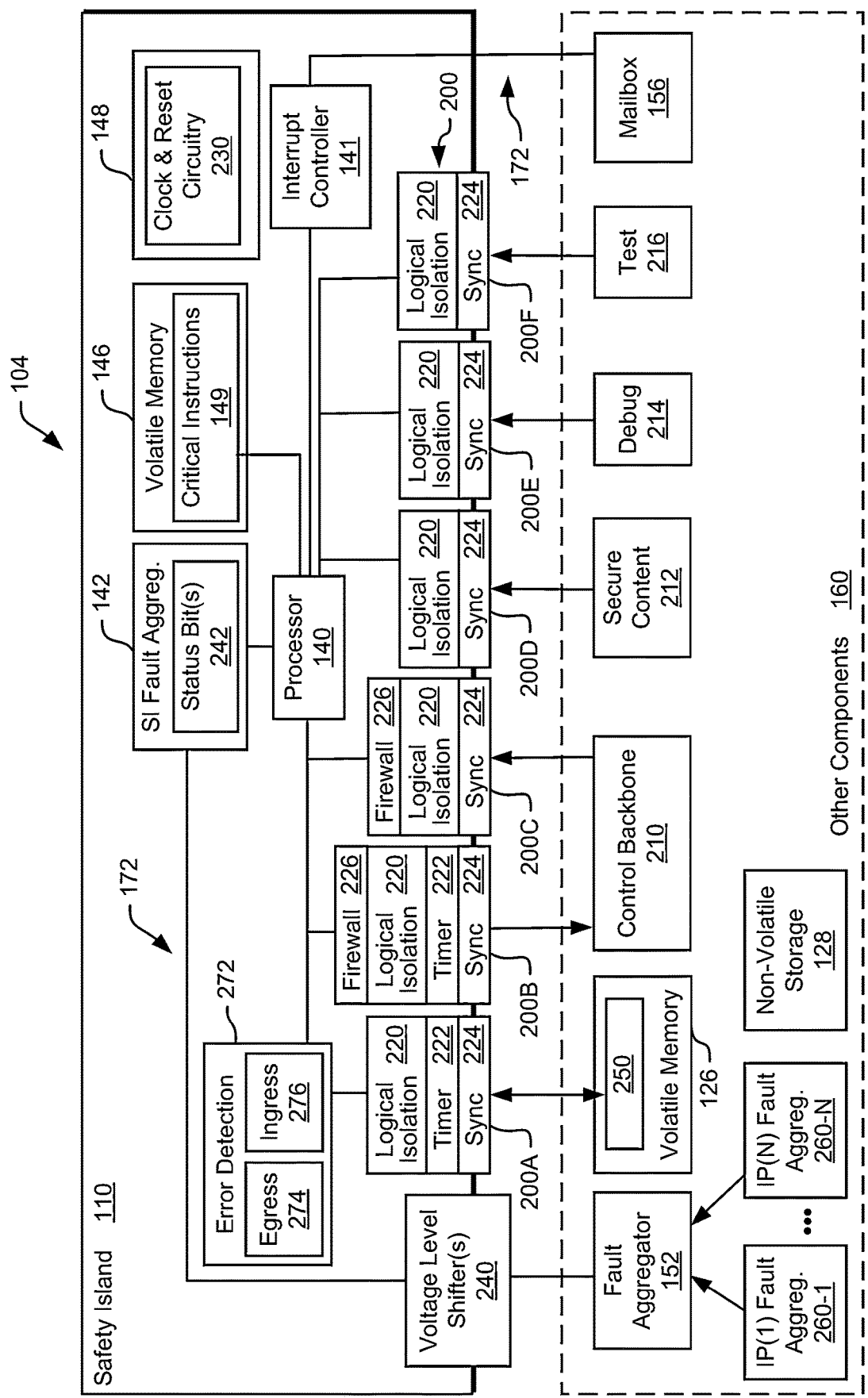
FIG. 2 is an illustration of example interface(s) connecting a safety island integrated into an automotive SoC with other components of the automotive SoC, in accordance with some embodiments of the present disclosure.

FIG. 2 is an illustration of the interface(s) 200 connecting the SI 110 with the other components 160 of the automotive SoC 104, in accordance with at least one embodiment. Referring to FIG. 2, the interface(s) 200 provide(s) logical isolation for the circuitry and logic of the SI 110 in the automotive SoC 104. In the embodiment illustrated, the interface(s) 200 include the fault interface(s) 172, a volatile memory interface 200A, a first control backbone interface 200B, a second control backbone interface 200C, a secure content interface 200D, a debug interface 200E, and a test interface 200F. The fault interface(s) 172 may not be logically isolated from the SoC fault aggregator(s) 152 but may each pass through or include one or more voltage level shifters 240 that each provides electrical isolation between the SI and SoC voltage domains. While the voltage level shifter(s) 240 each provide electrical isolation, the voltage level shifter(s) 240 may not provide adequate isolation for some types of failures, such as interrupt storms, fault storms, and/or continuous assertions. The SI fault aggregator 142 may include one or more status bits 242 that receive fault information via the fault interface(s) 172 and provide notification of such failures to the instructions 149 executed by the processor 140. In the embodiment illustrated, the status bits 242 include status bits "BT1," "BT2," and "BT3" (see FIG. 4). The instructions 149 direct the processor 140 to use this notification to mitigate outages occurring on the fault interface(s) 172.

The volatile memory interface 200A is an interface between the processor 140 and the volatile memory 126 of the automotive SoC 104. The volatile memory interface 200A allows the processor 140 to write information in the volatile memory 126 and read information from the volatile memory 126. The volatile memory interface 200A includes one or more connections with the volatile memory 126, such as a wire, a signal trace, and the like. The volatile memory interface 200A may include the logical isolation control 220, an access timer 222, and domain synchronization circuitry 224. The logical isolation control 220 includes a gate or lock mechanism that may be selectively locked and unlocked by the processor 140. The access timer 222 allows an access attempt initiated by the processor 140 to timeout.

The domain synchronization circuitry 224 includes phase synchronization circuitry and voltage level shifter(s). The phase synchronization circuitry helps to synchronize the phases of signals communicated across the SI and SoC domains, which were generated using the separate first and second clocks 112 and 114 (see FIG. 1). Resets generated by the clock and reset circuitry 230 may be used by any elements that cross the SI and SoC voltage and clock domains, such as the phase synchronization circuitry. The phase synchronization circuitry has a SoC portion and a SI portion that may each function as a separate synthesis top. The SoC portion physically resides in the SoC domain and the SI portion physically resides in the SI domain. The logic of both the SI and SoC portions uses resets generated by the clock and reset circuitry 230. Thus, the resets generated by the SI 110, may be used by the logic of the automotive SoC 104, which may operate at a lower ASIL than the SI 110, but resets generated by the automotive SoC 104 are not communicated to and cannot be used by the SI 110. By way of a non-limiting example, the phase synchronization circuitry may be implemented as a split first-in-first-out ("fifo") and the like. The voltage level shifter(s) of the domain synchronization circuitry 224 may be substantially identical to the voltage level shifter(s) 240 and adjust the voltage of the signals being transmitted across the SI and SoC voltage domains to allow the signals to be safely communicated across the SI and SoC domains. When the access timer 222 indicates an access by the processor 140 has timed out, the request may be removed from the domain synchronization circuitry 224 (e.g., popped from the split fifo).

When the volatile memory interface 200A is unlocked, the processor 140 may access the volatile memory 126, which starts the access timer 222. When the access timer 222 indicates more than a first predetermined amount of time has elapsed and a response from the volatile memory 126 has not been received, the processor 140 indicates a safety fault, uses the logical isolation control 220 to lock the volatile memory interface 200A, optionally locks any of the interface(s) 200 that are unlocked, and optionally takes one or more actions configured to return the automotive platform 100 (see FIG. 1) to a safe state. On the other hand, when the response is received before the access timer 222 indicates that the first predetermined amount of time has elapsed, the access timer 222 resets itself, the processor 140 completes the access, and the processor 140 locks the volatile memory interface 200A after the access has completed. Thus, the volatile memory interface 200A remain(s) locked whenever the processor 140 is not accessing the volatile memory 126, which helps protect the SI 110 from faults and/or outages traveling to the SI 110 from the volatile memory 126.

The first and second control backbone interfaces 200B and 200C are interfaces between the processor 140 and a control backbone 210. The control backbone 210 may be implemented as bus and the like. The first control backbone interface 200B is for communications from the processor 140 to the control backbone 210, and the second control backbone interface 200C is for communications from the control backbone 210 to the processor 140. By way of a non-limiting example, the processor 140 may access at least some of the other components 160 (e.g., the circuitry 124, the mailbox(es) 156, and the non-volatile memory 128) of the automotive SoC 104 via the control backbone 210.

The first control backbone interface 200B allows the processor 140 to send instructions and/or information to the control backbone 210. The first control backbone interface 200B may include the logical isolation control 220, the access timer 222, the domain synchronization circuitry 224, and a firewall 226. The logical isolation control 220 of the first control backbone interface 200B is substantially identical to and functions substantially identically to the logical isolation control 220 of the volatile memory interface 200A. Thus, the logical isolation control 220 of the first control backbone interface 200B allows the processor 140 to lock and unlock the first control backbone interface 200B. The access timer 222 of the first control backbone interface 200B allows an access attempt initiated by the processor 140 to timeout. The domain synchronization circuitry 224 of the first control backbone interface 200B is substantially identical to and functions substantially identically to the domain synchronization circuitry 224 of the volatile memory interface 200A. The firewall 226 of the first control backbone interface 200B implements one or more security rules and either permits or blocks each communication based on the security rule(s).

The second control backbone interface 200C allows the processor 140 to receive instructions and/or information from the control backbone 210. The second control backbone interface 200C may include the logical isolation control 220, the domain synchronization circuitry 224, and the firewall 226. The logical isolation control 220 of the second control backbone interface 200C is substantially identical to and functions substantially identically to the logical isolation control 220 of the volatile memory interface 200A. Thus, the logical isolation control 220 of the second control backbone interface 200C allows the processor 140 to lock and unlock the second control backbone interface 200C. The domain synchronization circuitry 224 of the second control backbone interface 200C is substantially identical to and functions substantially identically to the domain synchronization circuitry 224 of the volatile memory interface 200A. The firewall 226 of the second control backbone interface 200C implements one or more security rules and either permits or blocks each communication based on the security rule(s).

The secure content interface 200D is an interface between the processor 140 and secure content circuitry 212. The secure content interface 200D allows the processor 140 to receive instructions and/or information (e.g., secure and/or sensitive content) from the secure content circuitry 212. The secure content interface 200D may include the logical isolation control 220 and the domain synchronization circuitry 224. The logical isolation control 220 of the secure content interface 200D is substantially identical to and functions substantially identically to the logical isolation control 220 of the volatile memory interface 200A. Thus, the logical isolation control 220 of the secure content interface 200D allows the processor 140 to lock and unlock the secure content interface 200D. The domain synchronization circuitry 224 of the secure content interface 200D is substantially identical to and functions substantially identically to the domain synchronization circuitry 224 of the volatile memory interface 200A.

The debug interface 200E is an interface between the processor 140 and debug circuitry 214. The debug interface 200E allows the processor 140 to receive instructions and/or information from the debug circuitry 214. The debug interface 200E may include the logical isolation control 220 and the domain synchronization circuitry 224. The logical isolation control 220 of the debug interface 200E is substantially identical to and functions substantially identically to the logical isolation control 220 of the volatile memory interface 200A. Thus, the logical isolation control 220 of the debug interface 200E allows the processor 140 to lock and unlock the debug interface 200E. The domain synchronization circuitry 224 of the debug interface 200E is substantially identical to and functions substantially identically to the domain synchronization circuitry 224 of the volatile memory interface 200A. As mentioned above, the SI 110 and the other components 160 operate in separate clock domains. In one or more embodiments, no signals from an external clock of one or more of the other components 160 of the automotive SoC 104, such as the debug circuitry 214, feed into the SI 110. Debug functions performed by the automotive SoC 104 receive the debug clock signal via the domain synchronization circuitry 224 of the debug interface 200E, which switches or converts the debug functions performed by the automotive SoC 104 to using the debug clock signal generated by the SI 110 and/or the second (SI) clock 114. Because the debug logic is not used while the SI 110 is in the mission mode (e.g., when the vehicle is driving), the SI 110 includes a first clock gate on the debug clock to prevent any interference that could potentially be caused by the debug clock signal. By way of a non-limiting example, the first clock gate may be a component of the clock and reset circuitry 230. The first clock gate may be controlled (e.g., selectively switched on and off) using a first configuration bit set by the processor 140.

The test interface 200F is an interface between the processor 140 and test circuitry 216. The test interface 200F allows the processor 140 to receive instructions and/or information from the test circuitry 216. The test interface 200F may include the logical isolation control 220 and the domain synchronization circuitry 224. The logical isolation control 220 of the test interface 200F is substantially identical to and functions substantially identically to the logical isolation control 220 of the volatile memory interface 200A. Thus, the logical isolation control 220 of the test interface 200F allows the processor 140 to lock and unlock the test interface 200F. The domain synchronization circuitry 224 of the test interface 200F is substantially identical to and functions substantially identically to the domain synchronization circuitry 224 of the volatile memory interface 200A. As mentioned above, external signals from one or more of the other components 160 of the automotive SoC 104, such as the test circuitry 216, are prevented from being fed into the SI 110 through this configuration. Test functions performed by the automotive SoC 104 receive the test clock signal via the domain synchronization circuitry 224 of the debug interface 200E, which switches or converts the test functions performed by the automotive SoC 104 to using the test clock signal generated by the SI 110 and/or the second (SI) clock 114. Because the test logic is not used while the SI 110 is in the mission mode (e.g., when the vehicle is driving), the SI 110 includes a second clock gate on the test clock to prevent any interference that could potentially be caused by the test clock signal. By way of a non-limiting example, the second clock gate may be a component of the clock and reset circuitry 230. The second clock gate may be controlled (e.g., selectively switched on and off) using a second configuration bit set by the processor 140.

The SI 110 may have at least two modes of operation, an isolated or cocoon mode and a non-isolated mode. When the SI 110 is operating in the cocoon mode, the only information from the automotive SoC 104 that is permitted to enter the SI 110 is fault information, which enters the SI 110 via the fault interface(s) 172. In this manner, the SI fault aggregator 142 maintains a cumulative health state of the automotive SoC 104 and the SI 110. On the other hand, when the SI 110 is operating in the non-isolated mode, information may enter the SI 110 via one or more of the interface(s) 200. Whether the SI 110 is operating in the cocoon mode or the non-isolated mode is determined at least in part by instructions 149 executed by the processor 140 and at least in part by the interface(s) 200.

To help prevent a potential safety critical issue originating in the other components 160 of the automotive SoC 104 from reaching the SI 110 via one or more of the interface(s) 200, each of the interface(s) 200 includes the separate logical isolation control 220 that is selectively locked and unlocked by the processor 140. When the lock mechanism of the logical isolation control 220 is locked by the processor 140, the lock mechanism prevents all communication between the automotive SoC 104 and the SI 110 via the locked interface. On the other hand, the interface may be unlocked by the processor 140 to allow such communication via the unlocked interface. Thus, the processor 140 may selectively place the SI 110 in the cocoon mode or the non-isolated mode. Whenever all of the interface(s) 200 is/are locked, the processor 140 cannot access either the volatile memory 126 or the non-volatile memory 128 and executes the instructions 149 stored in the volatile memory 146 (e.g., SRAM) resident within the SI 110.

Figure 3:
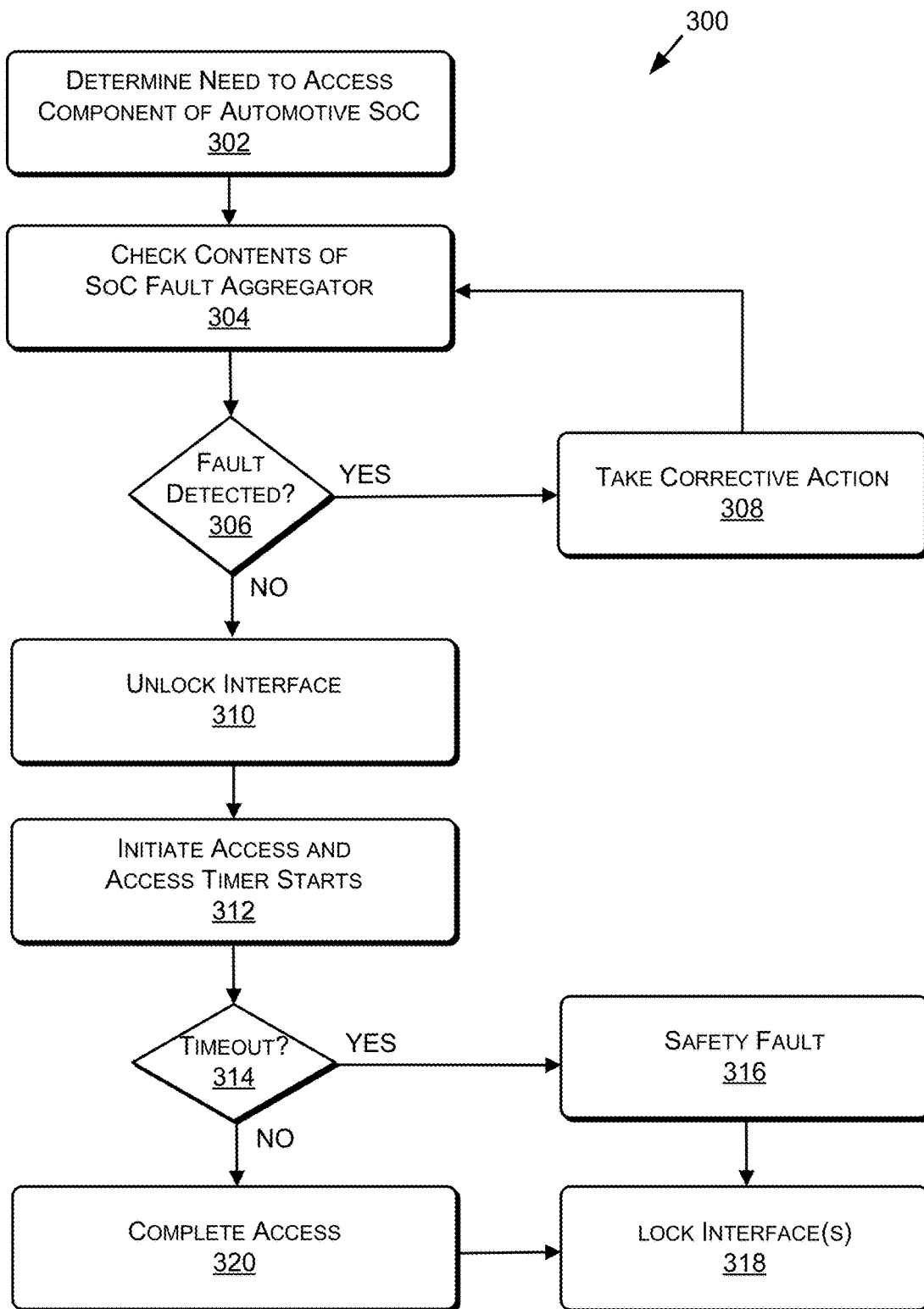
FIG. 3 is a flow diagram showing a method for transitioning the safety island between cocoon and non-isolation modes, in accordance with some embodiments of the present disclosure.

Now referring to FIG. 3, each block of a method 300, described herein, includes a computing process that may be performed using any combination of hardware, firmware, and/or software. For instance, various functions may be carried out by a processor (e.g., the processor 140 illustrated in FIGS. 1, 2, and 4) executing instructions (e.g., the instructions 149 illustrated in FIGS. 1, 2, and 4) stored in memory (e.g., the volatile memory 146 illustrated in FIGS. 1, 2, and 4). The method 300 may also be embodied as computer-usable instructions stored on computer storage media. The method 300 may be provided by a standalone application, a service or hosted service (standalone or in combination with another hosted service), or a plug-in to another product, to name a few. In addition, the method 300 is described, by way of example, with respect to the automotive platform 100 of FIG. 1. However, the method 300 may additionally or alternatively be executed by any one system, or any combination of systems, including, but not limited to, those described herein.

FIG. 3 is a flow diagram showing the method 300 for transitioning the SI 110 between the cocoon and non-isolation modes, in accordance with some embodiments of the present disclosure. For ease of illustration, the method 300 will be described as being performed by the processor 140 (see FIGS. 1, 2, and 4). Referring to FIG. 3, at first block 302, the processor 140 determines that it needs to communicate with one of the other components 160 (see FIGS. 1 and 2) of the automotive SoC 104. For example, this communication may occur over the volatile memory interface 200A or the first control backbone interface 200B, which each allow the SI 110 to initiate communications with the other components 160 of the automotive SoC 104. Alternatively, this communication may occur over the second control backbone interface 200C, the secure content interface 200D, the debug interface 200E, or the test interface 200F, which each allow the SI 110 to receive communications initiated by the other components 160 of the automotive SoC 104. As mentioned above, communication occurs over the fault interface(s) 172 (see FIG. 2) independently of whether the SI 110 is in the cocoon mode or the non-isolation mode.

Whenever the processor 140 needs to communicate with a particular one of the other components 160 of the automotive SoC 104, the processor 140 makes a determination that communicating with the particular component is safe before attempting to do so. To make this determination, in block 304, the processor 140 may check the contents of the SI fault aggregator 142, which receives fault information, via the fault interface(s) 172 (see FIG. 2), from the SoC fault aggregator(s) 152 that is/are external to the SI 110. As mentioned above, the fault interface(s) 172 is/are not logically isolated from the SoC fault aggregator(s) 152 but each pass through or include the voltage level shifter(s) 240 that provide(s) electrical isolation between the SI and SoC voltage domains.

In decision block 306, the processor 140 determines whether any faults have been detected in the SI fault aggregator 142. The decision in decision block 306 is "YES," when at least one fault is detected meaning that a fault identified for one or more of the other components 160 has been reported to the SI fault aggregator 142 by the SoC fault aggregator(s) 152. The processor 140 may detect the fault using the status bits 242 within the SI fault aggregator 142. The status bits 242 may be characterized as tracking the health of the automotive SoC 104. Alternatively, the SI fault aggregator 142 may notify the processor 140 of the fault by sending an interrupt to the processor 140. Otherwise, the decision in decision block 306 is "NO" when no faults are detected.

When the decision in decision block 306 is "YES," in block 308, the processor 140 may take one or more corrective actions. The corrective action(s) may help bring the vehicle to a safe state. By way of non-limiting examples, such corrective actions may include applying the vehicle's brakes, reducing the vehicle's speed, routing the vehicle to the shoulder of the road, and the like. Then, the processor 140 may return to block 304.

When the decision in decision block 306 is "NO," in block 310, the processor 140 unlocks the lock mechanism of the logical isolation control 220 of a particular one of the interface(s) 200 connected to the particular component if the lock mechanism of the particular interface was locked. In other words, the processor 140 may determine that it is safe to access the particular component of the automotive SoC 104 via the particular interface, when the SI fault aggregator 142 is not storing any faults. Thus, the processor 140 unlocks the particular interface in block 310.

Then, in block 312, the processor 140 may send communications to or receive communications from the particular component via the unlocked particular interface, which automatically starts the access timer 222 of the particular interface. When the particular interface is unlocked, the processor 140 may initiate one or more strongly ordered accesses (one at a time) into the automotive SoC 104. The access timer 222 starts automatically on a per access basis. Thus, the access timer 222 may start counting down as soon as a particular access is initiated by the processor 140.

In decision block 314, the processor 140 determines whether a timeout has occurred. The decision in decision block 314 is "YES," when the access timer 222 indicates more than the first predetermined amount of time has elapsed and a response from the particular component has not been received. Otherwise, the decision in decision block 314 is "NO," when a response is received from the particular component before the access timer 222 indicates that more than the first predetermined amount of time has elapsed.

When the decision in decision block 314 is "YES," in block 316, the processor 140 indicates a safety fault has occurred. Then, in block 318, the processor 140 locks the lock mechanism of the logical isolation control 220 of the particular interface, optionally locks the lock mechanism of the logical isolation control 220 of any of the other interface(s) that is/are unlocked, and optionally takes one or more actions configured to return the automotive platform 100 to a safe state.

On the other hand, when the decision in decision block 314 is "NO," in block 320, the processor 140 completes the communication. The access timer 222 automatically resets. Then, in block 318, the processor 140 locks the lock mechanism of the particular interface. Thus, the method 300 ensures that the interface(s) 200 remain(s) locked whenever the processor 140 is not accessing one of the other components 160 of the automotive SoC 104. Then, the method 300 terminates.

The SI 110 may avoid accessing the shared non-volatile memory 128 by copying the instructions 149 (e.g., critical instructions that bring the system to a safe state) from the shared non-volatile memory 128 into its internal volatile memory 146 when the automotive SoC 104 is booted. The processor 140 may authenticate and validate the instructions 149 before the SI 110 enters a mission mode, which enables the vehicle drive cycle. The SI 110 may operate in the mission mode and either the cocoon mode or the non-isolated mode at the same time. The instructions 149 remain in the volatile memory 146, which allows the processor 140 to avoid accessing the shared non-volatile memory 128. Non-critical data, for example, application code, fusion data, and the like, may be obtained from the shared volatile memory 126 using an internal direct memory access ("DMA") engine 402 (see FIG. 4) included in the SI 110. The DMA engine 402 may optionally be a component of the processor 140. A failure of the DMA engine 402 will not negatively impact the processor 140 because, even if the DMA engine 402 fails while paging data obtained from the shared volatile memory 126, the processor 140 will continue executing the instructions 149 stored in the volatile memory 146.

Figure 4:
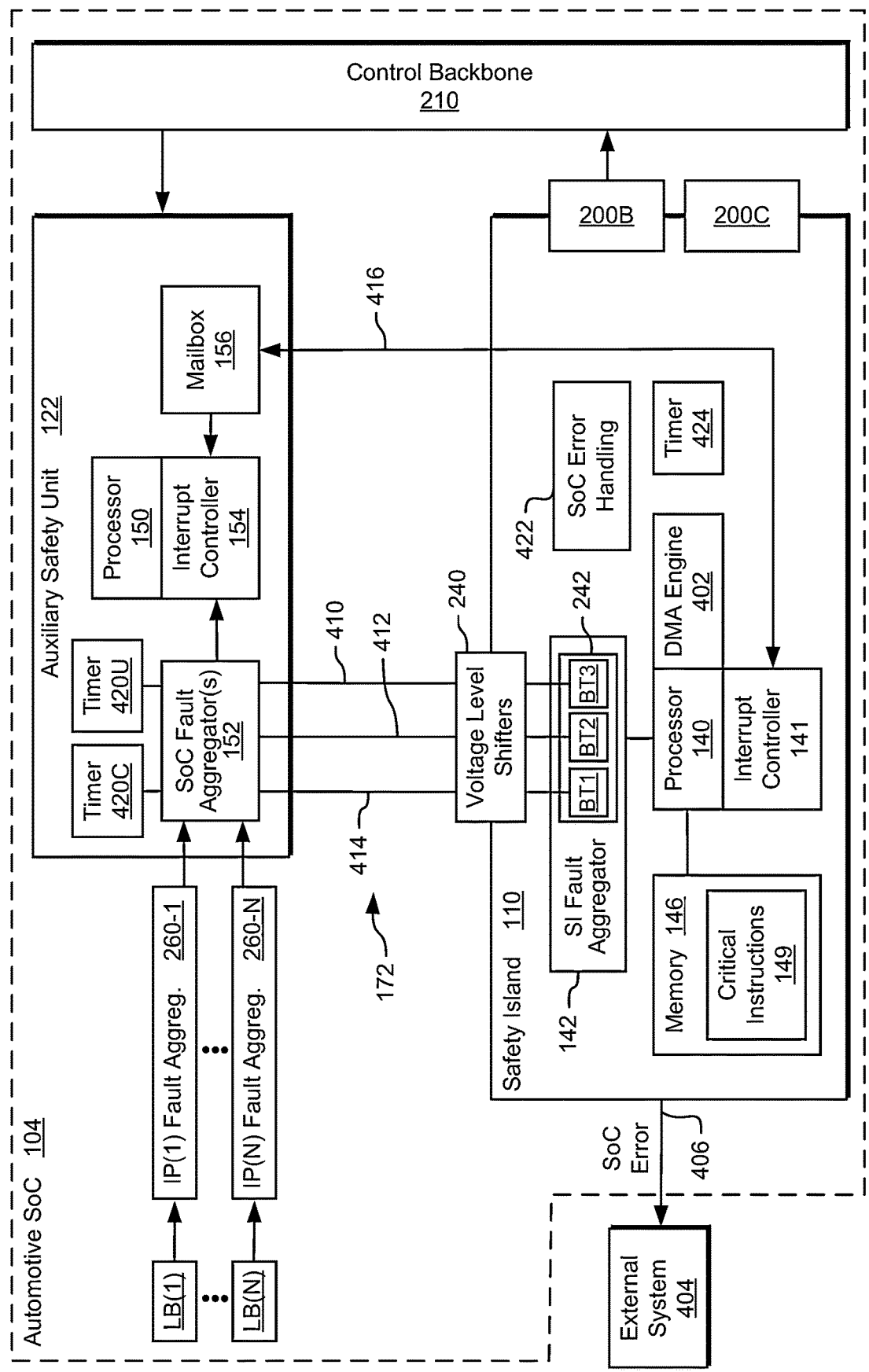
FIG. 4 is an illustration of example fault interface(s) that communicate faults to the safety island from the other components of the automotive SoC, in accordance with some embodiments of the present disclosure.

FIG. 4 is an illustration of the fault interface(s) 172, in accordance with some embodiments of the present disclosure. Referring to FIG. 4, the logic blocks LB(1)-LB(N) of the automotive SoC 104 may be associated first fault aggregators 260-1 to 260-N, respectively. The first fault aggregators 260-1 to 260-N aggregate faults generated by the logic blocks LB(1) to LB(N), respectively, and transmit first aggregated fault signals to the auxiliary safety unit 122 of the automotive SoC 104. The auxiliary safety unit 122 implements the second SoC fault aggregator(s) 152, which aggregate(s) the first aggregated fault signal(s) received from the first fault aggregators 260-1 to 260-N and transmit(s) one or more second aggregated fault signals to the optional external control unit 106 (see FIG. 1), when present. When the optional external control unit 106 is notified of a fault by the second aggregated fault signal(s), the optional external control unit 106 may take one or more actions from among a number of possible actions. First, the optional external control unit 106 may clear the fault. Second, the optional external control unit 106 may take a corrective action. Third, the optional external control unit 106 may notify an external system (e.g., one or more external microcontrollers, one or more external agents, and the like). But, as mentioned above, in some embodiments, the optional external control unit 106 may be omitted.

Referring to FIG. 1, while, as described above, the SI 110 is isolated from the other components 160 of the automotive SoC 104, at least some communication must be enabled between the SI 110 and the other components 160 of the automotive SoC 104. In particular, faults that occur in the logic blocks LB(1) to LB(N) of the automotive SoC 104 must be communicated to the SI 110 over the fault interface(s) 172. One method of providing such communication would be to have the first fault aggregators 260-1 to 260-N (see FIG. 4) send the first aggregated fault signals directly to the SI 110. Doing so requires that the fault interface(s) 172 include a separate transmission line or signal conductor between the SI 110 and each of the first fault aggregator 260-1 to 260-N, which is complicated by the isolation of the SI 110 from the other components 160 of the automotive SoC 104. For example, referring to FIG. 2, the voltage level shifter(s) 240 would have to include a separate voltage level shifter for each signal conductor. Further, the larger the number of signal conductors between the SI 110 and the other components 160 of the automotive SoC 104, the more vulnerable the SI 110 is to interference originating in the automotive SoC 104.

Instead, referring to FIG. 4, each of the SoC fault aggregator(s) 152 may be connected to the SI 110 by three signal conductors: (1) a corrected error signal conductor 410; (2) an uncorrected error signal conductor 412; and (3) a SoC fault aggregator signal conductor 414. This arrangement may allow the fault interface(s) 172 to report faults from the logic blocks LB(1) to LB(N) to the SI 110 without the fault interface(s) 172 including so many conductors that the conductors cause electrical interference and without making the fault interface(s) 172 so large that it/they cause congesting in the automotive SoC 104 and/or the SI 110. The signal conductors 410, 412, and 414 may set the status bits "BT1," "BT2," and "BT3," respectively, each of which, after having been set, may be subsequently cleared by the processor 140.

The mailbox(es) 156 may be connected to the interrupt controller 141 of the SI 110 by a mailbox interrupt signal conductor 416. The signal conductors 410-416 may each be implemented as a wire, signal trace, and the like.

Figure 5A:
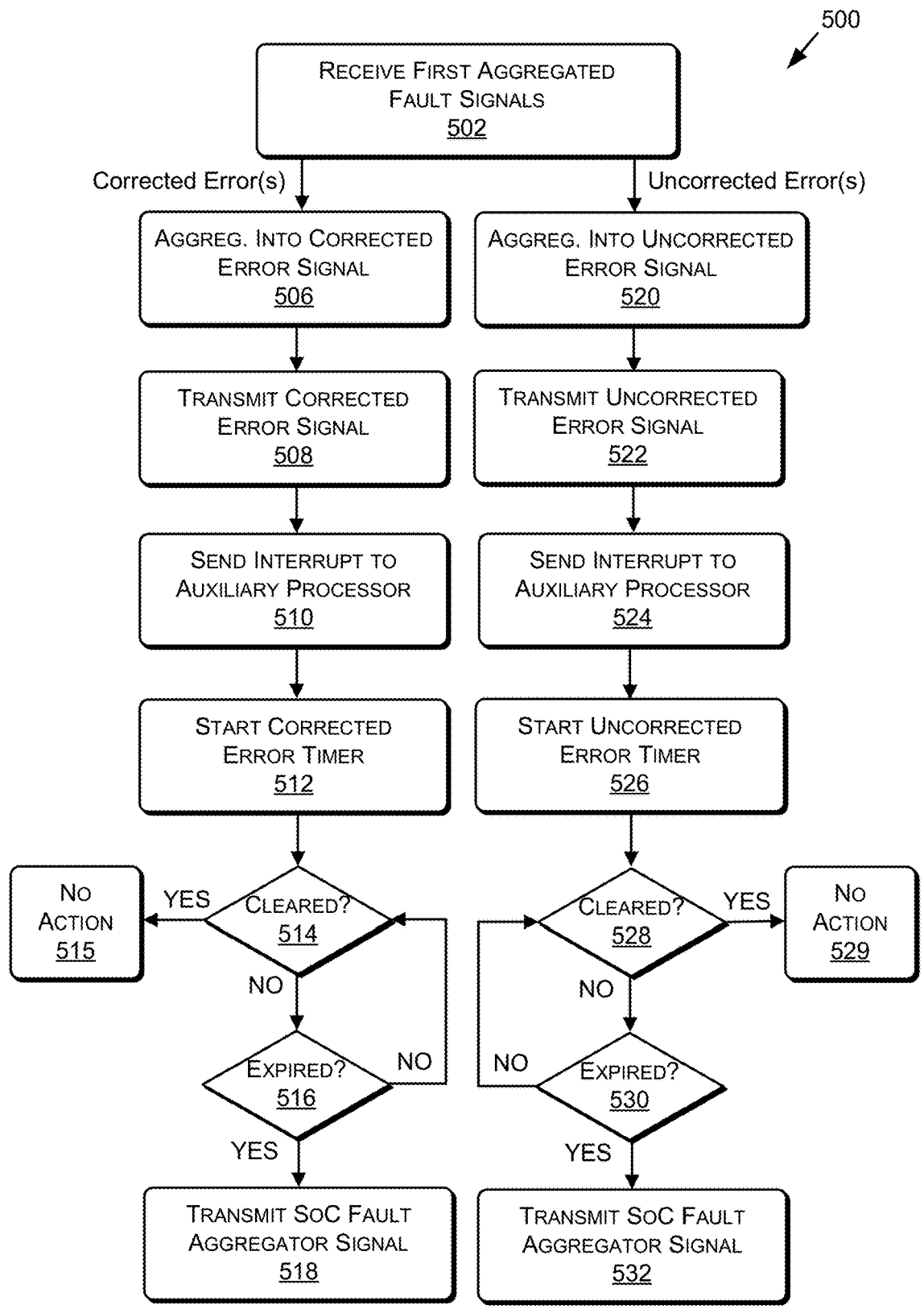
FIG. 5A is a flow diagram showing a method for communicating faults to the safety island, in accordance with some embodiments of the present disclosure.

FIG. 5A is a flow diagram showing a method 500 for communicating faults to the SI 110 (see FIGS. 1, 2, 4, 8, and 10), in accordance with some embodiments of the present disclosure. Now referring to FIG. 5A, each block of the method 500, described herein, includes a computing process that may be performed using any combination of hardware, firmware, and/or software. For instance, various functions may be carried out by a processor (e.g., the processor 150 illustrated in FIGS. 1 and 4) executing instructions stored in memory. At least portions of the method 500 may be embodied as computer-usable instructions stored on computer storage media. The method 500 may be provided by a standalone application, a service or hosted service (standalone or in combination with another hosted service), or a plug-in to another product, to name a few. In addition, the method 500 is described, by way of example, with respect to the automotive platform 100 of FIG. 1. However, the method 500 may additionally or alternatively be executed by any one system, or any combination of systems, including, but not limited to, those described herein.

For ease of illustration, the method 500 will be described as being performed by a particular one of the SoC fault aggregator(s) 152 (see FIGS. 1, 2, and 4). In other words, the method 500 may be performed by hardware. Referring to FIG. 5A, at first block 502, the particular SoC fault aggregator receives first aggregated fault signals from at least a portion of the first fault aggregators 260-1 to 260-N (see FIGS. 2 and 4).

In block 506, the particular SoC fault aggregator aggregates those of the first aggregated fault signals identifying a fault caused by an error that has been corrected into a corrected error signal. Then, in block 508, the particular SoC fault aggregator transmits the corrected error signal to the SI 110 (see FIGS. 1, 2, 4, 8, and 10) via the corrected error signal conductor 410 (see FIG. 4). In block 510, the particular SoC fault aggregator sends an interrupt to the interrupt control 154 (see FIGS. 1 and 4) for each corrected error, which forwards the interrupt(s) to the processor 150 (see FIGS. 1 and 4) of the auxiliary safety unit 122 (see FIGS. 1 and 4). Each interrupt notifies the processor 150 of the corrected error associated with the interrupt.

In block 512, the particular SoC fault aggregator starts a corrected error timer 420C (see FIG. 4) for a first corrected error identified in the corrected error signal.

In decision block 514, the particular SoC fault aggregator determines whether the first corrected error has been cleared from the particular SoC fault aggregator. The decision in decision block 514 is "YES" when the first corrected error has been cleared before the corrected error timer 420C (see FIG. 4) indicated that more than a second predetermined amount of time has elapsed. Otherwise, the decision in decision block 514 is "NO." When the decision in decision block 514 is "YES," in block 515, the particular SoC fault aggregator takes no action. On the other hand, when the decision in decision block 514 is "NO," the particular SoC fault aggregator advances to decision block 516.

In decision block 516, the processor 150 determines whether the corrected error timer 420C (see FIG. 4) indicates that more than the second predetermined amount of time has elapsed, meaning the corrected error timer 420C has timed out or expired. The decision in decision block 516 is "YES" when the second predetermined amount of time has elapsed. Otherwise, the decision in decision block 516 is "NO." When the decision in decision block 516 is "YES," the particular SoC fault aggregator advances to block 518. Otherwise, when the decision in decision block 516 is "NO," the particular SoC fault aggregator returns to decision block 514 to wait for the first corrected error to be cleared by the processor 150. Thus, the particular SoC fault aggregator continues to monitor whether the first corrected error has been cleared and whether the corrected error timer 420C has expired. If the first corrected error is cleared before the corrected error timer 420C expires, the particular SoC fault aggregator takes no action in block 515. On the other hand, if the corrected error timer 420C expires before the first corrected error is cleared, the particular SoC fault aggregator advances to block 518. In block 518, the particular SoC fault aggregator transmits the SoC fault aggregator signal to the SI 110 (see FIGS. 1, 2, 4, 8, and 10) via the SoC fault aggregator signal conductor 414 (see FIG. 4).

In block 520, the particular SoC fault aggregator aggregates those of the first aggregated fault signals received in block 502 that identify a fault caused by an error that has not been corrected into an uncorrected error signal. Then, in block 522, the particular SoC fault aggregator transmits the uncorrected error signal to the SI 110 (see FIGS. 1, 2, 4, 8, and 10) via the uncorrected error signal conductor 412 (see FIG. 4). In block 524, the particular SoC fault aggregator sends an interrupt to the interrupt control 154 (see FIGS. 1 and 4) for each uncorrected error, which forwards the interrupt(s) to the processor 150 (see FIGS. 1 and 4) of the auxiliary safety unit 122 (see FIGS. 1 and 4). Each interrupt notifies the processor 150 of the uncorrected error associated with the interrupt.

In block 526, the particular SoC fault aggregator starts an uncorrected error timer 420U (see FIG. 4) for a first uncorrected error identified in the uncorrected error signal.

In decision block 528, the particular SoC fault aggregator determines whether the first uncorrected error has been cleared from the particular SoC fault aggregator. The decision in decision block 528 is "YES" when the first uncorrected error has been cleared before the uncorrected error timer 420U (see FIG. 4) indicated that more than a third predetermined amount of time has elapsed. Otherwise, the decision in decision block 528 is "NO." When the decision in decision block 528 is "YES," in block 529, the particular SoC fault aggregator takes no action. When the decision in decision block 528 is "NO," the particular SoC fault aggregator advances to decision block 530.

In decision block 530, the processor 150 determines whether the uncorrected error timer 420U indicates that more than the third predetermined amount of time has elapsed, meaning the uncorrected error timer 420U (see FIG. 4) has timed out or expired. The decision in decision block 530 is "YES" when the third predetermined amount of time has elapsed. Otherwise, the decision in decision block 530 is "NO." When the decision in decision block 530 is "YES," the particular SoC fault aggregator advances to block 532. On the other hand, when the decision in decision block 530 is "NO," the particular SoC fault aggregator returns to decision block 528 to wait for the first uncorrected error to be cleared by the processor 150. Thus, the particular SoC fault aggregator continues to monitor whether the first uncorrected error has been cleared and whether the uncorrected error timer 420U has expired. If the first uncorrected error is cleared before the uncorrected error timer 420U expires, the particular SoC fault aggregator takes no action in block 529. On the other hand, if the uncorrected error timer 420U expires before the first uncorrected error is cleared, the particular SoC fault aggregator advances to block 532. In block 532, the particular SoC fault aggregator transmits the SoC fault aggregator signal to the SI 110 (see FIGS. 1, 2, 4, 8, and 10) via the SoC fault aggregator signal conductor 414 (see FIG. 4). At this point, the method 500 terminates.

Figure 5B:
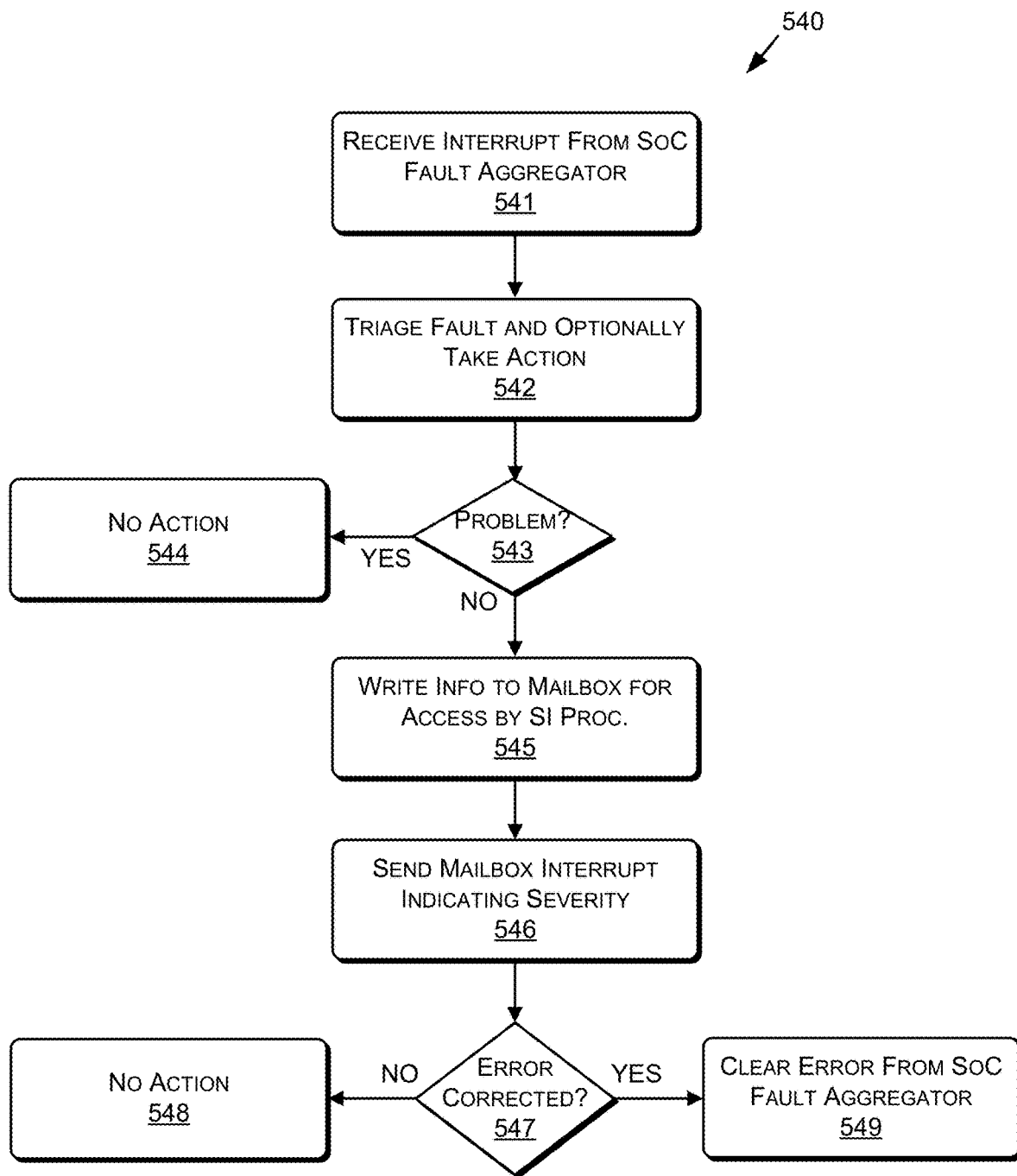
FIG. 5B is a flow diagram showing a method that a processor may use to process interrupts received from a SoC fault aggregator, in accordance with some embodiments of the present disclosure.

FIG. 5B is a flow diagram showing a method 540 that the processor 150 (see FIGS. 1 and 4) may use to process interrupts received from the SoC fault aggregator(s) 152 (see FIGS. 1, 2, and 4), in accordance with some embodiments of the present disclosure. Now referring to FIG. 5B, each block of the method 540, described herein, includes a computing process that may be performed using any combination of hardware, firmware, and/or software. For instance, various functions may be carried out by a processor (e.g., the processor 150) executing instructions stored in memory. At least portions of the method 540 may be embodied as computer-usable instructions stored on computer storage media. The method 540 may be provided by a standalone application, a service or hosted service (standalone or in combination with another hosted service), or a plug-in to another product, to name a few. In addition, the method 540 is described, by way of example, with respect to the automotive platform 100 of FIG. 1. However, the method 540 may additionally or alternatively be executed by any one system, or any combination of systems, including, but not limited to, those described herein.

For ease of illustration, the method 540 will be described as being performed by the processor 150 (see FIGS. 1 and 4). Referring to FIG. 5B, at first block 541, the processor 150 receives a particular interrupt from a particular one of the SoC fault aggregator(s) 152. Then, in block 542, the processor 150 triages one or more errors identified in the particular interrupt and may take one or more corrective actions to address the error(s).

If a problem occurs while the processor 150 is triaging the error(s) and/or taking the corrective action(s), the processor 150 may be unable to continue processing the particular interrupt. When this occurs, the decision at decision block 543 is "YES," and at block 544, the processor 150 takes no further action with respect to the particular interrupt. On the other hand, if the processor 150 is able to triage the particular interrupt and optionally take the corrective action(s), the decision at decision block 543 is "NO." When the decision in decision block 543 is "NO," in block 545, the processor 150 writes information related to the particular interrupt to the mailbox(es) 156 that may be read by the processor 140. Next, in block 546, the processor 150 sends a mailbox interrupt to the interrupt controller 141 via the mailbox interrupt signal conductor 416. The mailbox interrupt indicates a severity of the error identified in the interrupt received in block 541.

Then, at decision block 547, the processor 150 determines whether the processor 150 should clear the fault for which the particular interrupt was generated from the particular SoC fault aggregator. The decision in decision block 547 is "YES" when the processor 150 decides to clear the fault. Otherwise, the decision in decision block 547 is "NO." The decision in decision block 547 may be "YES" when the corrective action(s) taken by the processor 150 was/were able to address the error or the fault was generated by a corrected error (e.g., an error corrected by one of the logic blocks LB(1)-LB(N)). By way of another non-limiting example, the decision in decision block 547 may be "YES" when the processor 150 receives a mailbox interrupt from the processor 140 indicating that the processor 140 cleared the error. When the decision in decision block 547 is "NO," in block 548, the processor 150 takes no further action with respect to the particular interrupt. On the other hand, when the decision in decision block 547 is "YES," in block 549, the processor 150 clears the fault from the particular SoC fault aggregator. The processor 150 may notify the processor 140 that the fault has been cleared from the particular SoC fault aggregator. Then, the method 540 terminates.

Figure 5C:
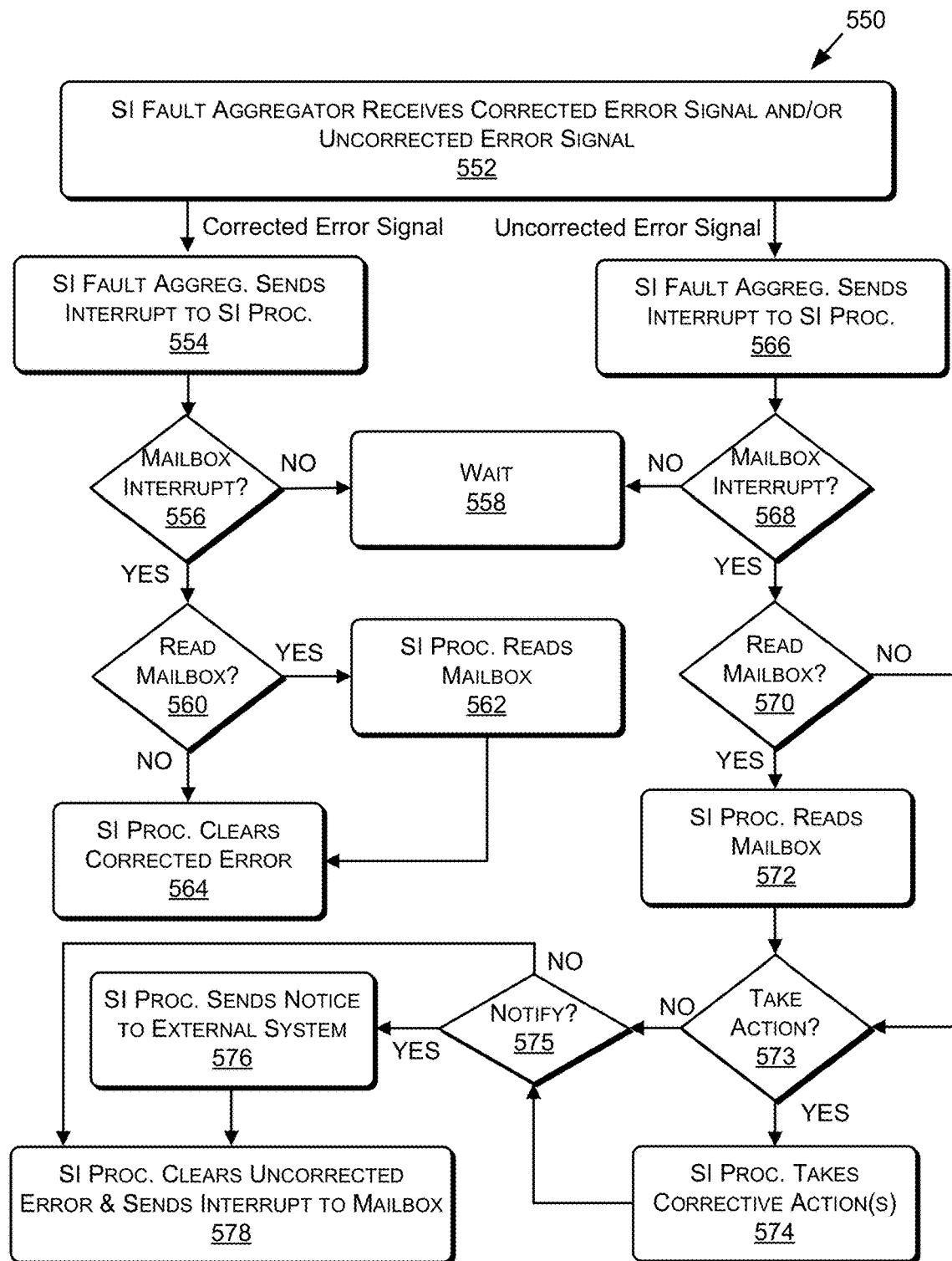
FIG. 5C is a flow diagram showing a method that the SI 110 may use to process corrected and uncorrected error signals, in accordance with some embodiments of the present disclosure.

FIG. 5C is a flow diagram showing a method 550 that the SI 110 (see FIGS. 1, 2, 4, 8, and 10) may use to process the corrected and uncorrected error signals, in accordance with some embodiments of the present disclosure. Now referring to FIG. 5C, each block of the method 550, described herein, includes a computing process that may be performed using any combination of hardware, firmware, and/or software. For instance, various functions may be carried out by a processor (e.g., the processor 140 illustrated in FIGS. 1, 2, and 4) executing instructions (e.g., the instructions 149 illustrated in FIGS. 1, 2, and 4) stored in memory (e.g., the volatile memory 146 illustrated in FIGS. 1, 2, and 4). At least portions of the method 550 may be embodied as computer-usable instructions stored on computer storage media. The method 550 may be provided by a standalone application, a service or hosted service (standalone or in combination with another hosted service), or a plug-in to another product, to name a few. In addition, the method 550 is described, by way of example, with respect to the automotive platform 100 of FIG. 1. However, the method 550 may additionally or alternatively be executed by any one system, or any combination of systems, including, but not limited to, those described herein.

For ease of illustration, the method 550 will be described as being performed by the SI fault aggregator 142 (see FIGS. 1, 2, and 4) and the processor 140 (see FIGS. 1, 2, and 4). Referring to FIG. 5C, at first block 552, the SI fault aggregator 142 of the SI 110 (see FIGS. 1, 2, 4, 8, and 10) receives the corrected error signal, which sets the status bit "BT1," and/or the uncorrected error signal, which sets the status bit "BT2." When the SI fault aggregator 142 receives the corrected error signal on the corrected error signal conductor 410, in block 554, the SI fault aggregator 142 sends an interrupt to the interrupt controller 141 (see FIGS. 1, 2, and 4) of the processor 140. This interrupt informs the processor 140 of the corrected error(s).

In decision block 556, the processor 140 (see FIGS. 1, 2, and 4) determines whether a mailbox interrupt has been received from the processor 150 (see FIGS. 1 and 4) via the mailbox interrupt signal conductor 416. When the mailbox interrupt is received, the mailbox interrupt indicates the severity of the corrected error. The decision in decision block 556 is "YES," when the processor 140 has received the mailbox interrupt. Otherwise, the decision in decision block 556 is "NO." When the decision in decision block 556 is "NO," in block 558, the processor 140 waits to receive either the mailbox interrupt or the SoC fault aggregator signal. When the decision in decision block 556 is "YES," the processor 140 advances to decision block 560.

In decision block 560, the processor 140 (see FIGS. 1, 2, and 4) decides whether to read mailbox(es) 156. This decision may be based at least in part on the severity of the corrected error communicated to the processor 140 by the mailbox interrupt. For example, the processor 140 may decide not to read mailbox(es) 156 if the severity of the corrected error is at or above a threshold value (e.g., 7) and may decide to read mailbox(es) 156 if the severity of the corrected error(s) is below the threshold value. When the decision in decision block 560 is "YES," in block 562, the processor 140 reads mailbox(es) 156. Then, the processor 140 advances to block 564 whereat the processor 140 clears the corrected error, for example, by unsetting the status bit "BT1." When the decision in decision block 560 is "NO," the processor 140 advances to block 564 and clears the corrected error, for example, by unsetting the status bit "BT1." The processor 140 may wait for notification from the processor 150 that the fault corresponding to the corrected error has been cleared from the particular SoC fault aggregator before the processor 140 clears the corrected error from the SI fault aggregator 142. However, because the error has been corrected, in some embodiments, the processor 140 may simply clear the corrected error without first receiving such a notification.

When the SI fault aggregator 142 receives the uncorrected error signal on the uncorrected error signal conductor 412, in block 566, the SI fault aggregator 142 sends an interrupt to the interrupt controller 141 (see FIGS. 1, 2, and 4) of the processor 140. This interrupt informs the processor 140 of the uncorrected error(s).

In decision block 568, the processor 140 (see FIGS. 1, 2, and 4) determines whether a mailbox interrupt has been received from the processor 150 (see FIGS. 1 and 4) via the mailbox interrupt signal conductor 416. When the mailbox interrupt is received, the mailbox interrupt indicates the severity of the uncorrected error. The decision in decision block 568 is "YES," when the processor 140 has received the mailbox interrupt. Otherwise, the decision in decision block 568 is "NO." When the decision in decision block 568 is "NO," in block 558, the processor 140 waits to receive either the mailbox interrupt or the SoC fault aggregator signal. When the decision in decision block 568 is "YES," the processor 140 advances to decision block 570.

In decision block 570, the processor 140 (see FIGS. 1, 2, and 4) decides whether to read mailbox(es) 156. This decision may be based at least in part on the severity of the uncorrected error. For example, the processor 140 may decide not to read mailbox(es) 156 if the severity of the uncorrected error(s) is at or above the threshold value (e.g., 7) and may decide to read mailbox(es) 156 if the severity of the corrected error(s) is below the threshold value. When the decision in decision block 570 is "YES," in block 572, the processor 140 reads mailbox(es) 156. Then, the processor 140 advances to decision block 573. When the decision in decision block 570 is "NO," the processor 140 advances to block 573.

In decision block 573, the processor 140 decides whether to take one or more corrective actions. When the decision in decision block 573 is "YES," in block 574, the processor 140 takes the corrective action(s), such as applying the vehicle's brakes. Then, the processor 140 advances to decision block 575.

When the decision in decision block 573 is "NO," the processor 140 advances to decision block 575. In decision block 575, the processor 140 decides whether to notify the external system 404. When the decision in decision block 575 is "YES," in block 576, the processor 140 notifies the external system 404 and advances to block 578. When the decision in decision block 575 is "NO," the processor 140 advances to block 578.

In block 578, the processor 140 sends a mailbox interrupt to the mailbox(es) 156 and/or clears the uncorrected error, for example, by unsetting the status bit "BT2." Optionally, the processor 140 may write fault information to the mailbox(es) 156. The processor 140 may wait for notification from the processor 150 that the fault corresponding to the uncorrected error has been cleared from the particular SoC fault aggregator before the processor 140 clears the uncorrected error from the SI fault aggregator 142. Then, the method 550 terminates. The mailbox interrupt is received by the processor 150 and may be used in decision block 547 (see FIG. 5B) when deciding whether the processor 150 should clear the fault corresponding to the uncorrected error. The processor 150 may optionally read the fault information written to the mailbox(es) 156 by the processor 140 before making this decision.

Figure 5D:
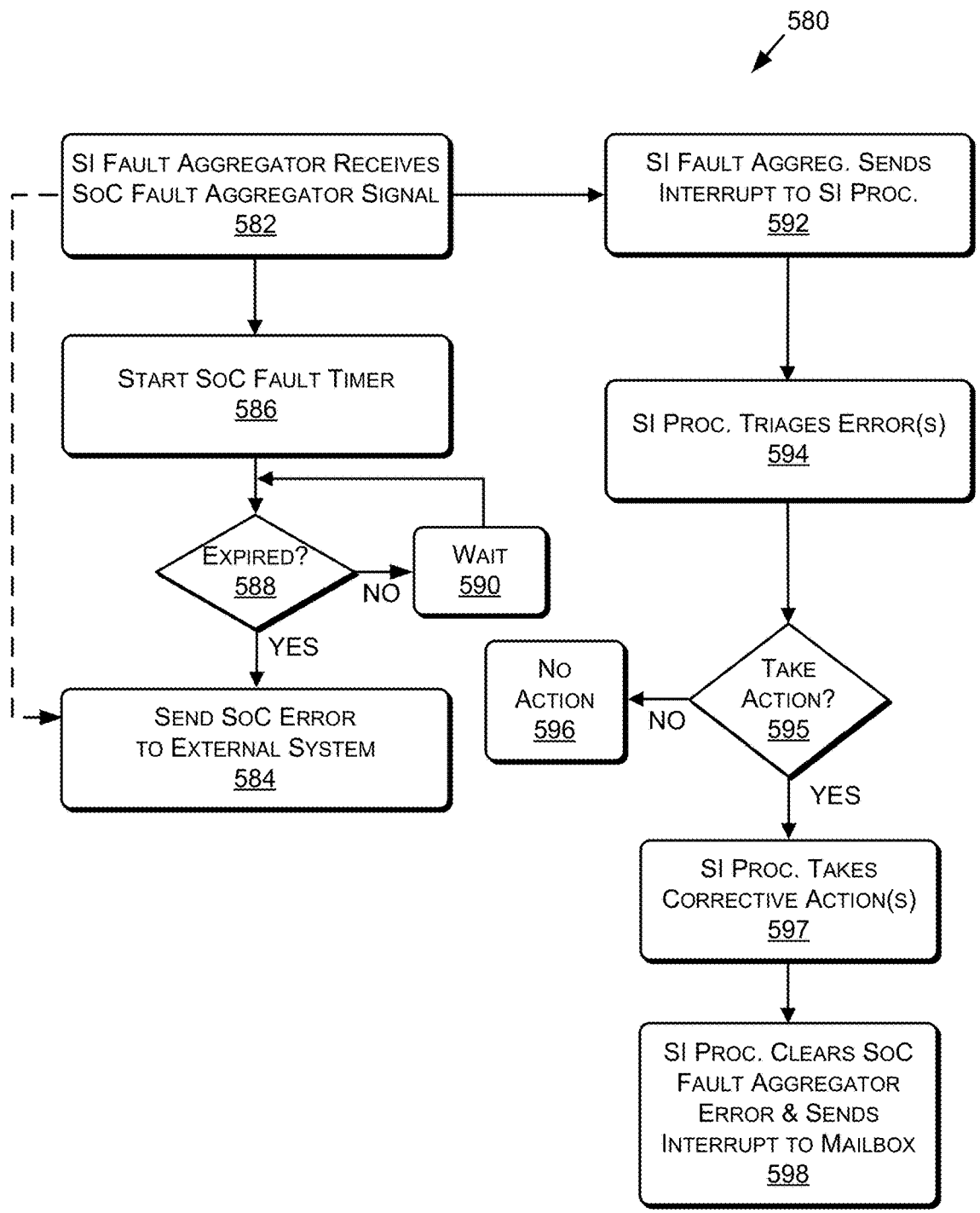
FIG. 5D is a flow diagram showing a method that the SI 110 may use to process a SoC fault aggregator signal, in accordance with some embodiments of the present disclosure.

FIG. 5D is a flow diagram showing a method 580 that the SI 110 (see FIGS. 1, 2, 4, 8, and 10) may use to process the SoC fault aggregator signal, in accordance with some embodiments of the present disclosure. Now referring to FIG. 5D, each block of the method 580, described herein, includes a computing process that may be performed using any combination of hardware, firmware, and/or software. For instance, various functions may be carried out by a processor (e.g., the processor 140 illustrated in FIGS. 1, 2, and 4) executing instructions (e.g., the instructions 149 illustrated in FIGS. 1, 2, and 4) stored in memory (e.g., the volatile memory 146 illustrated in FIGS. 1, 2, and 4). At least portions of the method 580 may be embodied as computer-usable instructions stored on computer storage media. The method 580 may be provided by a standalone application, a service or hosted service (standalone or in combination with another hosted service), or a plug-in to another product, to name a few. In addition, the method 580 is described, by way of example, with respect to the automotive platform 100 of FIG. 1. However, the method 580 may additionally or alternatively be executed by any one system, or any combination of systems, including, but not limited to, those described herein.

For ease of illustration, the method 580 will be described as being performed by the SI fault aggregator 142 (see FIGS. 1, 2, and 4), the processor 140 (see FIGS. 1, 2, and 4), and SoC error handling circuitry 422 (see FIG. 4). The SoC error handling circuitry 422 may be implemented as a component of the SI fault aggregator 142. Referring to FIG. 5D, at first block 582, the SI fault aggregator 142 (see FIGS. 1, 2, and 4) receives the SoC fault aggregator signal, which sets the status bit "BT3."

As shown by an arrow with a dashed line in FIG. 5D, when the SI fault aggregator 142 (see FIGS. 1, 2, and 4) receives the SoC fault aggregator signal, the SoC error handling circuitry 422 (see FIG. 4) of the SI 110 may automatically advance to block 584 and automatically send a SoC error signal including a SoC error to the external system 404 (see FIG. 4) via the connection 406 (see FIG. 4). Alternatively, the SoC error handling circuitry 422 may advance to block 586 and start a SoC fault timer 424 (see FIG. 4). The SoC fault timer 424 may introduce a delay between when the SoC fault aggregator signal was received and when the external system 404 is notified. As the SoC fault timer 424 is running, the processor 140 may take one or more corrective actions. If the corrective action(s) is/are successful, the processor 140 may clear the uncorrected error(s) by unsetting the status bit "BT2," and the SoC fault aggregator error by unsetting the status bit "BT3." Clearing the SoC fault aggregator error stops the SoC fault timer 424. The processor 140 may wait for notification from the processor 150 that the fault(s) corresponding to the uncorrected error(s) has/have been cleared from the particular SoC fault aggregator before the processor 140 clears the uncorrected error(s) from the SI fault aggregator 142.

After the SoC fault timer 424 has been started, in decision block 588, the SoC error handling circuitry 422 determines whether the SoC fault timer 424 indicates more than a fourth predetermined amount of time has elapsed. The decision in decision block 588 is "YES" when the SoC fault timer 424 indicates more than the fourth predetermined amount of time has elapsed and the SoC fault aggregator error has not been cleared. On the other hand, the decision in decision block 588 is "NO," when the SoC fault aggregator error has been cleared before the SoC fault timer 424 indicates that more than the fourth predetermined amount of time has elapsed.

When the decision in decision block 588 is "NO," in block 590, the SoC error handling circuitry 422 waits for the SoC fault timer 424 to indicate that more than the fourth predetermined amount of time has elapsed. On the other hand, when the decision in decision block 588 is "YES," in block 584, the SoC error handling circuitry 422 transmits the SoC error signal including the SoC error over the connection 406 (see FIG. 4) to the external system 404 (see FIG. 4) indicating the first uncorrected error has not been cleared and the SoC fault aggregator error has been asserted. The SoC fault timer 424 automatically stops and/or resets when the SoC error is sent. Alternatively, the SoC error handling circuitry 422 may reset the SoC fault timer 424 or the SoC fault timer 424 may simply expire without the SoC error handling circuitry 422 taking any action.

After the SI fault aggregator 142 (see FIGS. 1, 2, and 4) receives the SoC fault aggregator signal, in block 592, the SI fault aggregator 142 may send an interrupt to the processor 140. In block 594, the processor 140 triages the first uncorrected error. In decision block 595, the processor 140 decides whether to take one or more corrective actions. The decision in decision block 595 is "YES," when the processor 140 decides to take one or more corrective actions. Otherwise, the decision in decision block 595 is "NO." When the decision in decision block 595 is "NO," the processor 140 advances to block 596 and takes no action. On the other hand, when the decision in decision block 595 is "YES," in block 597, the processor 140 takes the corrective action(s).

Then, in block 598, the processor 140 sends a mailbox interrupt to the mailbox(es) 156 and/or clears the SoC fault aggregator error, for example, by unsetting the status bit "BT3," and the uncorrected error(s) by unsetting the status bit "BT2." Clearing the SoC fault aggregator error stops the SoC fault timer 424. The mailbox interrupt sent to the mailbox(es) 156 may indicate that the uncorrected error has been cleared and/or the processor 140 has taken the corrective action(s) in block 597. Optionally, the processor 140 may write fault information to the mailbox(es) 156. The processor 140 may wait for notification from the processor 150 that the fault(s) corresponding to the uncorrected error(s) has/have been cleared from the particular SoC fault aggregator before the processor 140 clears the SoC fault aggregator error and the uncorrected error(s) from the SI fault aggregator 142. Then, the method 580 terminates. The mailbox interrupt is received by the processor 150, which may clear the fault corresponding to the uncorrected error. The processor 150 may optionally read the fault information written to the mailbox(es) 156 by the processor 140 before clearing the fault.

In FIG. 5A-5D, the automotive SoC 104 includes the processor 150. In at least some embodiments, the processor 150 may be omitted. In such embodiments, the method 540 will not be performed. With each fault, the particular SoC fault aggregator will generate and send the SoC fault aggregator error (blocks 518 and 532) to the SI fault aggregator 142. Because the processor 150 is not present, the mailbox interrupts will not be transmitted to the interrupt controller 141 so the processor 140 will wait (block 558 of FIG. 5C) for the SoC fault aggregator signal before the processor 140 acts. Then, when the SoC fault aggregator error is received (block 582 of FIG. 5D), the SI 110 will venture into the other components 160 to conduct triage (block 594 of FIG. 5D) for each corrected and uncorrected error received in the method 550 (see FIG. 5C). If the triage is successful, the processor 140 takes the corrective action(s) (block 597 of FIG. 5D). On the other hand, if the triage is unsuccessful, the processor 140 takes no action (block 596 of FIG. 5D), which causes the SoC error handling circuitry 422 to send the SoC Error (without any software intervention) after the SoC fault timer 424 expires (block 584 of FIG. 5D). The SoC Error notifies the external system 404 (e.g., the optional external control unit 106, one or more external microcontrollers, one or more external agents, and the like) allowing the external system 404 to return the automotive platform 100 (see FIG. 1) to a safe state.

Figure 6A:
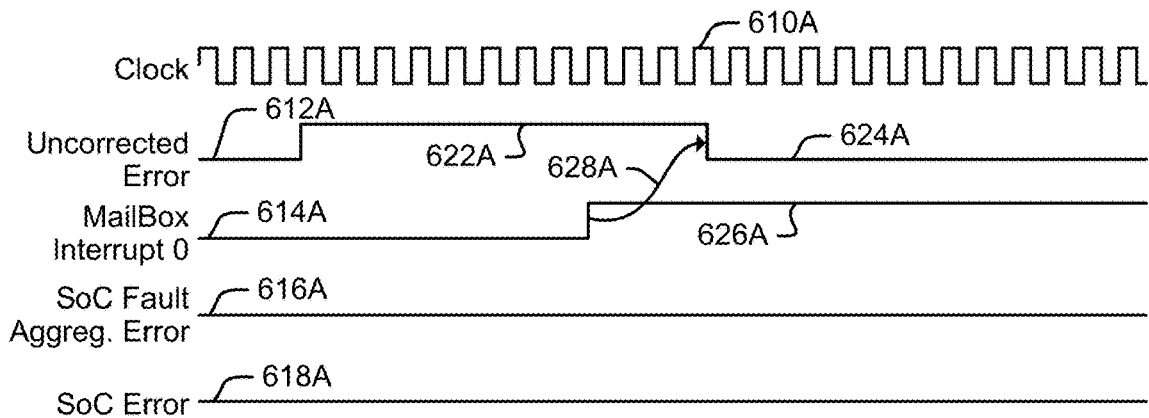
FIG. 6A illustrates an example signal timing diagram for signals received and sent by the processor of the safety island after a low severity uncorrected error (e.g., the minimum value) has been asserted, in accordance with some embodiments of the present disclosure.
Figure 6B:
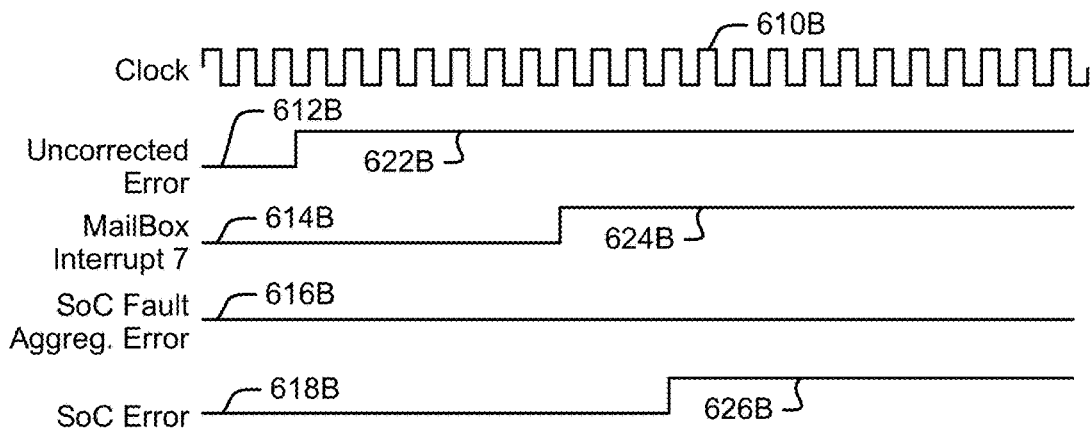
FIG. 6B illustrates an example signal timing diagram for signals received and sent by the processor of the safety island after a high severity uncorrected error (e.g., the maximum value) has been asserted, in accordance with some embodiments of the present disclosure.
Figure 6C:
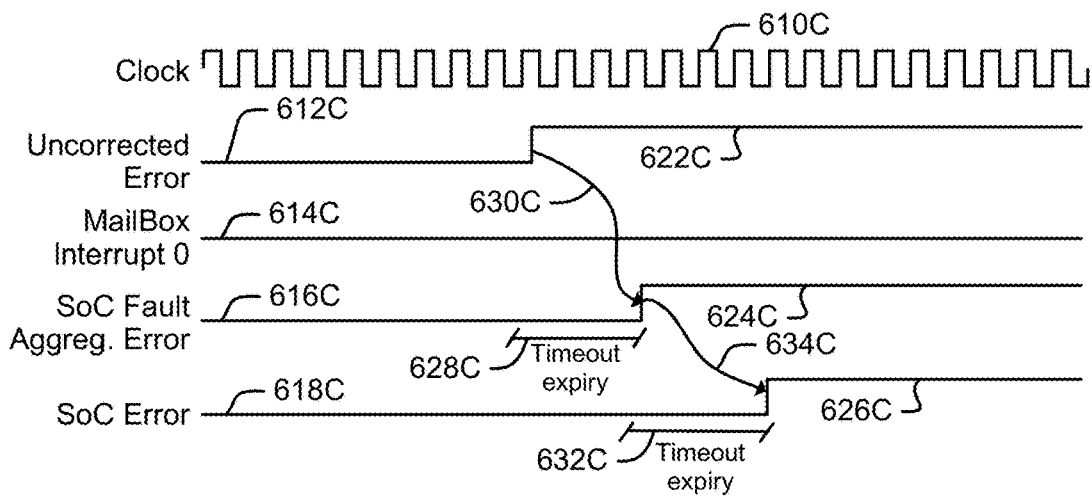
FIG. 6C illustrates an example signal timing diagram for signals received and sent by the processor of the safety island after an uncorrected error (e.g., the maximum value) has been asserted but the safety island does not receive the mailbox interrupt, in accordance with some embodiments of the present disclosure.

FIG. 6A-6C illustrate example actions that may be taken by the SI 110 when the SI 110 is notified of a particular fault by at least one of the corrected error signal, the uncorrected error signal, or the SoC fault aggregator signal. FIG. 6A illustrates an example signal timing diagram for signals received and sent by the processor 140 after a low severity uncorrected error (e.g., the minimum value) has been asserted, in accordance with some embodiments of the present disclosure. Lines 612A-618A of FIG. 6A represent the uncorrected error signal, a mailbox interrupt signal, the SoC fault aggregation signal, and the SoC error signal, respectively. The uncorrected error signal, the mailbox interrupt signal, the SoC fault aggregation signal, and the SoC error signal are synchronized with a clock signal represented by a line 610A. The clock signal represented by the line 610A was generated based on the second (SI) clock 114 (see FIG. 1) in the SI domain.

The line 612A represents the uncorrected error signal conducted by the uncorrected error signal conductor 412 (see FIG. 4) to the SI fault aggregator 142. A portion 622A of the line 612A represents the assertion of the uncorrected error. After receiving the uncorrected error signal (e.g., block 552 of FIG. 5C), the SI fault aggregator 142 sends an interrupt to the processor 140 (e.g., block 566 of FIG. 5C).

Then, in FIG. 6A, the interrupt controller 141 receives a mailbox interrupt (decision in decision block 568 of FIG. 5C is "YES"). A portion 626A of the line 614A represents the mailbox interrupt (sent by the processor 150) that indicates the severity of the uncorrected error. Because the mailbox interrupt indicates the particular fault has low severity, the processor 140 decides to access the mailbox(es) 156 (e.g., decision in decision block 570 of FIG. 5C is "YES") and read the contents of the mailbox(es) 156 (e.g., block 572 of FIG. 5C). If the mailbox(es) 156 include fault information (created by the processor 150) that indicates that the particular fault has been cleared, the processor 140 clears the particular fault in the SI fault aggregator 142 (e.g., block 578 of FIG. 5C). If this occurs before the corrected error timer 420U expires, the SoC fault aggregator(s) 152 will not assert the SoC fault aggregator error (e.g., block 529 of FIG. 5A).

On the other hand, if the contents of the mailbox(es) 156 do not indicate that the processor 150 has cleared the particular fault, the processor 140 may decide to take one or more corrective actions (e.g., decision in decision block 573 of FIG. 5C is "YES"). If the corrective action(s) (e.g., taken in block 574 of FIG. 5C) are successful, the processor 140 may notify the processor 150 to de-assert the error (or clear the fault). For example, the processor 140 may send a mailbox interrupt to the processor 150 and/or may write fault information to the mailbox(es) 156. After the processor 150 receives this notification and de-asserts the error, the processor 150 notifies the processor 140 that the error has been de-asserted (e.g., via the uncorrected error signal, a mailbox interrupt, and/or fault information stored in the mailbox(es) 156). After receiving this notification, the processor 140 may clear the error, e.g., by unsetting the status bit "BT2" (e.g., block 578 of FIG. 5C). A portion 624A of the line 612A represents a de-assertion of the uncorrected error after the processor 140 reads the mailbox(es) 156, and takes corrective action(s). A curved arrow 628A represents a delay between when the processor 140 received the mailbox interrupt and when the processor 140 de-asserted the error (or clears the fault).

When the corrective action(s) are successful, the processor 140 may send a mailbox interrupt to the mailbox(es) 156 indicating the processor 140 has cleared the particular fault (e.g., block 578 of FIG. 5C). Optionally, the processor 140 may write fault information to the mailbox(es) 156. The processor 150 receives the mailbox interrupt, determines the particular fault was corrected by the processor 140 (e.g., the decision in decision block 547 is "YES"), and clears the particular fault from the SoC fault aggregator(s) 152 (e.g., block 549 of FIG. 5B). If this occurs before the uncorrected error timer 420U expires, the SoC fault aggregator(s) 152 will not assert the SoC fault aggregator error (e.g., block 529 of FIG. 5A). Thus, the SoC fault aggregator(s) 152 monitor(s) the particular fault to ensure it has been handled by one of the processors 140 and 150 and, when the particular fault has not been cleared before the uncorrected error timer 420U expires, the SoC fault aggregator(s) 152 notify the SoC error handling circuitry 422. As mentioned above, after the processor 150 de-asserts the error, the processor 150 notifies the processor 140 that the error has been de-asserted (e.g., via the uncorrected error signal, a mailbox interrupt, and/or fault information stored in the mailbox(es) 156) and the processor 140 may clear the error in the SI fault aggregator 142.

The line 616A represents the SoC fault aggregation signal and illustrates that the SoC fault aggregation error was not asserted. Thus, the uncorrected fault(s) were cleared before the uncorrected error timer 420U expired.

The line 618A represents a SoC error signal that may be sent to the external system 404 (e.g., the optional external control unit 106, one or more external microcontrollers, one or more external agents, and the like) over the connection 406. Because the uncorrected error(s) has/have been handled and the SoC fault aggregation error was not asserted, the line 618A indicates that the SI 110 does not notify the external system 404 of the uncorrected error(s) (e.g., the decision in decision block 575 is "NO").

FIG. 6B illustrates an example signal timing diagram for signals received and sent by the processor 140 after a high severity uncorrected error (e.g., the maximum value) has been asserted, in accordance with some embodiments of the present disclosure. Lines 612B-618B of FIG. 6B represent the uncorrected error signal, the mailbox interrupt signal, the SoC fault aggregation signal, and the SoC error signal, respectively. The uncorrected error signal, the mailbox interrupt signal, the SoC fault aggregation signal, and the SoC error signal are synchronized with a clock signal represented by a line 610B. The clock signal represented by the line 610B was generated based on the second (SI) clock 114 (see FIG. 1) in the SI domain.

The line 612B represents the uncorrected error signal conducted by the uncorrected error signal conductor 412 (see FIG. 4) to the SI fault aggregator 142. A portion 622B of the line 612B represents an assertion of an uncorrected error. After receiving the uncorrected error signal (e.g., block 552 of FIG. 5C), the SI fault aggregator 142 sends an interrupt to the processor 140 (e.g., block 566 of FIG. 5C).

Then, in FIG. 6B, the interrupt controller 141 receives the mailbox interrupt (e.g., decision in decision block 568 of FIG. 5C is "YES"). A portion 624B of the line 614B represents the mailbox interrupt, which indicates the first uncorrected error has a high severity (e.g., seven). Because the mailbox interrupt indicates the particular fault has high severity, the processor 140 decides not to access the mailbox(es) 156 (e.g., decision in decision block 570 of FIG. 5C is "NO"). For example, the processor 140 may determine it is too risky to access the other components 160 of the automotive SoC 104 and doing so might harm the SI 110. In FIG. 6B, the processor 140 also decides not to take one or more corrective actions (e.g., decision in decision block 573 of FIG. 5C is "NO"). In FIG. 6B, the uncorrected error is not de-asserted because the SI 110 is unable to perform one or more corrective actions.

However, the processor 140 decides to notify the external system 404 (see FIG. 4) by sending the SoC error in the SoC error signal (e.g., decision in decision block 575 of FIG. 5C is "YES"). Then, the processor 140 sends the SoC error signal (e.g., block 576 of FIG. 5C). Thus, in FIG. 6B, when the severity of the fault is high (e.g., the maximum value), the SI 110 may decide not to access the automotive SoC 104, not take any corrective actions, and instead notify the external system 404. The line 618B represents the SoC error signal sent to the external system 404 by the SI 110, and a portion 626B of the line 618B represents the assertion of the SoC error. The line 616B represents the SoC fault aggregation signal and does not indicate that a SoC fault aggregation error has been asserted yet. Therefore, the SI 110 realized the uncorrected error had not been handled and decided to notify the external system 404 before the SoC fault aggregation error was asserted.

FIG. 6C illustrates an example signal timing diagram for signals received and sent by the processor 140 after an uncorrected error (e.g., the maximum value) has been asserted but the SI 110 does not receive the mailbox interrupt, in accordance with some embodiments of the present disclosure. Lines 612C-618C of FIG. 6C represent the uncorrected error signal, the mailbox interrupt signal, the SoC fault aggregation signal, and the SoC error signal, respectively. The uncorrected error signal, the mailbox interrupt signal, the SoC fault aggregation signal, and the SoC error signal are synchronized with a clock signal represented by a line 610C. The clock signal represented by the line 610C was generated based on the second (SI) clock 114 (see FIG. 1) in the SI domain.

The line 612C represents the uncorrected error signal conducted by the uncorrected error signal conductor 412 (see FIG. 4) to the SI fault aggregator 142. A portion 622C of the line 612C represents an assertion of an uncorrected error. After receiving the uncorrected error signal (e.g., block 552 of FIG. 5C), the SI fault aggregator 142 sends an interrupt to the processor 140 (e.g., block 566 of FIG. 5C).

In FIG. 6C, the line 614C does not indicate the mailbox interrupt is received. Thus, in this example, the interrupt controller 141 does not receive the mailbox interrupt (e.g., decision in decision block 568 of FIG. 5C is "NO"). This may occur, for example, when the processor 150 has failed to complete triaging the uncorrected error (e.g., block 542 of FIG. 5B) causing (decision in decision block 543 of FIG. 5C is "YES") the processor 150 to fail to send the mailbox interrupt (e.g., block 544 of FIG. 5B). Therefore, the processor 140 waits to receive either the mailbox interrupt or the SoC fault aggregator error, whichever happens first (e.g., block 558 of FIG. 5C).

A line 628C represents the third predetermined amount of time and shows the uncorrected error timer 420U expired. Because neither the processor 140 nor the processor 150 was able to clear the first uncorrected error, the uncorrected error timer 420U is allowed to expire (e.g., decision in decision block 530 of FIG. 5A is "YES") which caused a particular one of the SoC fault aggregator(s) 152 that sent the uncorrected error signal to the SI 110 and the interrupt to the processor 150, to transmit the SoC fault aggregator signal to the SI fault aggregator 142 via the SoC fault aggregator signal conductor 414 (e.g., in block 532 of FIG. 5A). The SI fault aggregator 142 receives the SoC fault aggregator signal (e.g., in block 582 of FIG. 5D). A portion 624C of the line 616C represents the SI fault aggregator error sent to the SI 110 by the particular SoC fault aggregator. A curved arrow 630C represents a delay between when the uncorrected error was received by the SI 110 and when the SI fault aggregator error was received by the SI 110.

After receiving the SI fault aggregator signal (e.g., block 582 of FIG. 5D), the SI fault aggregator 142 sends an interrupt to the processor 140 (e.g., block 592 of FIG. 5D). Then, the processor 140 may triage the first uncorrected error (e.g., block 594 of FIG. 5D) and decide whether to take any corrective actions. If the processor 140 is unable to take any corrective actions (e.g., decision in decision block 595 of FIG. 5D is "NO"), the SoC error handling circuitry 422 will send the SoC error signal to the external system 404 (e.g., block 584 of FIG. 5C). A portion 626C of the line 612C represents the SoC error sent to the external system 404. In embodiments that use the SoC fault timer 424, the SoC error is sent when the SoC fault timer 424 expires. In FIG. 6C, a line 632C indicates that more than the fourth predetermined amount of time has elapsed, which means the SoC fault timer 424 expired. A curved arrow 634C represents a delay between when the SI fault aggregator error was received by the SI 110 and when the SoC error was asserted by the SI 110. Thus, hardware in the SI 110 notifies the external system 404, which will attempt to return the automotive platform 100 to a safe state.

Referring to FIG. 2, as mentioned above, the SI 110 and the other components 160 of the automotive SoC 104 share the volatile memory 126. But, the SI 110 operates within a first risk classification level and the other components 160 of the automotive SoC 104 may operate within a lower second risk classification level. For example, the SI 110 may operate at ASIL-D but, the other components of the automotive SoC, including the volatile memory 126 and a communication path (e.g., interconnect, memory controller, and the like) between the SI 110 and the volatile memory 126, may operate at ASIL-B.

To allow the SI 110 to share the volatile memory 126 with the other components 160 of the automotive SoC 104, a separate dedicated memory region (referred to as a "carve-out" 250) is created in the volatile memory 126 for exclusive use by the SI 110. The carve-out 250 may not be visible to memory management software (e.g., Rich-OS memory management Rich-OS memory management software) executed by the main CPU complex 120 (see FIG. 1). The carve-out 250 may be created and configured at boot time and may remain dedicated to the SI 110 for a given boot cycle. For example, the size of the carve-out 250 may be determined by a user-editable software parameter that is used by software (e.g., executed by the main CPU complex 120) to configure the carve-out 250. The carve-out 250 may be divided into a first subsection 252 (see FIG. 8) and a second subsection 254 (see FIG. 8). The SI 110 may access the carve-out 250 via a communication path that operates at the first risk classification level and any access to the carve-out 250 by the SI 110 via the communication path may be subjected to security permission checks, such as those described below.

The SI 110 includes an error detection block 272, which includes hardware positioned between other components of the SI 110 and the carve-out 250. Thus, the error detection block 272 may be implemented as a component of the volatile memory interface 200A. Alternatively, the error detection block 272 may be positioned between the processor 140 and the volatile memory interface 200A. In such embodiments, one or more signal conductors (e.g., a wire, a signal trace, and the like) may connect the error detection block 272 to each of the processor 140 and the volatile memory interface 200A.

Figure 8:
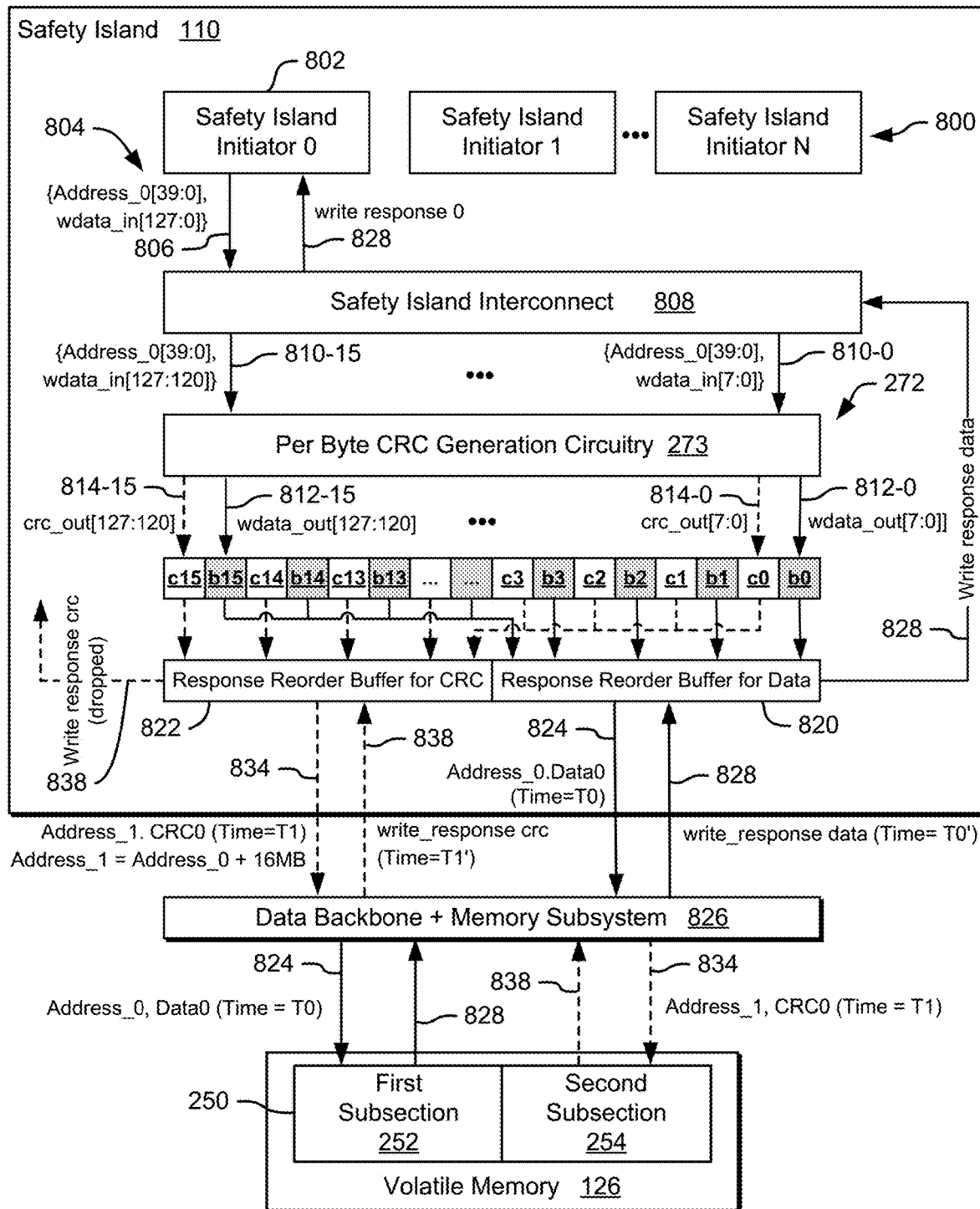
FIG. 8 illustrates an example of an error detection block of the safety island performing the method of FIG. 7, in accordance with some embodiments of the present disclosure.

The hardware of the error detection block 272 may include a code generation sub-block 273 (see FIG. 8). The code generation sub-block 273 may be implemented using a cyclic redundancy check ("CRC") code generation circuitry that generates a CRC code. Alternatively, the error detection block 272 may include other types of code generation circuitry that generates different types of error detection codes, such as error correction code ("ECC"). The hardware of the error detection block 272 determines one or more error detection codes (e.g., CRC codes) for data that passes through the error detection block 272. For example, the error detection block 272 may determine a separate error detection code for each byte of data that passes through the error detection block 272. The error detection code may be calculated based on the byte and a data address in the carve-out 250 where the byte is to be stored. For example, Equation 1 below may be used to determine the error detection code for a particular byte of data to be written to the carve-out 250:

$$\text{crc\_out}_{Byte\ x} = \text{CRC}(\text{Byte Address}, \text{Byte Data}) \quad \text{Equation 1}$$

In Equation 1 above, a variable "$\text{crc\_out}_{Byte\ x}$" represents the error detection code calculated based on the byte, represented by a variable "Byte Data," and the data address, represented by a variable "Byte Address." In Equation 1, a function "CRC" uses the values of the variables "Byte Data" and "Byte Address" as an inputs and outputs the value of the variable "$\text{crc\_out}_{Byte\ x}$." The output of the function "CRC" may be calculated at least in part by the code generation sub-block 273 (see FIG. 8), when present.

After the error detection code is determined, the error detection block 272 determines (e.g., using an offset) a code address for the error detection code. For example, Equation 2 below may be used to determine the error detection code for a particular byte of the data to be written to the carve-out 250.

$$\text{crc\_out\_address} = \text{write\_address} + \text{fixed\_offset} \quad \text{Equation 2}$$

In Equation 2 above, a variable "crc_out_address" represents the code address calculated based on the data address, represented by a variable "write_address," of the byte and an offset, represented by a variable "fixed_offset." As mentioned above, the carve-out 250 may be divided into subsections with the first subsection 252 (see FIG. 8) storing the data and the second subsection 254 (see FIG. 8) storing the error detection codes. Thus, the data address, represented by the variable "Byte Address" in Equation 1 above, may be located in the first subsection 252, and the code address, represented by the variable "write_address" in Equation 2 above, may be located in the second subsection 254. In such embodiments, the value of the variable "fixed_offset" may equal the size of the first subsection 252 of the carve-out 250 to ensure that the error detection codes will be stored in the second subsection 254. In this manner, address based separation is used to separate the data from the error detection codes so that a fault that occurs in one of the first and second subsections 252 and 254 may not impact the other.

The error detection block 272 introduces a delay (e.g., a few clock cycles) between the storage of the data in the data address(es) and the storage of the error detection code in the code address(es). This delay reduces the likelihood that an event (e.g., a transient event) that negatively impacts the data will also negatively impact the error detection code. In other words, the delay helps provide immunity from common cause failures and transient failures, which helps provide protection from issues like clock glitches. The error detection block 272 may buffer two or more bytes of data and their corresponding error detection codes before storing them in the carve-out 250. Then, the error detection block 272 may store the bytes of data (e.g., 16 bytes) in the first subsection 252 followed by the delay. Next, the error detection block 272 may store the corresponding error detection codes (e.g., 16 bytes) in the second subsection 254.

Figure 7:
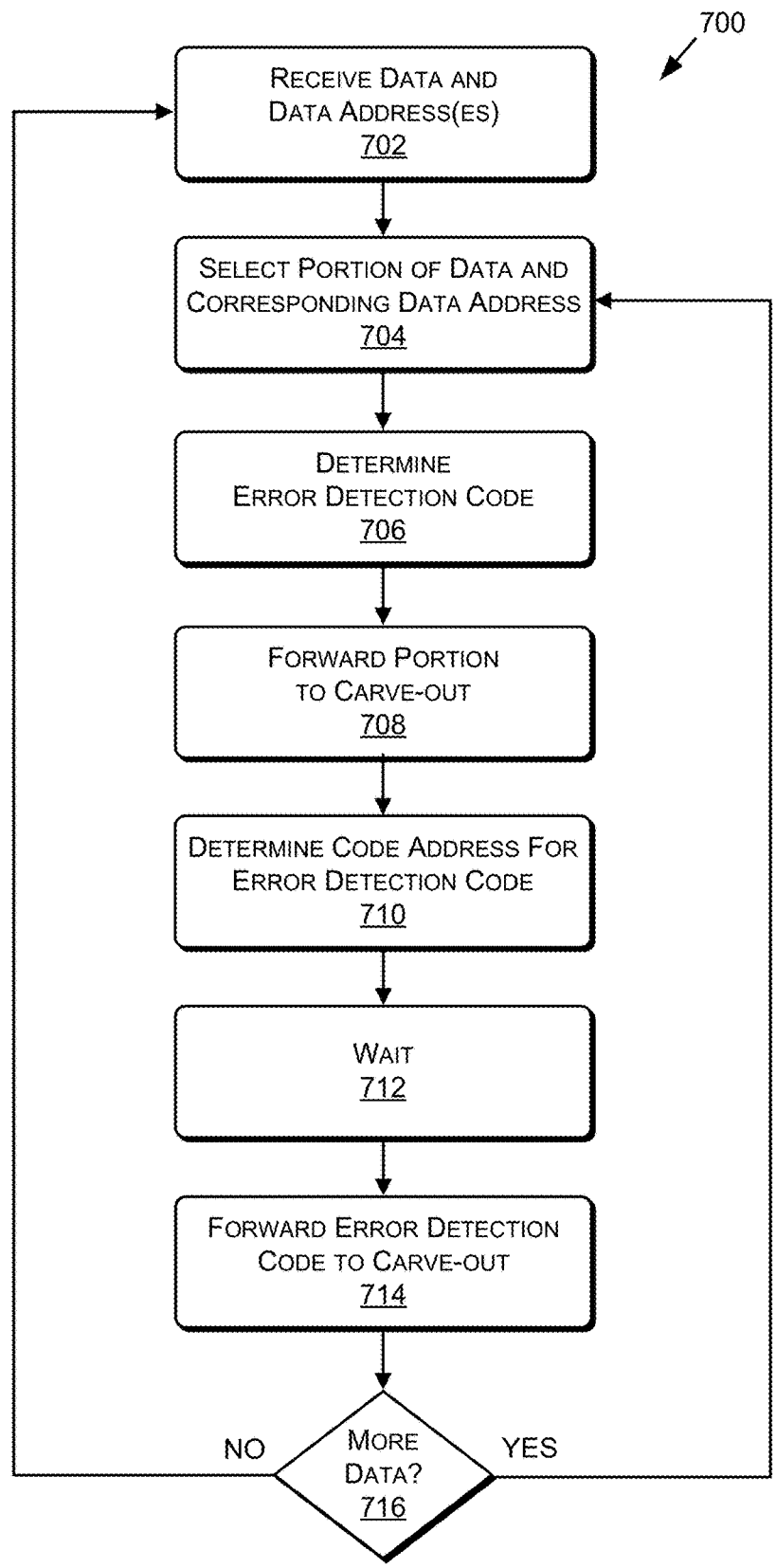
FIG. 7 is a flow diagram showing a method of writing data to a carve-out defined in volatile memory shared by the safety island and the other components of the automotive SoC, in accordance with some embodiments of the present disclosure.

Now referring to FIG. 7, each block of a method 700, described herein, includes a process that may be performed using any combination of hardware, firmware, and/or software. For instance, the method 700 may be performed by the hardware of the error detection block 272 (see FIGS. 2, 8, and 10). By way of another non-limiting example, one or more functions may be carried out by a processor (e.g., the processor 140 illustrated in FIGS. 1, 2, and 4) executing instructions (e.g., the instructions 149 illustrated in FIGS. 1, 2, and 4) stored in memory (e.g., the volatile memory 146 illustrated in FIGS. 1, 2, and 4). In such embodiments, at least portions of the method 700 may be embodied as computer-usable instructions stored on computer storage media. The method 700 may be provided by a standalone application, a service or hosted service (standalone or in combination with another hosted service), or a plug-in to another product, to name a few. In addition, the method 700 is described, by way of example, with respect to the automotive platform 100 of FIG. 1. However, the method 700 may additionally or alternatively be executed by any one system, or any combination of systems, including, but not limited to, those described herein.

FIG. 7 is a flow diagram showing the method 700 for writing data to the carve-out 250 (see FIGS. 2, 8, and 10), in accordance with some embodiments of the present disclosure. For ease of illustration, the method 700 will be described as being performed by the error detection block 272 (see FIGS. 2, 8, and 10). Before the method 700 begins, an initiator (e.g., the processor 140, the DMA engine 402, or the like) operating in the SI domain forwards a first write instruction including data and data address(es) to the error detection block 272. The initiator may write data having a predetermined size (e.g., 16 bytes) to the carve-out 250.

Referring to FIG. 7, at first block 702, the error detection block 272 (see FIGS. 2, 8, and 10) receives the first write instruction including the data and data address(es) from the initiator. In block 704, the error detection block 272 selects a portion of the data and one of the data address(es) corresponding to that portion. By way of a non-limiting example, the error detection block 272 may select a byte of the data in block 704 and the data address corresponding to the selected byte. In some embodiments, the first write instruction may include only a single data address (e.g., a first address). Subsequent data addresses may be determined based on that single address (e.g., by adding a predetermined data size to the single data address). Therefore, in some embodiments, the data address may be calculated in block 704 for at least some of the data.

Then, in block 706, the error detection block 272 determines an error detection code for the portion of the data selected in block 704 (e.g., using Equation 1 above). Next, in block 708, the error detection block 272 forwards the first write instruction including the portion of the data selected in block 704 and the corresponding data address to the first subsection 252 (see FIGS. 8 and 10) of the carve-out 250 (see FIGS. 2, 8, and 10). In accordance with the first write instruction, the carve-out 250 stores the portion in the corresponding data address in the first subsection 252.

In next block 710, the error detection block 272 (see FIGS. 2, 8, and 10) determines a code address for the error detection code determined in block 706 (e.g., using Equation 2 above). In block 712, the error detection block 272 waits (e.g., a few clock cycles) to send the error detection code to the first subsection 252 (see FIGS. 8 and 10) of the carve-out 250 (see FIGS. 2, 8, and 10) for storage thereby in the code address. Thus, in block 712, the error detection block 272 introduces a delay between the storage of the data in the data address and the storage of the error detection code in the code address. The error detection block 272 may include a write delay timer (not shown) that is used to determine how long the error detection block 272 waits in block 712. Thus, the error detection block 272 may wait a fifth predetermined amount of time before sending the error detection code to the carve-out 250 for storage in the code address. Next, in block 714, the error detection block 272 forwards a second write instruction including the error detection code determined in block 706 and the code address determined in block 710 to the second subsection 254 (see FIGS. 8 and 10) of the carve-out 250 (see FIGS. 2, 8, and 10). Thus, to store the data, the error detection block 272 accesses the carve-out 250 twice, once each in blocks 708 and 714. In accordance with the second write instruction, the carve-out 250 stores the error detection code in the code address in the second subsection 254.

Then, in decision block 716, the error detection block 272 (see FIGS. 2, 8, and 10) determines whether any of the data has not been stored. The decision in decision block 716 is "YES," when the error detection block 272 determines at least some of the data has not been stored. Otherwise, the decision in decision block 516 is "NO." When the decision in decision block 716 is "YES," the error detection block 272 returns to block 704 to select a new portion of the data. On the other hand, when the decision in decision block 716 is "NO," the error detection block 272 returns to block 702 to receive a new data and new data address(es).

As mentioned above, the error detection block 272 may buffer two or more bytes of data and their corresponding error detection codes before storing them in the carve-out 250. For example, blocks 706-714 may each be performed for multiple blocks of data (e.g., selected in block 704). By way of a non-limiting example, the error detection block 272 may perform block 706 for two or more bytes of data before sending the first write instruction to the carve-out 250 in block 708 along with the bytes of data and their corresponding data address(es). For example, the error detection block 272 may send the bytes of data along with a first data address to the first subsection 252. The first subsection 252 may write the bytes of data in consecutive memory addresses starting with the first data address. Then, in block 710, the error detection block 272 may determine code addresses for the two or more error detection codes determined in block 706. In block 712, the error detection block 272 introduces a delay between writing the bytes of data and writing the error detection codes to the carve-out 250. Then, in block 714, the error detection block 272 forwards the second write instruction including the error detection codes and the code addresses to the second subsection 254. The second subsection 254 writes the error detection codes in the code addresses. Depending upon the implementation details, the second write instruction may include only a first code address and the second subsection 254 may write the error detection codes in consecutive memory addresses starting with the first code address.

FIG. 8 illustrates an example of the error detection block 272 performing the method 700 (see FIG. 7). The SI 110 may include one or more initiators 800, such as the processor 140, the DMA engine 402, and the like, that each operate within the SI domain. In FIG. 8, the initiator(s) 800 include(s) an initiator 802 (e.g., the processor 140). The initiator 802 (e.g., the processor 140) may write data having a predetermined size (e.g., 16 bytes) to the carve-out 250. In the example illustrated in FIG. 8, the initiator 802 sends 16 bytes of data and a first data address to the error detection block 272. The data is stored in or represented in FIG. 8 by an array of 128 bits named "wdata_in[127:0]" and the first data address is stored in or represented in FIG. 8 by an array of 40 bits named "Address_0[39:0]." However, depending on the implementation details, the data may have other sizes and 128 bits is provided by way of a non-limiting example. Similarly, the first data address may have other sizes and 40 bits is provided by way of a non-limiting example. The first byte of the data may be stored in the first data address, then a next data address may be identified for a second byte of the data by adding one byte to the first data address, and so forth. FIG. 8 depicts the initiator 802 sending a first write instruction 804 to the error detection block 272 in a signal 806 via a safety island interconnect 808. As mentioned above, the first write instruction 804 includes the data and the first data address. The safety island interconnect 808 may be implemented as a bus and the like.

The safety island interconnect 808 delivers the first write instruction 804 to the error detection block 272 (e.g., block 702 of FIG. 7). In the embodiment illustrated, the safety island interconnect 808 delivers the first write instruction 804 in signals 810-0 to 810-15 each including one of the bytes of the data and the first data address. In this embodiment, the error detection block 272 generates an error detection code for each byte of the data and the error detection code generated is a CRC code. The error detection block 272 may begin processing the bytes as they are received in the signals 810-0 to 810-15 (e.g., block 704 of FIG. 7).

Next, the code generation sub-block 273 determines an error detection code for each byte of the data (e.g., block 706 of FIG. 7). In FIG. 8, signals carrying the error detection codes and a signal 838 carrying responses from the carve-out 250 related to the error detection codes are illustrated by arrows with dashed lines. Thus, the code generation sub-block 273 outputs the bytes of data in signals 812-0 to 812-15 and the corresponding error detection codes in signals 814-0 to 814-15. The (data) signals 812-0 to 812-15 are routed to the first subsection 252 for storage and the (code) signals 814-0 to 814-15 are routed to the second subsection 254 for storage.

The error detection block 272 sends the data and the first data address (e.g., in the signals 812-0 to 812-15) to the first subsection 252 of the carve-out 250 via the volatile memory interface 200A (see FIG. 2) at a first time (e.g., identified in FIG. 8 as "Time=T0"). In other words, the error detection block 272 sends the first write instruction to the first subsection 252 of the carve-out 250 (e.g., block 708 of FIG. 7). The volatile memory interface 200A communicates the first write instruction to the carve-out 250 via a data backbone and memory subsystem 826 of the automotive SoC 104 (see FIGS. 1, 2, and 4). In FIG. 8, the first write instruction is sent by the error detection block 272 to the first subsection 252 in a signal 824.

The first subsection 252 writes the data to memory by storing the first byte (represented in FIG. 8 as "Data0") at the first data address (represented in FIG. 8 as "Address_0") and writing the subsequent bytes to subsequent data addresses after the first data address. This write occurs the first time, which is represented in FIG. 8 as "Time=T0." Then, the first subsection 252 sends a response signal 828 to the initiator 802 acknowledging that the data has been stored. The response signal 828 is sent by the first subsection 252 to the data backbone and memory subsystem 826, which forwards the response signal 828 to the volatile memory interface 200A (see FIG. 2). When the volatile memory interface 200A is unlocked, the volatile memory interface 200A forwards the response signal 828 to a first (data) buffer 820.

The first (data) buffer 820 reorders "data write completion responses" received in the response signal 828 from the carve-out 250. For example, the error detection block 272 may send a pair of write instructions A and B (e.g., in the first write instruction sent in block 708 of FIG. 7) to the carve-out 250 with the write instruction B being sent by the error detection block 272 after the write instruction A. After the carve-out 250 writes the data included in the write instructions A and B, the carve-out 250 sends first and second data write completion responses to the error detection block 272. But, the second data write completion response received for the write instruction B may arrive at the error detection block 272 before the first data write completion response for the write instruction A. When this occurs, the first (data) buffer 820 will store the second data write completion response, wait for the first data write completion response, send the first data write completion response as it arrives, and send the second data write completion response after the first data write completion response. Thus, the first (data) buffer 820 places the data write completion responses in an expected order in the response signal 828.

The first (data) buffer 820 forwards the response signal 828 to the safety island interconnect 808, which forwards the response signal 828 to the initiator 802. At this point, in this example, the data (e.g., 16 bytes) have been written to the first subsection 252 in a first single write operation.

The error detection block 272 also determines a first code address based on the first data address (e.g., block 710 of FIG. 7). In FIG. 8, the first code address is calculated by adding 16 megabytes ("MB") to the first data address. However, depending on the implementation details, the offset may have other sizes and 16 MB is provided by way of an example. Further, the location of the first code address may be determined using other methods and/or calculations.

The error detection block 272 waits (e.g., block 712 of FIG. 7) until the second time (e.g., identified in FIG. 8 as "Time=T1"). The first and second times are different. At the second time, the error detection block 272 sends the error detection codes and the first code address to the second subsection 254 of the carve-out 250 via the volatile memory interface 200A (see FIG. 2). In other words, the error detection block 272 sends the second write instruction to the second subsection 254 of the carve-out 250 (e.g., block 714 of FIG. 7). The volatile memory interface 200A communicates the second write instruction to the carve-out 250 via the data backbone and memory subsystem 826 of the automotive SoC 104 (see FIGS. 1, 2, and 4). In FIG. 8, the second write instruction is sent by the error detection block 272 to the second subsection 254 in a signal 834.

The second subsection 254 writes the error detection codes to memory by storing the first error detection code (represented in FIG. 8 as "CRC0") at the first code address (represented in FIG. 8 as "Address_1") and writing the subsequent error detection codes to subsequent codes addresses after the first code address. Then, the second subsection 254 sends a response signal 838 to the initiator 802 acknowledging that the error detection codes have been stored. In the embodiment illustrated in FIG. 8, the response signal 838 is sent by the second subsection 254 to the data backbone and memory subsystem 826, which forwards the response signal 838 to the volatile memory interface 200A (see FIG. 2). When the volatile memory interface 200A is unlocked, the volatile memory interface 200A forwards the response signal 838 to a second (code) buffer 822. The second (code) buffer 822 reorders "code write completion responses" received in the response signal 838 from the carve-out 250. For example, the error detection block 272 determines first and second error detection codes for the data included in the write instructions A and B, respectively, and sends the first and second error detection codes to the carve-out 250 (e.g., in the second write instruction). After the carve-out 250 writes the first and second error detection codes into memory, the carve-out 250 sends first and second code write completion responses, respectively, to the second (code) buffer 822. But, the second code write completion response received for the second error detection code may arrive at the error detection block 272 before the first code write completion response for the first error detection code. When this occurs, the second (code) buffer 822 will store the second code write completion response, wait for the first code write completion response, send the first code write completion response as it arrives, and send the second code write completion response after the first code write completion response.

The second (code) buffer 822 may drop the response signal 838. Alternatively, the second (code) buffer 822 may forward the response signal 838 to the safety island interconnect 808, which may forward the response signal 838 to the initiator 802. At this point, in this example, the error detection codes (e.g., 16 bytes) have been written to the second subsection 254 in a second single write operation.

The volatile memory interface 200A may include two parallel and optionally dedicated interfaces that connect the error detection block 272 with the volatile memory 126. The data may be sent to the first data address over the first interface and the error detection code(s) may be sent to the first code address over the second interface. In such embodiments, the error detection block 272 may send the first write instruction including the data and the first data address (e.g., in the signal 824) over the first interface to the first subsection 252 at the same time that the error detection block 272 sends the second write instruction including the error detection code(s) and the first code address (e.g., in the signal 834) over the second interface to the second subsection 254. Further, the (data) response signal 828 and the (code) response signal 838 may be transmitted to the first and second buffers 820 and 822, respectively, at the same time over the first and second interfaces, respectively.

When the initiator 802 (e.g., the processor 140) of the SI 110 wishes to read the data from the carve-out 250, the SI 110 receives both the data and the error detection code(s) from the carve-out 250. The SI 110 introduces a delay between when the data is read from the data address(es) and when the error detection code(s) is/are read from the code address(es). This delay reduces the likelihood that an event that negatively impacts the data will also negatively impact the error detection code. The SI 110 passes the read data through the error detection block 272, which determines a check code for the read data and compares the error detection code with the check code. This comparison may be represented by an Equation 3 below:

$$\text{CRC\_gen}(\text{Requested address}, \text{Fetched Data}) == \text{crc\_in}_{Byte\ x}(\text{CRC\_address}) \quad \text{Equation 3}$$

In Equation 3, an operator "==" indicates whether an expression to the left of the operator "==" is equal to an expression to the right of the operator "==." A variable "Fetched Data" represents at least a portion (e.g., Byte x) of the data obtained in block 906, a variable "Requested address" represents the data address of that portion of the data, and a variable "CRC_address" represents the code address determined based on the data address of the portion (e.g., Byte x) of the data. A function "CRC_gen" uses the values of variables "Fetched Data" and "Requested address" as an inputs and the function "CRC_gen" outputs the check code for the portion (e.g., Byte x). The function "CRC_gen" may be identical to the function "CRC" of the Equation 1 above. The output of the function "CRC_gen" may be calculated at least in part by the code generation sub-block 273 (see FIG. 8), when present. An expression "crc_in$_{Byte\ x}$(CRC_address)" represents the error detection code obtained from the code address determined for the portion (e.g., Byte x) using its data address. Thus, the Equation 3 determines whether the check code is equal to or matches the error detection code. The error detection block 272 may generate a mismatch error when the check code does not match the error detection code. The error detection block 272 may send the mismatch error to the initiator 802, and the SI fault aggregator 142 so that the mismatch error may be cleared by safety software implemented by the instructions 149 and executed by the processor 140.

Figure 9:
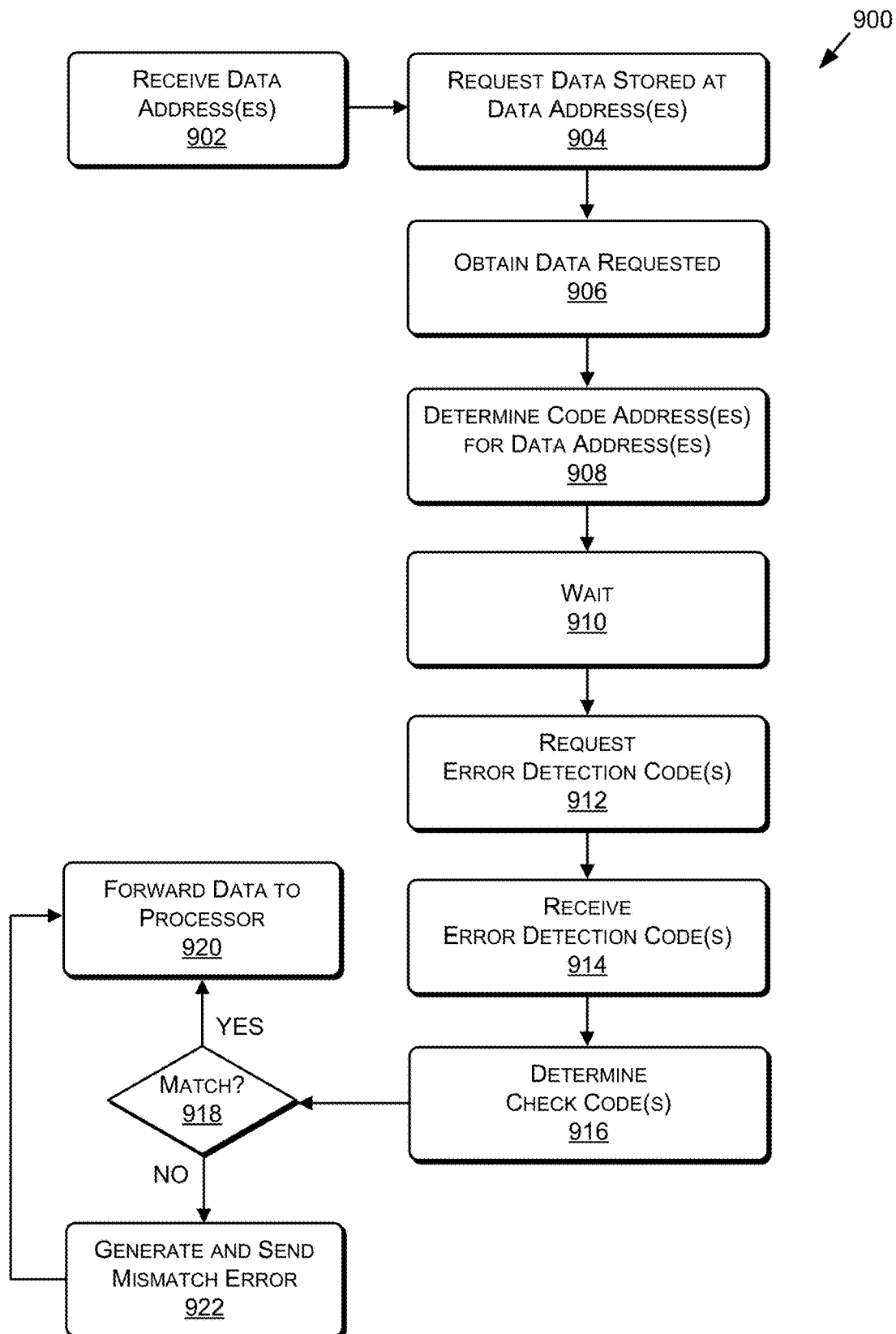
FIG. 9 is a flow diagram showing a method for reading data from the carve-out, in accordance with some embodiments of the present disclosure.

Now referring to FIG. 9, each block of a method 900, described herein, includes a process that may be performed using any combination of hardware, firmware, and/or software. For instance, the method 900 may be performed by the hardware of the error detection block 272 (see FIGS. 2, 8, and 10). By way of another non-limiting example, one or more functions may be carried out by a processor (e.g., the processor 140 illustrated in FIGS. 1, 2, and 4) executing instructions (e.g., the instructions 149 illustrated in FIGS. 1, 2, and 4) stored in memory (e.g., the volatile memory 146 illustrated in FIGS. 1, 2, and 4). At least portions of the method 900 may be embodied as computer-usable instructions stored on computer storage media. The method 900 may be provided by a standalone application, a service or hosted service (standalone or in combination with another hosted service), or a plug-in to another product, to name a few. In addition, the method 900 is described, by way of example, with respect to the automotive platform 100 of FIG. 1. However, the method 900 may additionally or alternatively be executed by any one system, or any combination of systems, including, but not limited to, those described herein.

FIG. 9 is a flow diagram showing the method 900 for reading data from the carve-out 250 (see FIGS. 2, 8, and 10), in accordance with some embodiments of the present disclosure. For ease of illustration, the method 900 will be described as being performed by the error detection block 272 (see FIGS. 2, 8, and 10). Before the method 900 begins, the initiator 802 (see FIG. 8) forwards a first read instruction including one or more data addresses to the error detection block 272. By way of a non-limiting example, the first read instruction may include only a first data address. Referring to FIG. 9, at first block 902, the error detection block 272 receives the first read instruction including the data address(es) from the initiator 802. In block 904, the error detection block 272 forwards the first read instruction to the first subsection 252 requesting the data stored at the data address(es). If the first read instruction included only the first data address, the first subsection 252 may read a predetermined amount of data (e.g., 16 bytes) from consecutive memory addresses starting at the first data address. In block 906, the error detection block 272 receives the data stored at the data address(es) from the first subsection 252.

Then, in block 908, the error detection block 272 determines the code address(es) for the error detection code(s) corresponding to the data (e.g., using the Equation 2 above). By way of a non-limiting example, the code address(es) may be determined based at least in part on the data address(es). For example, in accordance with Equation 2 above, each of the code address(es) may be calculated by adding the offset (the value of the variable "fixed_offset") to a corresponding one of the data address(es) (the value of the variable "write_address"). Depending upon the implementation details, the error detection block 272 may identify only a first code address based on the first data address. Then, in block 910, the error detection block 272 waits (e.g., a few clock cycles) to request the error detection code(s) stored at the code address(es) determined in block 908. Thus, in block 910, the error detection block 272 introduces a delay between reading the data and reading the error detection code(s) from the code address(es). The error detection block 272 may include a read delay timer (not shown) that is used to determine how long the error detection block 272 waits at block 910. Thus, the error detection block 272 may wait a sixth predetermined amount of time before requesting the error detection code(s) from the second subsection 254.

After waiting, in next block 912, the error detection block 272 sends a second read instruction to the second subsection 254 including the code address(es) determined in block 908 and requesting the error detection code(s) stored at those code address(es). Thus, to read the data, the error detection block 272 accesses the carve-out 250 twice, once each in blocks 904 and 912. If the second read instruction included only the first code address, the second subsection 254 may read a predetermined number of error detection codes (e.g., 16 bytes) from consecutive memory addresses starting at the first code address. In block 914, the error detection block 272 receives the error detection code(s) stored at the code address(es) from the second subsection 254. In block 916, the error detection block 272 determines a check code for each of the error detection code(s) obtained in block 914 (e.g., using the Equation 1 above).

At decision block 918, for each of the error detection code(s), the error detection block 272 determines whether the error detection code matches the check code that corresponds to the error detection code (e.g., using Equation 3 above). The decision in decision block 918 is "YES," when the error detection code matches its corresponding check code. Otherwise, the decision in decision block 918 is "NO." When the decision in decision block 918 is "YES," in block 920, the error detection block 272 forwards the data corresponding to the error detection code to the initiator 802 (see FIG. 8). When the decision in decision block 918 is "NO," in block 922, the error detection block 272 generates a mismatch error and sends it to the initiator 802, and the SI fault aggregator 142 (see FIGS. 1, 2, and 4) so that the mismatch error may be cleared by safety software implemented by the instructions 149 and executed by the processor 140. Optionally, in block 922, the error detection block 272 may attempt to correct the mismatch if the error detection code (e.g., implemented as an ECC) includes information (e.g., bits) that may be used to recover the data. If the error detection block 272 is able to correct the error, the error detection block 272 may omit generating the mismatch error in block 922. After block 920, the error detection block 272 advances to block 920 and forwards the data to the initiator 802. Then, the method 900 terminates.

The error detection block 272 may read two or more bytes of data and their corresponding error detection codes from the carve-out 250 at a time. For example, blocks 904-914 may each be performed for multiple blocks of data. By way of a non-limiting example, in block 904, the error detection block 272 may send the first read instruction to the first subsection 252 requesting two or more bytes of data from a first data address. The first subsection 252 may read the bytes of data from consecutive memory addresses starting with the first data address and send the bytes of data to the error detection block 272, which the error detection block 272 receives in block 906. Then, in block 908, the error detection block 272 may determine code address(es) based on the data address(es). Depending upon the implementation details, the error detection block 272 may identify only a first code address based on the first data address. Then, in block 910, the error detection block 272 introduces a delay between reading the bytes of data and reading the error detection codes from the carve-out 250. Next, the error detection block 272 may request the error detection codes stored in the carve-out 250 for the bytes of data obtained in block 906. For example, the error detection block 272 may send the first code address to the second subsection 254. The second subsection 254 may read the error detection codes from consecutive memory addresses starting with the first code address and send the error detection codes to the error detection block 272, which the error detection block 272 receives in block 914. Then, the method 900 continues with block 916.

Figure 10:
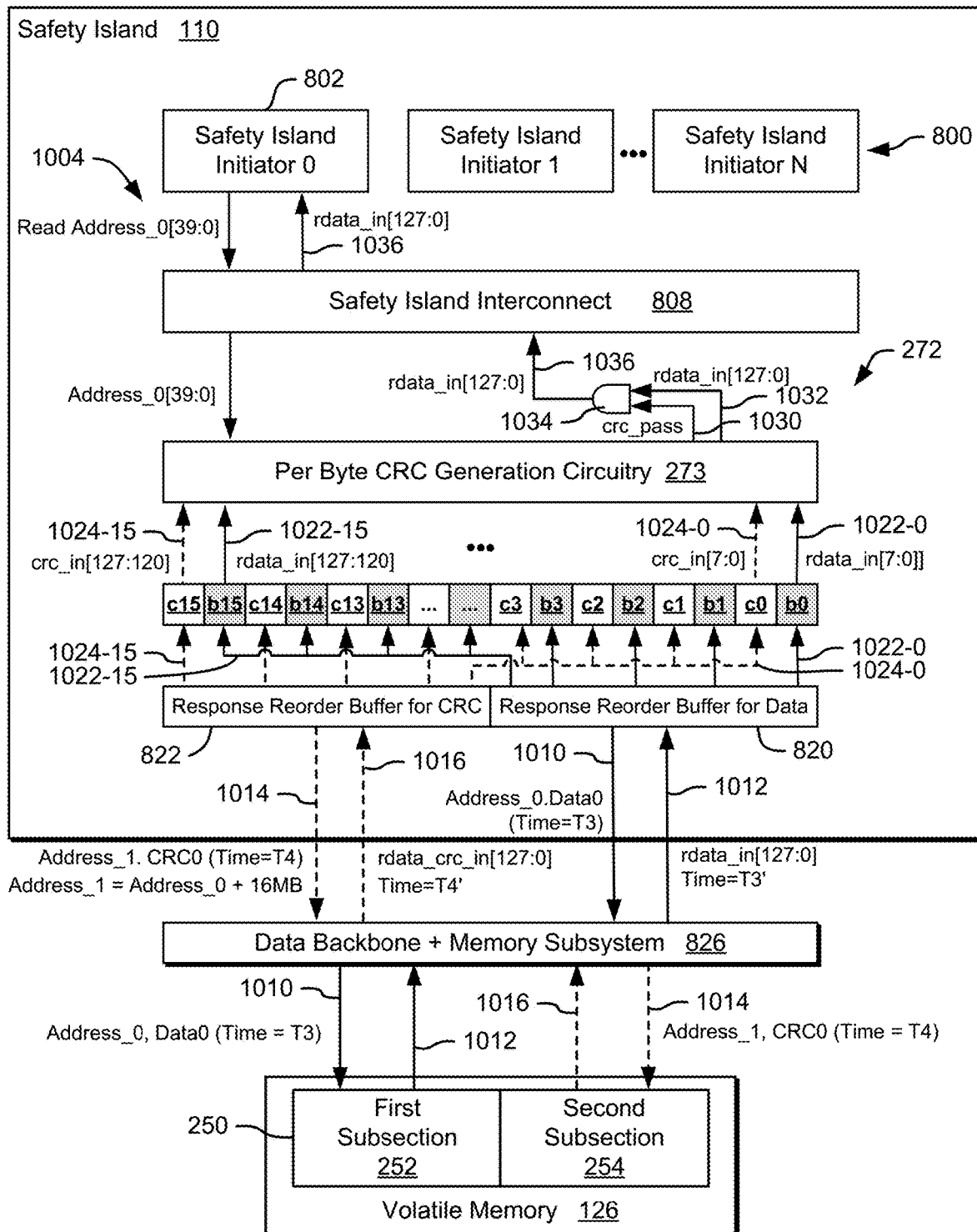
FIG. 10 illustrates an example of an error detection block of the safety island performing the method of FIG. 9, in accordance with some embodiments of the present disclosure.

FIG. 10 illustrates an example of the error detection block 272 performing the method 900. In this example, the processor 140 reads 16 bytes of data from the carve-out 250 stored by the example illustrated in FIG. 8. In FIG. 10, the read data is stored in or represented by an array of 128 bits named "rdata_in[127:0]" and the data is stored starting at the first data address, which is stored in or represented by an array of 40 bits named "Address_0[39:0]." FIG. 10 depicts the initiator 802 (e.g., the processor 140) sending a first read instruction 1004 to the error detection block 272 via the safety island interconnect 808. The safety island interconnect 808 delivers the first read instruction 1004 to the error detection block 272 (e.g., block 902 of FIG. 9).

The error detection block 272 sends the first data address to the first subsection 252 of the carve-out 250 via the volatile memory interface 200A (see FIG. 2) at a third time (e.g., identified in FIG. 8 as "Time=T3"). In other words, the error detection block 272 forwards the first read instruction to the first subsection 252 of the carve-out 250 (e.g., block 904 of FIG. 9). The volatile memory interface 200A communicates the first read instruction to the carve-out 250 via the data backbone and memory subsystem 826 of the automotive SoC 104. In FIG. 10, the first read instruction is sent by the error detection block 272 to the first subsection 252 in a signal 1010.

The first subsection 252 reads the data from memory starting at the first byte ("byte 0") at the first data address and reading the subsequent bytes from subsequent data addresses after the first data address. The SI 110 may read data having a predetermined size (e.g., 16 bytes) from the carve-out 250. Then, the first subsection 252 sends a response signal 1012 to the initiator 802 including the data that has been read. The response signal 1012 is sent by the first subsection 252 to the data backbone and memory subsystem 826, which forwards the response signal 1012 to the volatile memory interface 200A (see FIG. 2). When the volatile memory interface 200A is unlocked, the volatile memory interface 200A forwards the response signal 1012 to the first (data) buffer 820 (e.g., block 906 of FIG. 9). The data that have been read and included in the response signal 1012 automatically indicate data read completions and therefore may be characterized as being data read completion responses. Like the first (data) buffer 820 does with the data write completion responses, the first (data) buffer 820 may place the data read completion responses in an expected order in the response signal 1012. At this point, in this example, the data (e.g., 16 bytes) has been read from the first subsection 252 in a first single read operation and placed in the expected order by the first (data) buffer 820.

Then, the error detection block 272 determines a first code address ("Address_1") based on the first data address (e.g., block 908 of FIG. 9). In FIG. 10, the first code address is calculated by adding (for example) 16 megabytes ("MB") to the first data address ("Address_0").

Next, the error detection block 272 waits (e.g., block 910 of FIG. 9) until a fourth time (e.g., identified in FIG. 10 as "Time=T4"). At the fourth time, the error detection block 272 requests the error detection code(s) stored at the first code address(es) within the second subsection 254 via the volatile memory interface 200A (see FIG. 2). In other words, the error detection block 272 sends the second read instruction to the second subsection 254 of the carve-out 250 (e.g., block 912 of FIG. 9). The volatile memory interface 200A communicates the second read instruction to the carve-out 250 via the data backbone and memory subsystem 826 of the automotive SoC 104. In FIG. 10, the second read instruction is sent by the error detection block 272 to the second subsection 254 in a signal 1014.

The second subsection 254 reads the error detection codes from memory by reading the first error detection code (for "byte 0") at the first code address and reading the subsequent error detection codes from subsequent codes addresses after the first code address. In the example of FIGS. 8 and 10, the error detection code(s) are each one byte in size. Then, the second subsection 254 sends a response signal 1016 to the initiator 802 including the error detection code(s) read from memory. In FIG. 10, signals carrying the error detection codes and the signal 1014 are illustrated by arrows with dashed lines. In the embodiment illustrated in FIG. 10, the response signal 1016 is sent by the second subsection 254 to the data backbone and memory subsystem 826, which forwards the response signal 1016 to the volatile memory interface 200A (see FIG. 2). When the volatile memory interface 200A is unlocked, the volatile memory interface 200A forwards the response signal 1016 to the second (code) buffer 822 (e.g., block 914 of FIG. 9). The error detection codes that have been read and included in the response signal 1016 automatically indicate code read completions and therefore may be characterized as being code read completion responses. Like the second (code) buffer 822 does with the code write completion responses, the second (code) buffer 822 may place the code read completion responses in an expected order in the response signal 1016. At this point, in this example, the error detection codes (e.g., 16 bytes) have been read from the second subsection 254 in a second single read operation and placed in the expected order by the second (code) buffer 822.

When the error detection block 272 waits (e.g., block 910 of FIG. 9) until the fourth time (e.g., identified in FIG. 10 as "Time=T4"), the error detection block 272 merely spaces the first and second read instructions apart in time. The error detection block 272 may request the error detection code(s) from the second subsection 254 after the error detection block 272 receives the data in the response signal 1012. Alternatively, the error detection block 272 may not wait unit it receives the data in the response signal 1012 before requesting the error detection code(s) from the second subsection 254. In other words, the fourth time may be determined based on when the first read instruction is sent and not on when the response signal 1012 is received.

As mentioned above, because the bytes may be out of order in the response signal 1012, the first (data) buffer 820 may reorder the bytes. Similarly, the second (code) buffer 822 may reorder the error detection codes when the error detection codes are out of order in the response signal 1016. The first (data) buffer 820 outputs signals 1022-0 to 1022-15 each carrying one of the bytes of data and the second (code) buffer 822 outputs signals 1024-0 to 1024-15 each carrying one of the error detection codes. The signals 1022-0 to 1022-15 correspond to the signals 1024-0 to 1024-15, respectively. The first and second buffers 820 and 822 may route or reorder the signals 1022-0 to 1022-15 and 1024-0 to 1024-15 to position each byte of data in a known location with respect to the error detection code created for the byte. In the embodiment illustrated in FIG. 10, the bytes carried by the signals 1022-0 to 1022-15 are interleaved with the error detection codes carried by the signals 1024-0 to 1024-15. Thus, as in FIG. 10, the bytes of data are placed in locations represented by the shaded blocks b0-b15 and the error detection code(s) are placed in locations represented by blocks c0-c15.

Then, the code generation sub-block 273 determines (e.g., using the Equation 1 above) a check code for each of the bytes of the data (e.g., block 916 of FIG. 9). Thus, the code generation sub-block 273 receives as inputs the bytes of data in the signals 1022-0 to 1022-15 and the corresponding error detection codes in the signals 1024-0 to 1024-15.

For each of the error detection code(s), the error detection block 272 determines whether the error detection code matches the check code that corresponds to the error detection code (e.g., decision block 918 of FIG. 9). The error detection block 272 indicates whether they matched in a pass signal 1030 that is forwarded along with a data signal 1032 that includes the byte of data to a logic component 1034, which is illustrated in FIG. 10 implemented as an AND gate. If the pass signal 1030 indicates the error detection code stored for the byte matches the check code created for the byte, the logic component 1034 will output the byte in a checked data signal 1036 (which includes only bytes of data) and forward the checked data signal 1036 to the initiator 802. On the other hand, if the pass signal 1030 indicates a mismatch, the logic component 1034 will not forward the byte in the checked data signal 1036 to the initiator 802. Instead, the error detection block 272 may discard the byte and/or replace the byte with information (e.g., zeros) that indicates a mismatch has occurred. By way of a non-limiting example, the bits of the byte that generated the mismatch may be set to zero. The checked data signal 1036 is forwarded to the initiator 802 (e.g., block 920 of FIG. 9). The error detection block 272 may generate a mismatch error and send it to the initiator 802 when the error detection code does not match the check code that corresponds to the error detection code (e.g., block 922 of FIG. 9). In other words, if the pass signal 1030 indicates one or more mismatches, the error detection block 272 may generate a mismatch error and send it to the initiator 802. Alternatively or additionally, the error detection block 272 may send the mismatch error to the SI fault aggregator 142 as an uncorrected error. Thus, any error occurring in the data or the error detection code(s) during storage in the carve-out 250 and/or retrieval from in the carve-out 250 may be detected and reported (e.g., as an uncorrected error).

As mentioned above, the volatile memory interface 200A may include the two parallel and optionally dedicated interfaces that connect the error detection block 272 with the volatile memory 126. In such embodiments, the error detection block 272 may send the first read instruction including the first data address (e.g., in the signal 1010) over the first interface to the first subsection 252 at the same time that the error detection block 272 sends the second read instruction including the first code address (e.g., in the signal 1014) over the second interface to the second subsection 254. Further, the data read from the first subsection 252 (e.g., and transmitted in the response signal 1012) and the error detection code(s) read from the second subsection 254 (e.g., and transmitted in the response signal 1016) may be transmitted to the first and second buffers 820 and 822, respectively, at the same time over the first and second interfaces, respectively.

Referring to FIG. 2, the error detection block 272 may include or be connected to at least one transaction timer, such as egress and ingress timers 274 and 276, that limits an amount of time that the error detection block 272 has to read data from and/or write data to the carve-out 250. The egress timer 274 and/or the ingress timer 276 automatically start(s)

whenever an access passes through the error detection block 272. For example, the ingress timer 276 may start whenever data passes between the error detection block 272 and the initiator 802 (e.g., the processor 140) and the egress timer 274 may start whenever data passes between the error detection block 272 and the SoC domain (e.g., the carve-out 250). The ingress timer 276 may help monitor the functioning of the error detection block 272 and/or may help provide backup functionality for the egress timer 274 (e.g., if egress timer 274 is not functioning properly).

During a write operation, the ingress timer 276 may start when the initiator 802 passes data to the error detection block 272 to write into the carve-out 250 (e.g., at block 702 of FIG. 7). Then, the egress timer 274 may start when that data exits the error detection block 272 and/or the SI domain (e.g., at block 708 of FIG. 7). The egress timer 274 may stop or reset when the response (e.g., the response signal 828 illustrated in FIG. 8) is received from the carve-out 250 by the error detection block 272. Then, the ingress timer 276 may stop or reset when the response (e.g., the response signal 828 illustrated in FIG. 8) is transferred to the initiator 802 (see FIG. 8) by the error detection block 272. If the egress timer 274 indicates more than a first threshold amount of time has elapsed and the error detection block 272 has not received the response, which means the initiator 802 has not received a response from the carve-out 250 (e.g., the response signal 828 illustrated in FIG. 8), the initiator 802 (e.g., the processor 140) generates an egress timeout error. If the ingress timer 276 indicates more than a second threshold amount of time has elapsed and the error detection block 272 has not sent the response to the initiator 802, which means the initiator 802 has not received the response from the carve-out 250, the initiator 802 generates an ingress timeout error.

During a read operation, the ingress timer 276 may start when the error detection block 272 receives the read request from the initiator 802 (e.g., at block 902 of FIG. 9). Then, the egress timer 274 may start when the error detection block 272 requests the data stored at the first data address from the carve-out 250 (e.g., at block 904 of FIG. 9). The egress timer 274 may stop or reset when the data is received from the carve-out 250 by the error detection block 272 (e.g., at block 906 of FIG. 9). Then, the ingress timer 276 may stop or reset when the data is transferred to the initiator 802 by the error detection block 272 (e.g., at block 920 of FIG. 9). If the egress timer 274 indicates the first threshold amount of time has elapsed and the error detection block 272 has not received the data from the carve-out 250, which means the initiator 802 has not received the data from the error detection block 272 (e.g., in the checked data signal 1036 illustrated in FIG. 10), the initiator 802 generates the egress timeout error. If the ingress timer 276 indicates more than the second threshold amount of time has elapsed and the error detection block 272 has not sent the data to the initiator 802, which means the initiator 802 has not received the data from the carve-out 250, the initiator 802 generates the ingress timeout error.

Figure 11:
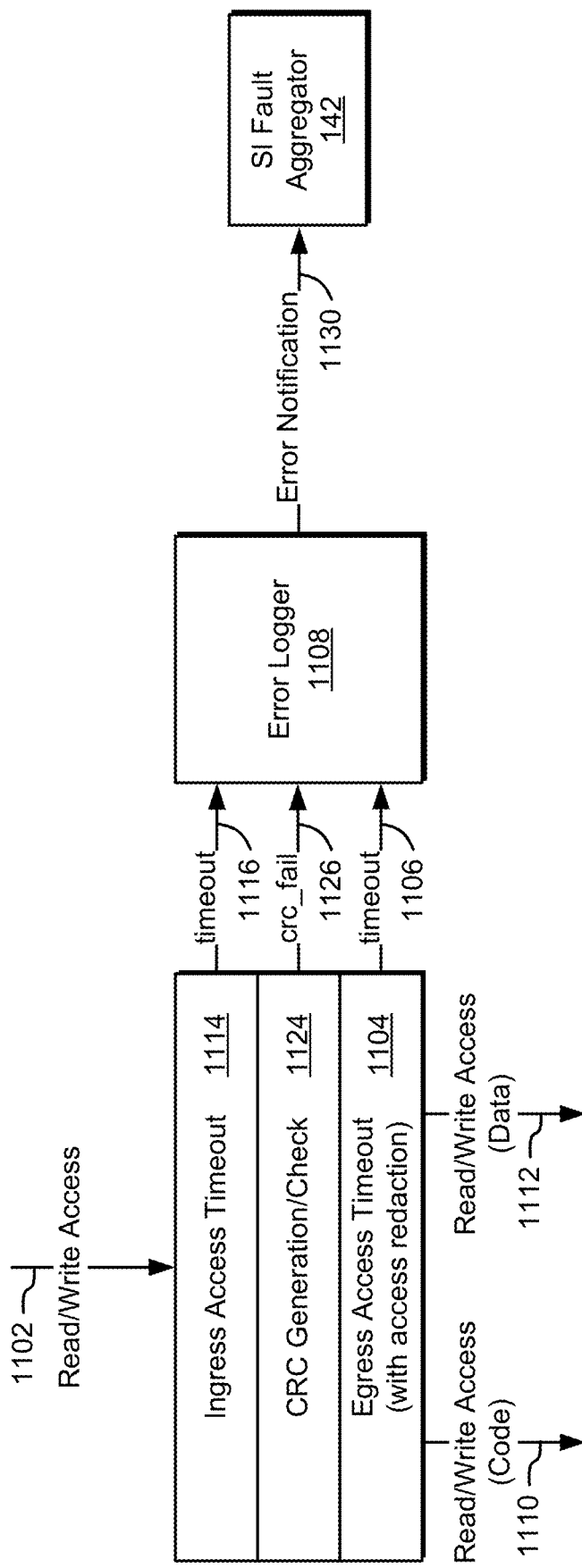
FIG. 11 is an illustration of a block diagram showing error notifications generated by the error detection block when the error detection block includes or is connected to egress and ingress timers, in accordance with some embodiments.

FIG. 11 is an illustration of a block diagram showing error notifications generated by the error detection block 272 (see FIGS. 2, 8, and 10) when the error detection block 272 includes or is connected to the egress and ingress timers 274 and 276 (see FIG. 2), in accordance with some embodiments. In FIG. 11, the initiator 802 (see FIGS. 8 and 10) sends a signal 1102 including either the first write instruction 804 (see FIG. 8) or the first read instruction 1004 (see FIG. 10) to the error detection block 272. As mentioned above, the egress timer 274 may start when the data exits the error detection block 272 and/or the SI domain during a write operation, and the egress timer 274 may start when the error detection block 272 requests the data stored at the first data address from the carve-out 250 during a read operation. Block 1104 indicates the egress timer 274 has timed out. The egress timer 274 may time out, for example, when the error detection block 272 has not received a response from the carve-out 250 (e.g., the response signal 828 illustrated in FIG. 8) during a write operation and more than the first threshold amount of time has elapsed. By way of another non-limiting example, the egress timer 274 may time out when the error detection block 272 has not received the data from the error detection block 272 (e.g., in the response signal 1012 illustrated in FIG. 10) during a read operation and more than the first threshold amount of time has elapsed. When the egress timer 274 has timed out, the initiator 802 (e.g., the processor 140) generates an egress timeout error 1106 and forwards the egress timeout error 1106 to an error logger 1108. On the other hand, if the egress timer 274 has not timed out, the egress timer 274 may stop or reset. This may occur when the error detection block 272 receives either the response (e.g., the response signal 828) from the carve-out 250 during a write operation, or the data (e.g., in the response signal 1012) from the carve-out 250 during a read operation before the first threshold amount of time has elapsed.

As mentioned above, the ingress timer 276 may start when the initiator 802 passes data to the error detection block 272 to write into the carve-out 250 (e.g., at block 702 of FIG. 7) during a write operation, or the ingress timer 276 may start when the error detection block 272 receives the read request from the initiator 802 during a read operation (e.g., at block 902 of FIG. 9). Thus, the ingress timer 276 (see FIG. 2) may start when the signal 1102 includes the first read instruction 804 (see FIG. 8) or the first read instruction 1004 (see FIG. 10) and that instruction is received by the error detection block 272 (see FIGS. 2, 8, and 10). Block 1114 indicates the ingress timer 276 has timed out. The ingress timer 276 may time out, for example, when more than the second threshold amount of time has elapsed and the initiator 802 (see FIG. 8) has not received a response from the carve-out 250 (e.g., the response signal 828 illustrated in FIG. 8) during a write operation. By way of another non-limiting example, the ingress timer 276 may time out when more than the second threshold amount of time has elapsed and the initiator 802 has not received the data (e.g., the checked data signal 1036 illustrated in FIG. 10) from the carve-out 250 during a read operation. When the ingress timer 276 times out, the initiator 802 generates an ingress timeout error 1116 and forwards the ingress timeout error 1116 to the error logger 1108. On the other hand, if the ingress timer 276 has not timed out, the ingress timer 276 may stop or reset. This may occur when the error detection block 272 transfers the response (e.g., the response signal 828) to the initiator 802 during a write operation, or the error detection block 272 transfers the data (e.g., the checked data signal 1036) to the initiator 802 during a read operation.

Block 1124 indicates the code generation sub-block 273 (see FIGS. 2, 8, and 10) of the error detection block 272 (see FIGS. 2, 8, and 10) may generate a code generation/check error 1126 that indicates an error has occurred during the generation of an error detection code or a check code. In some embodiments, the code generation/check error 1126 may be used to indicate that a mismatch has occurred. By way of a non-limiting example, when the signal 1102 includes the first write instruction 804, the code generation sub-block 273 may generate a code generation error while generating the error detection code(s). By way of other non-limiting examples, when the signal 1102 includes the first read instruction 1004, the error detection block 272 may generate a mismatch error and/or a code generation error while generating the check code(s), which is/are forwarded to the error logger 1108 as the code generation/check error 1126.

The error logger 1108 may function as a fault aggregator that aggregates the errors 1106, 1116, and 1126 into an error notification 1130 that the error logger 1108 sends to the SI fault aggregator 142.

When the automotive SoC 104 first boots up, the processor 140 of the SI 110 may attempt to pre-fetch data from the carve-out 250. A pre-fetch may be characterized as being a type of non-deliberate read of data from the carve-out 250. Because the shared volatile memory 126 is volatile, at that point, the carve-out 250 may be storing uninitialized data that lacks error detection code(s) or is associated with mismatching error detection code(s). To prevent the error detection block 272 from generating mismatch errors, the SI 110 (e.g., the processor 140, the DMA engine 402, and/or the like) may write one or more error detection codes into the carve-out 250 for the data that the processor 140 will or might pre-fetch. By way of a non-limiting example, the SI 110 may write initial data to the carve-out 250, which causes the hardware of the error detection block 272 to determine one or more error detection codes for the initial data, each associated with a code address. Then, the SI 110 may cause the carve-out 250 to store each error detection code in its associated code address. Thus, during a pre-fetch operation, the error detection codes stored by the second subsection 254 will correspond to the data stored in the first subsection 252 and the error detection block 272 will not generate mismatch errors.

Referring to FIG. 2, the SI 110 may turn off the code generation sub-block 273 (see FIGS. 2, 8, and 10) and/or the error detection block 272 (e.g., using a software register write) if the automotive platform 100 (see FIG. 1) does not require the carve-out 250. For example, the SI 110 may turn off the code generation sub-block 273 and/or the error detection block 272 when the volatile memory 126 is operating at a risk level that is sufficient for the automotive platform 100.

It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory.

Example Autonomous Vehicle

Figure 12:
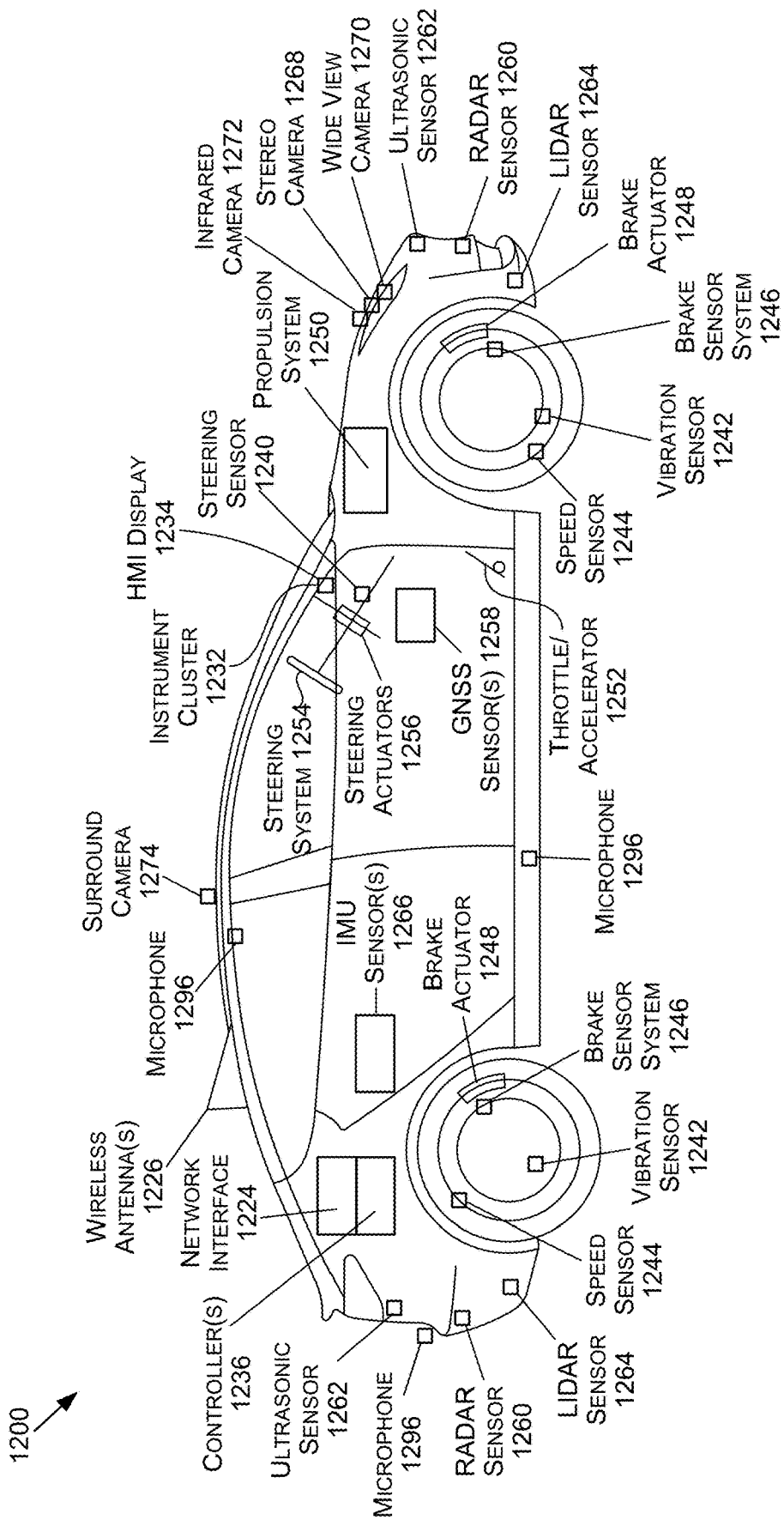
FIG. 12 is an illustration of an example autonomous vehicle, in accordance with some embodiments of the present disclosure.

FIG. 12 is an illustration of the example autonomous vehicle 1200, in accordance with some embodiments of the present disclosure. The autonomous vehicle 1200 (alternatively referred to herein as the "vehicle 1200") may include, without limitation, a passenger vehicle, such as a car, a truck, a bus, a first responder vehicle, a shuttle, an electric or motorized bicycle, a motorcycle, a fire truck, a police vehicle, an ambulance, a boat, a construction vehicle, an underwater craft, a drone, and/or another type of vehicle (e.g., that is unmanned and/or that accommodates one or more passengers). Autonomous vehicles are generally described in terms of automation levels, defined by the National Highway Traffic Safety Administration (NHTSA), a division of the US Department of Transportation, and the Society of Automotive Engineers (SAE) "Taxonomy and Definitions for Terms Related to Driving Automation Systems for On-Road Motor Vehicles" (Standard No. J3016-201806, published on Jun. 15, 2018, Standard No. J3016-201609, published on Sep. 30, 2016, and previous and future versions of this standard). The vehicle 1200 may be capable of functionality in accordance with one or more of Level 2-Level 5 of the autonomous driving levels as defined by SAE. For example, the vehicle 1200 may be capable of partial driving automation (Level 2), conditional automation (Level 3), high automation (Level 4), and/or full automation (Level 5), depending on the embodiment.

The vehicle 1200 may include components such as a chassis, a vehicle body, wheels (e.g., 2, 4, 6, 8, 18, etc.), tires, axles, and other components of a vehicle. The vehicle 1200 may include a propulsion system 1250, such as an internal combustion engine, hybrid electric power plant, an all-electric engine, and/or another propulsion system type. The propulsion system 1250 may be connected to a drive train of the vehicle 1200, which may include a transmission, to enable the propulsion of the vehicle 1200. The propulsion system 1250 may be controlled in response to receiving signals from the throttle/accelerator 1252.

A steering system 1254, which may include a steering wheel, may be used to steer the vehicle 1200 (e.g., along a desired path or route) when the propulsion system 1250 is operating (e.g., when the vehicle is in motion). The steering system 1254 may receive signals from a steering actuator 1256. The steering wheel may be optional for full automation (Level 5) functionality.

The brake sensor system 1246 may be used to operate the vehicle brakes in response to receiving signals from the brake actuators 1248 and/or brake sensors.

Controller(s) 1236, which may include one or more CPU(s), system on chips (SoCs) 1204 (FIG. 14), and/or GPU(s), may provide signals (e.g., representative of commands) to one or more components and/or systems of the vehicle 1200. For example, the controller(s) may send signals to operate the vehicle brakes via one or more brake actuators 1248, to operate the steering system 1254 via one or more steering actuators 1256, and/or to operate the propulsion system 1250 via one or more throttle/accelerators 1252. The controller(s) 1236 may include one or more onboard (e.g., integrated) computing devices (e.g., supercomputers) that process sensor signals, and output operation commands (e.g., signals representing commands) to enable autonomous driving and/or to assist a human driver in driving the vehicle 1200. The controller(s) 1236 may include a first controller 1236 for autonomous driving functions, a second controller 1236 for functional safety functions, a third controller 1236 for artificial intelligence functionality (e.g., computer vision), a fourth controller 1236 for infotainment functionality, a fifth controller 1236 for redundancy in emergency conditions, and/or other controllers. In some examples, a single controller 1236 may handle two or more of the above functionalities, two or more controllers 1236 may handle a single functionality, and/or any combination thereof.

The controller(s) 1236 may provide the signals for controlling one or more components and/or systems of the vehicle 1200 in response to sensor data received from one or more sensors (e.g., sensor inputs). The sensor data may be received from, for example and without limitation, global navigation satellite systems sensor(s) 1258 (e.g., Global Positioning System sensor(s)), RADAR sensor(s) 1260, ultrasonic sensor(s) 1262, LIDAR sensor(s) 1264, inertial measurement unit (IMU) sensor(s) 1266 (e.g., accelerometer(s), gyroscope(s), magnetic compass(es), magnetometer(s), etc.), microphone(s) 1296, stereo camera(s) 1268, wide-view camera(s) 1270 (e.g., fisheye cameras), infrared camera(s) 1272, surround camera(s) 1274 (e.g., 360 degree cameras), long-range and/or mid-range camera(s) 1298, speed sensor(s) 1244 (e.g., for measuring the speed of the vehicle 1200), vibration sensor(s) 1242, steering sensor(s) 1240, brake sensor(s) 1246 (e.g., as part of the brake sensor system 1246), and/or other sensor types.

One or more of the controller(s) 1236 may receive inputs (e.g., represented by input data) from an instrument cluster 1232 of the vehicle 1200 and provide outputs (e.g., represented by output data, display data, etc.) via a human-machine interface (HMI) display 1234, an audible annunciator, a loudspeaker, and/or via other components of the vehicle 1200. The outputs may include information such as vehicle velocity, speed, time, map data (e.g., the HD map 1222 of FIG. 14), location data (e.g., the location of the vehicle 1200, such as on a map), direction, location of other vehicles (e.g., an occupancy grid), information about objects and status of objects as perceived by the controller(s) 1236, etc. For example, the HMI display 1234 may display information about the presence of one or more objects (e.g., a street sign, caution sign, traffic light changing, etc.), and/or information about driving maneuvers the vehicle has made, is making, or will make (e.g., changing lanes now, taking exit 34B in two miles, etc.).

The vehicle 1200 further includes a network interface 1224, which may use one or more wireless antenna(s) 1226 and/or modem(s) to communicate over one or more networks. For example, the network interface 1224 may be capable of communication over LTE, WCDMA, UMTS, GSM, CDMA2000, etc. The wireless antenna(s) 1226 may also enable communication between objects in the environment (e.g., vehicles, mobile devices, etc.), using local area network(s), such as Bluetooth, Bluetooth LE, Z-Wave, Zig-Bee, etc., and/or low power wide-area network(s) (LP-WANs), such as LoRaWAN, SigFox, etc.

As mentioned above, in at least some embodiments, the automotive platform 100 (see FIG. 1) may be a component of the autonomous vehicle 1200. In such embodiments, the controller(s) 1236 include(s) the automotive SoC 104.

Figure 13:
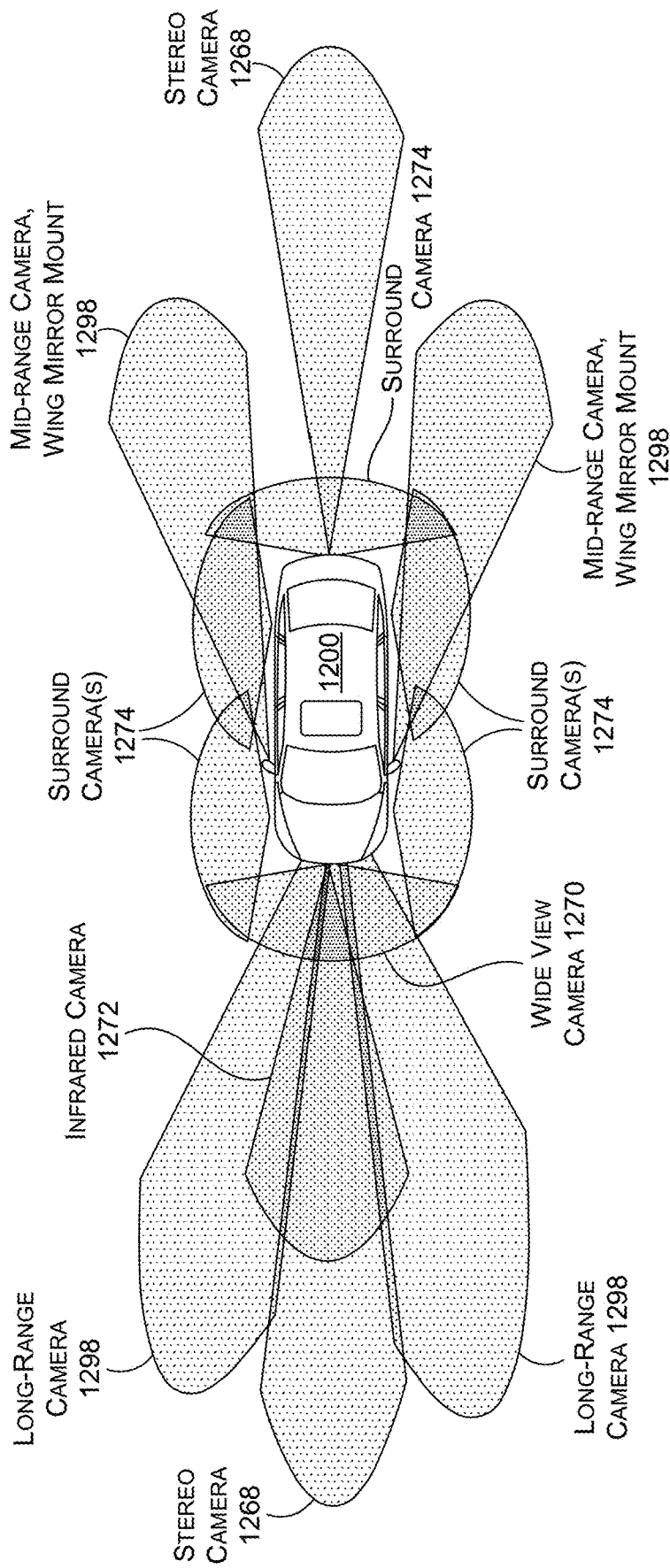
FIG. 13 is an example of camera locations and fields of view for the example autonomous vehicle of FIG. 12, in accordance with some embodiments of the present disclosure.

FIG. 13 is an example of camera locations and fields of view for the example autonomous vehicle 1200 of FIG. 12, in accordance with some embodiments of the present disclosure. The cameras and respective fields of view are one example embodiment and are not intended to be limiting. For example, additional and/or alternative cameras may be included and/or the cameras may be located at different locations on the vehicle 1200.

The camera types for the cameras may include, but are not limited to, digital cameras that may be adapted for use with the components and/or systems of the vehicle 1200. The camera(s) may operate at automotive safety integrity level (ASIL) B and/or at another ASIL. The camera types may be capable of any image capture rate, such as 60 frames per second (fps), 120 fps, 240 fps, etc., depending on the embodiment. The cameras may be capable of using rolling shutters, global shutters, another type of shutter, or a combination thereof. In some examples, the color filter array may include a red clear clear clear (RCCC) color filter array, a red clear clear blue (RCCB) color filter array, a red blue green clear (RBGC) color filter array, a Foveon X3 color filter array, a Bayer sensors (RGGB) color filter array, a monochrome sensor color filter array, and/or another type of color filter array. In some embodiments, clear pixel cameras, such as cameras with an RCCC, an RCCB, and/or an RBGC color filter array, may be used in an effort to increase light sensitivity.

In some examples, one or more of the camera(s) may be used to perform advanced driver assistance systems (ADAS) functions (e.g., as part of a redundant or fail-safe design). For example, a Multi-Function Mono Camera may be installed to provide functions including lane departure warning, traffic sign assist and intelligent headlamp control. One or more of the camera(s) (e.g., all of the cameras) may record and provide image data (e.g., video) simultaneously.

One or more of the cameras may be mounted in a mounting assembly, such as a custom-designed (3-D printed) assembly, in order to cut out stray light and reflections from within the car (e.g., reflections from the dashboard reflected in the windshield mirrors) which may interfere with the camera's image data capture abilities. With reference to wing-mirror mounting assemblies, the wing-mirror assemblies may be custom 3-D printed so that the camera mounting plate matches the shape of the wing-mirror. In some examples, the camera(s) may be integrated into the wing-mirror. For side-view cameras, the camera(s) may also be integrated within the four pillars at each corner of the cabin.

Cameras with a field of view that includes portions of the environment in front of the vehicle 1200 (e.g., front-facing cameras) may be used for surround view, to help identify forward-facing paths and obstacles, as well aid in, with the help of one or more controllers 1236 and/or control SoCs, providing information critical to generating an occupancy grid and/or determining the preferred vehicle paths. Front-facing cameras may be used to perform many of the same ADAS functions as LIDAR, including emergency braking, pedestrian detection, and collision avoidance. Front-facing cameras may also be used for ADAS functions and systems including Lane Departure Warnings (LDW), Autonomous Cruise Control (ACC), and/or other functions such as traffic sign recognition.

A variety of cameras may be used in a front-facing configuration, including, for example, a monocular camera platform that includes a CMOS (complementary metal oxide semiconductor) color imager. Another example may be a wide-view camera(s) 1270 that may be used to perceive objects coming into view from the periphery (e.g., pedestrians, crossing traffic, or bicycles). Although only one wide-view camera is illustrated in FIG. 13, there may any number of wide-view cameras 1270 on the vehicle 1200. In addition, long-range camera(s) 1298 (e.g., a long-view stereo camera pair) may be used for depth-based object detection, especially for objects for which a neural network has not yet been trained. The long-range camera(s) 1298 may also be used for object detection and classification, as well as basic object tracking.

One or more stereo cameras 1268 may also be included in a front-facing configuration. The stereo camera(s) 1268 may include an integrated control unit including a scalable processing unit, which may provide a programmable logic (e.g., FPGA) and a multi-core micro-processor with an integrated CAN or Ethernet interface on a single chip. Such a unit may be used to generate a 3-D map of the vehicle's environment, including a distance estimate for all the points in the image.

An alternative stereo camera(s) 1268 may include a compact stereo vision sensor(s) that may include two camera lenses (one each on the left and right) and an image processing chip that may measure the distance from the vehicle to the target object and use the generated information (e.g., metadata) to activate the autonomous emergency braking and lane departure warning functions. Other types of stereo camera(s) 1268 may be used in addition to, or alternatively from, those described herein.

Cameras with a field of view that includes portions of the environment to the side of the vehicle 1200 (e.g., side-view cameras) may be used for surround view, providing information used to create and update the occupancy grid, as well as to generate side impact collision warnings. For example, surround camera(s) 1274 (e.g., four surround cameras 1274 as illustrated in FIG. 13) may be positioned around the vehicle 1200. The surround camera(s) 1274 may include wide-view camera(s) 1270, fisheye camera(s), 360-degree camera(s), and/or the like. For example, four fisheye cameras may be positioned on the vehicle's front, rear, and sides. In an alternative arrangement, the vehicle may use three surround camera(s) 1274 (e.g., left, right, and rear), and may leverage one or more other camera(s) (e.g., a forward-facing camera) as a fourth surround-view camera.

Cameras with a field of view that include portions of the environment to the rear of the vehicle 1200 (e.g., rear-view cameras) may be used for park assistance, surround view, rear collision warnings, and creating and updating the occupancy grid. A wide variety of cameras may be used including, but not limited to, cameras that are also suitable as a front-facing camera(s) (e.g., long-range and/or mid-range camera(s) 1298, stereo camera(s) 1268), infrared camera(s) 1272, etc.), as described herein.

Figure 14:
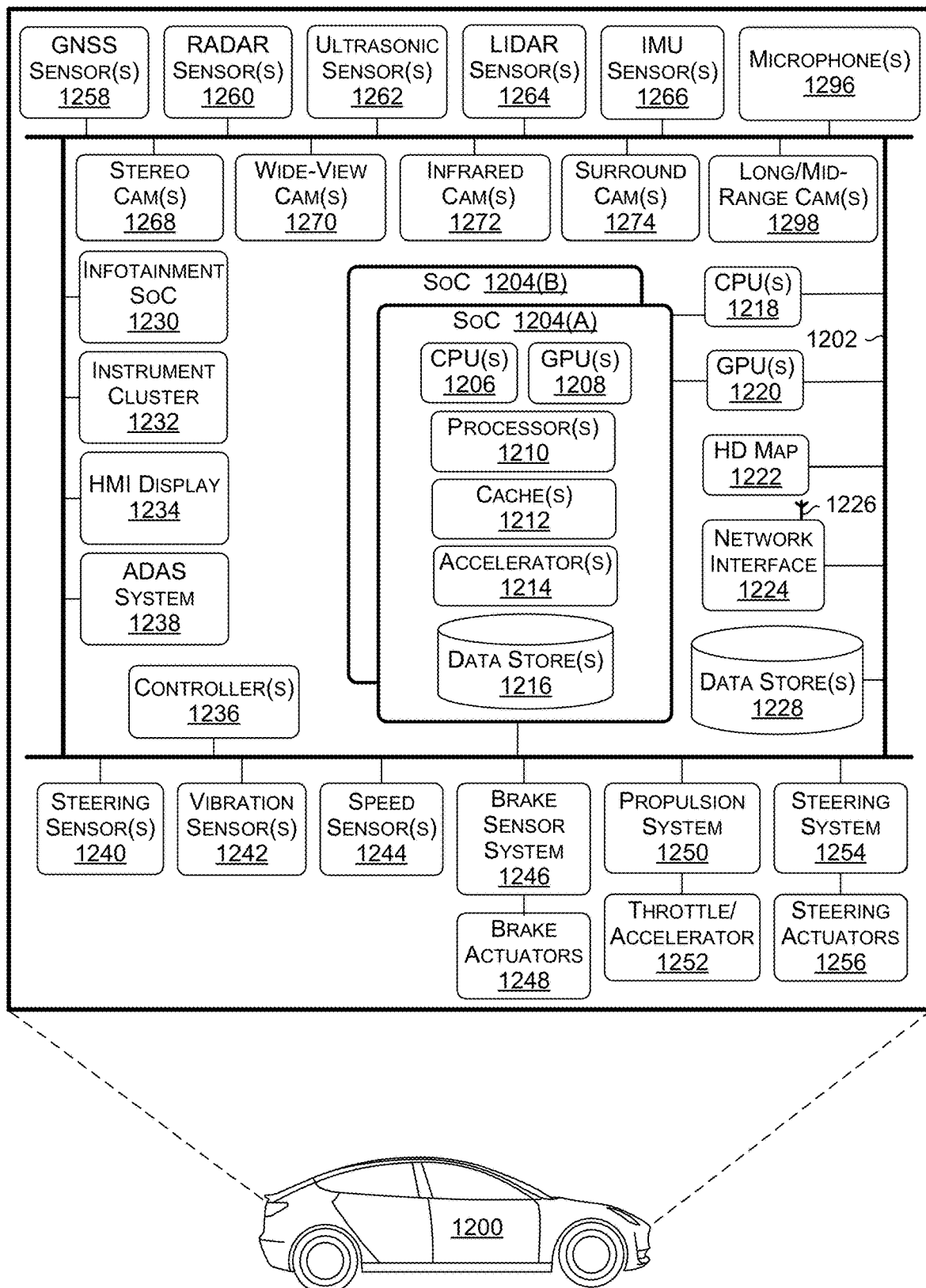
FIG. 14 is a block diagram of an example system architecture for the example autonomous vehicle of FIG. 12, in accordance with some embodiments of the present disclosure.

FIG. 14 is a block diagram of an example system architecture for the example autonomous vehicle 1200 of FIG. 12, in accordance with some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory.

Each of the components, features, and systems of the vehicle 1200 in FIG. 14 is illustrated as being connected via bus 1202. The bus 1202 may include a Controller Area Network (CAN) data interface (alternatively referred to herein as a "CAN bus"). A CAN may be a network inside the vehicle 1200 used to aid in control of various features and functionality of the vehicle 1200, such as actuation of brakes, acceleration, braking, steering, windshield wipers, etc. A CAN bus may be configured to have dozens or even hundreds of nodes, each with its own unique identifier (e.g., a CAN ID). The CAN bus may be read to find steering wheel angle, ground speed, engine revolutions per minute (RPMs), button positions, and/or other vehicle status indicators. The CAN bus may be ASIL B compliant.

Although the bus 1202 is described herein as being a CAN bus, this is not intended to be limiting. For example, in addition to, or alternatively from, the CAN bus, FlexRay and/or Ethernet may be used. Additionally, although a single line is used to represent the bus 1202, this is not intended to be limiting. For example, there may be any number of busses 1202, which may include one or more CAN busses, one or more FlexRay busses, one or more Ethernet busses, and/or one or more other types of busses using a different protocol. In some examples, two or more busses 1202 may be used to perform different functions, and/or may be used for redundancy. For example, a first bus 1202 may be used for collision avoidance functionality and a second bus 1202 may be used for actuation control. In any example, each bus 1202 may communicate with any of the components of the vehicle 1200, and two or more busses 1202 may communicate with the same components. In some examples, each SoC 1204, each controller 1236, and/or each computer within the vehicle may have access to the same input data (e.g., inputs from sensors of the vehicle 1200), and may be connected to a common bus, such the CAN bus.

The vehicle 1200 may include one or more controller(s) 1236, such as those described herein with respect to FIG. 12. The controller(s) 1236 may be used for a variety of functions. The controller(s) 1236 may be coupled to any of the various other components and systems of the vehicle 1200 and may be used for control of the vehicle 1200, artificial intelligence of the vehicle 1200, infotainment for the vehicle 1200, and/or the like.

The vehicle 1200 may include a system(s) on a chip (SoC) 1204. The SoC 1204 may include CPU(s) 1206, GPU(s) 1208, processor(s) 1210, cache(s) 1212, accelerator(s) 1214, data store(s) 1216, and/or other components and features not illustrated. The SoC(s) 1204 may be used to control the vehicle 1200 in a variety of platforms and systems. For example, the SoC(s) 1204 may be combined in a system (e.g., the system of the vehicle 1200) with an HD map 1222 which may obtain map refreshes and/or updates via a network interface 1224 from one or more servers (e.g., server(s) 1278 of FIG. 15).

The CPU(s) 1206 may include a CPU cluster or CPU complex (alternatively referred to herein as a "CCPLEX"). The CPU(s) 1206 may include multiple cores and/or L2 caches. For example, in some embodiments, the CPU(s) 1206 may include eight cores in a coherent multi-processor configuration. In some embodiments, the CPU(s) 1206 may include four dual-core clusters where each cluster has a dedicated L2 cache (e.g., a 2 MB L2 cache). The CPU(s) 1206 (e.g., the CCPLEX) may be configured to support simultaneous cluster operation enabling any combination of the clusters of the CPU(s) 1206 to be active at any given time.

The CPU(s) 1206 may implement power management capabilities that include one or more of the following features: individual hardware blocks may be clock-gated automatically when idle to save dynamic power; each core clock may be gated when the core is not actively executing instructions due to execution of WFI/WFE instructions; each core may be independently power-gated; each core cluster may be independently clock-gated when all cores are clock-gated or power-gated; and/or each core cluster may be independently power-gated when all cores are power-gated. The CPU(s) 1206 may further implement an enhanced algorithm for managing power states, where allowed power states and expected wakeup times are specified, and the hardware/microcode determines the best power state to enter for the core, cluster, and CCPLEX. The processing cores may support simplified power state entry sequences in software with the work offloaded to microcode.

The GPU(s) 1208 may include an integrated GPU (alternatively referred to herein as an "iGPU"). The GPU(s) 1208 may be programmable and may be efficient for parallel workloads. The GPU(s) 1208, in some examples, may use an enhanced tensor instruction set. The GPU(s) 1208 may include one or more streaming microprocessors, where each streaming microprocessor may include an L1 cache (e.g., an L1 cache with at least 96 KB storage capacity), and two or more of the streaming microprocessors may share an L2 cache (e.g., an L2 cache with a 512 KB storage capacity). In some embodiments, the GPU(s) 1208 may include at least eight streaming microprocessors. The GPU(s) 1208 may use computer-based application programming interface(s) (API(s)). In addition, the GPU(s) 1208 may use one or more parallel computing platforms and/or programming models (e.g., NVIDIA's CUDA).

The GPU(s) 1208 may be power-optimized for best performance in automotive and embedded use cases. For example, the GPU(s) 1208 may be fabricated on a Fin field-effect transistor (FinFET). However, this is not intended to be limiting, and the GPU(s) 1208 may be fabricated using other semiconductor manufacturing processes. Each streaming microprocessor may incorporate a number of mixed-precision processing cores partitioned into multiple blocks. For example, and without limitation, 64 PF32 cores and 32 PF64 cores may be partitioned into four processing blocks. In such an example, each processing block may be allocated 16 FP32 cores, 8 FP64 cores, 16 INT32 cores, two mixed-precision NVIDIA TENSOR COREs for deep learning matrix arithmetic, an L0 instruction cache, a warp scheduler, a dispatch unit, and/or a 64 KB register file. In addition, the streaming microprocessors may include independent parallel integer and floating-point data paths to provide for efficient execution of workloads with a mix of computation and addressing calculations. The streaming microprocessors may include independent thread-scheduling capability to enable finer-grain synchronization and cooperation between parallel threads. The streaming microprocessors may include a combined L1 data cache and shared memory unit in order to improve performance while simplifying programming.

The GPU(s) 1208 may include a high bandwidth memory (HBM) and/or a 16 GB HBM2 memory subsystem to provide, in some examples, about 900 GB/second peak memory bandwidth. In some examples, in addition to, or alternatively from, the HBM memory, a synchronous graphics random-access memory (SGRAM) may be used, such as a graphics double data rate type five synchronous random-access memory (GDDR5).

The GPU(s) 1208 may include unified memory technology including access counters to allow for more accurate migration of memory pages to the processor that accesses them most frequently, thereby improving efficiency for memory ranges shared between processors. In some examples, address translation services (ATS) support may be used to allow the GPU(s) 1208 to access the CPU(s) 1206 page tables directly. In such examples, when the GPU(s) 1208 memory management unit (MMU) experiences a miss, an address translation request may be transmitted to the CPU(s) 1206. In response, the CPU(s) 1206 may look in its page tables for the virtual-to-physical mapping for the address and transmits the translation back to the GPU(s) 1208. As such, unified memory technology may allow a single unified virtual address space for memory of both the CPU(s) 1206 and the GPU(s) 1208, thereby simplifying the GPU(s) 1208 programming and porting of applications to the GPU(s) 1208.

In addition, the GPU(s) 1208 may include an access counter that may keep track of the frequency of access of the GPU(s) 1208 to memory of other processors. The access counter may help ensure that memory pages are moved to the physical memory of the processor that is accessing the pages most frequently.

The SoC(s) 1204 may include any number of cache(s) 1212, including those described herein. For example, the cache(s) 1212 may include an L3 cache that is available to both the CPU(s) 1206 and the GPU(s) 1208 (e.g., that is connected to both the CPU(s) 1206 and the GPU(s) 1208). The cache(s) 1212 may include a write-back cache that may keep track of states of lines, such as by using a cache coherence protocol (e.g., MEI, MESI, MSI, etc.). The L3 cache may include 4 MB or more, depending on the embodiment, although smaller cache sizes may be used.

The SoC(s) 1204 may include an arithmetic logic unit(s) (ALU(s)) which may be leveraged in performing processing with respect to any of the variety of tasks or operations of the vehicle 1200—such as processing DNNs. In addition, the SoC(s) 1204 may include a floating point unit(s) (FPU(s))—or other math coprocessor or numeric coprocessor types—for performing mathematical operations within the system. For example, the SoC(s) 104 may include one or more FPUs integrated as execution units within a CPU(s) 1206 and/or GPU(s) 1208.

The SoC(s) 1204 may include one or more accelerators 1214 (e.g., hardware accelerators, software accelerators, or a combination thereof). For example, the SoC(s) 1204 may include a hardware acceleration cluster that may include optimized hardware accelerators and/or large on-chip memory. The large on-chip memory (e.g., 4 MB of SRAM), may enable the hardware acceleration cluster to accelerate neural networks and other calculations. The hardware acceleration cluster may be used to complement the GPU(s) 1208 and to off-load some of the tasks of the GPU(s) 1208 (e.g., to free up more cycles of the GPU(s) 1208 for performing other tasks). As an example, the accelerator(s) 1214 may be used for targeted workloads (e.g., perception, convolutional neural networks (CNNs), etc.) that are stable enough to be amenable to acceleration. The term "CNN," as used herein, may include all types of CNNs, including region-based or regional convolutional neural networks (RCNNs) and Fast RCNNs (e.g., as used for object detection).

The accelerator(s) 1214 (e.g., the hardware acceleration cluster) may include a deep learning accelerator(s) (DLA). The DLA(s) may include one or more Tensor processing units (TPUs) that may be configured to provide an additional ten trillion operations per second for deep learning applications and inferencing. The TPUs may be accelerators configured to, and optimized for, performing image processing functions (e.g., for CNNs, RCNNs, etc.). The DLA(s) may further be optimized for a specific set of neural network types and floating point operations, as well as inferencing. The design of the DLA(s) may provide more performance per millimeter than a general-purpose GPU, and vastly exceeds the performance of a CPU. The TPU(s) may perform several functions, including a single-instance convolution function, supporting, for example, INT8, INT16, and FP16 data types for both features and weights, as well as post-processor functions.

The DLA(s) may quickly and efficiently execute neural networks, especially CNNs, on processed or unprocessed data for any of a variety of functions, including, for example and without limitation: a CNN for object identification and detection using data from camera sensors; a CNN for distance estimation using data from camera sensors; a CNN for emergency vehicle detection and identification and detection using data from microphones; a CNN for facial recognition and vehicle owner identification using data from camera sensors; and/or a CNN for security and/or safety related events.

The DLA(s) may perform any function of the GPU(s) 1208, and by using an inference accelerator, for example, a designer may target either the DLA(s) or the GPU(s) 1208 for any function. For example, the designer may focus processing of CNNs and floating point operations on the DLA(s) and leave other functions to the GPU(s) 1208 and/or other accelerator(s) 1214.

The accelerator(s) 1214 (e.g., the hardware acceleration cluster) may include a programmable vision accelerator(s) (PVA), which may alternatively be referred to herein as a computer vision accelerator. The PVA(s) may be designed and configured to accelerate computer vision algorithms for the advanced driver assistance systems (ADAS), autonomous driving, and/or augmented reality (AR) and/or virtual reality (VR) applications. The PVA(s) may provide a balance between performance and flexibility. For example, each PVA(s) may include, for example and without limitation, any number of reduced instruction set computer (RISC) cores, direct memory access (DMA), and/or any number of vector processors.

The RISC cores may interact with image sensors (e.g., the image sensors of any of the cameras described herein), image signal processor(s), and/or the like. Each of the RISC cores may include any amount of memory. The RISC cores may use any of a number of protocols, depending on the embodiment. In some examples, the RISC cores may execute a real-time operating system (RTOS). The RISC cores may be implemented using one or more integrated circuit devices, application specific integrated circuits (ASICs), and/or memory devices. For example, the RISC cores may include an instruction cache and/or a tightly coupled RAM.

The DMA may enable components of the PVA(s) to access the system memory independently of the CPU(s) 1206. The DMA may support any number of features used to provide optimization to the PVA including, but not limited to, supporting multi-dimensional addressing and/or circular addressing. In some examples, the DMA may support up to six or more dimensions of addressing, which may include block width, block height, block depth, horizontal block stepping, vertical block stepping, and/or depth stepping.

The vector processors may be programmable processors that may be designed to efficiently and flexibly execute programming for computer vision algorithms and provide signal processing capabilities. In some examples, the PVA may include a PVA core and two vector processing subsystem partitions. The PVA core may include a processor subsystem, DMA engine(s) (e.g., two DMA engines), and/or other peripherals. The vector processing subsystem may operate as the primary processing engine of the PVA, and may include a vector processing unit (VPU), an instruction cache, and/or vector memory (e.g., VMEM). A VPU core may include a digital signal processor such as, for example, a single instruction, multiple data (SIMD), very long instruction word (VLIW) digital signal processor. The combination of the SIMD and VLIW may enhance throughput and speed.

Each of the vector processors may include an instruction cache and may be coupled to dedicated memory. As a result, in some examples, each of the vector processors may be configured to execute independently of the other vector processors. In other examples, the vector processors that are included in a particular PVA may be configured to employ data parallelism. For example, in some embodiments, the plurality of vector processors included in a single PVA may execute the same computer vision algorithm, but on different regions of an image. In other examples, the vector processors included in a particular PVA may simultaneously execute different computer vision algorithms, on the same image, or even execute different algorithms on sequential images or portions of an image. Among other things, any number of PVAs may be included in the hardware acceleration cluster and any number of vector processors may be included in each of the PVAs. In addition, the PVA(s) may include additional error correcting code (ECC) memory, to enhance overall system safety.

The accelerator(s) 1214 (e.g., the hardware acceleration cluster) may include a computer vision network on-chip and SRAM, for providing a high-bandwidth, low latency SRAM for the accelerator(s) 1214. In some examples, the on-chip memory may include at least 4 MB SRAM, consisting of, for example and without limitation, eight field-configurable memory blocks, that may be accessible by both the PVA and the DLA. Each pair of memory blocks may include an advanced peripheral bus (APB) interface, configuration circuitry, a controller, and a multiplexer. Any type of memory may be used. The PVA and DLA may access the memory via a backbone that provides the PVA and DLA with high-speed access to memory. The backbone may include a computer vision network on-chip that interconnects the PVA and the DLA to the memory (e.g., using the APB).

The computer vision network on-chip may include an interface that determines, before transmission of any control signal/address/data, that both the PVA and the DLA provide ready and valid signals. Such an interface may provide for separate phases and separate channels for transmitting control signals/addresses/data, as well as burst-type communications for continuous data transfer. This type of interface may comply with ISO 26262 or IEC 61508 standards, although other standards and protocols may be used.

In some examples, the SoC(s) 1204 may include a real-time ray-tracing hardware accelerator, such as described in U.S. patent application Ser. No. 16/101,232, filed on Aug. 10, 2018. The real-time ray-tracing hardware accelerator may be used to quickly and efficiently determine the positions and extents of objects (e.g., within a world model), to generate real-time visualization simulations, for RADAR signal interpretation, for sound propagation synthesis and/or analysis, for simulation of SONAR systems, for general wave propagation simulation, for comparison to LIDAR data for purposes of localization and/or other functions, and/or for other uses. In some embodiments, one or more tree traversal units (TTUs) may be used for executing one or more ray-tracing related operations.

The accelerator(s) 1214 (e.g., the hardware accelerator cluster) have a wide array of uses for autonomous driving. The PVA may be a programmable vision accelerator that may be used for key processing stages in ADAS and autonomous vehicles. The PVA's capabilities are a good match for algorithmic domains needing predictable processing, at low power and low latency. In other words, the PVA performs well on semi-dense or dense regular computation, even on small data sets, which need predictable run-times with low latency and low power. Thus, in the context of platforms for autonomous vehicles, the PVAs are designed to run classic computer vision algorithms, as they are efficient at object detection and operating on integer math.

For example, according to one embodiment of the technology, the PVA is used to perform computer stereo vision. A semi-global matching-based algorithm may be used in some examples, although this is not intended to be limiting. Many applications for Level 3-5 autonomous driving require motion estimation/stereo matching on-the-fly (e.g., structure from motion, pedestrian recognition, lane detection, etc.). The PVA may perform computer stereo vision function on inputs from two monocular cameras.

In some examples, the PVA may be used to perform dense optical flow. For example, the PVA may be used to process raw RADAR data (e.g., using a 4D Fast Fourier Transform) to provide a processed RADAR signal before emitting the next RADAR pulse. In other examples, the PVA is used for time of flight depth processing, by processing raw time of flight data to provide processed time of flight data, for example.

The DLA may be used to run any type of network to enhance control and driving safety, including, for example, a neural network that outputs a measure of confidence for each object detection. Such a confidence value may be interpreted as a probability, or as providing a relative "weight" of each detection compared to other detections. This confidence value enables the system to make further decisions regarding which detections should be considered as true positive detections rather than false positive detections. For example, the system may set a threshold value for the confidence and consider only the detections exceeding the threshold value as true positive detections. In an automatic emergency braking (AEB) system, false positive detections would cause the vehicle to automatically perform emergency braking, which is obviously undesirable. Therefore, only the most confident detections should be considered as triggers for AEB. The DLA may run a neural network for regressing the confidence value. The neural network may take as its input at least some subset of parameters, such as bounding box dimensions, ground plane estimate obtained (e.g. from another subsystem), inertial measurement unit (IMU) sensor 1266 output that correlates with the vehicle 1200 orientation, distance, 3D location estimates of the object obtained from the neural network and/or other sensors (e.g., LIDAR sensor(s) 1264 or RADAR sensor(s) 1260), among others.

The SoC(s) 1204 may include data store(s) 1216 (e.g., memory). The data store(s) 1216 may be on-chip memory of the SoC(s) 1204, which may store neural networks to be executed on the GPU and/or the DLA. In some examples, the data store(s) 1216 may be large enough in capacity to store multiple instances of neural networks for redundancy and safety. The data store(s) 1216 may include L2 or L3 cache(s) 1212. Reference to the data store(s) 1216 may include reference to the memory associated with the PVA, DLA, and/or other accelerator(s) 1214, as described herein.

The SoC(s) 1204 may include one or more processor(s) 1210 (e.g., embedded processors). The processor(s) 1210 may include a boot and power management processor that may be a dedicated processor and subsystem to handle boot power and management functions and related security enforcement. The boot and power management processor may be a part of the SoC(s) 1204 boot sequence and may provide runtime power management services. The boot power and management processor may provide clock and voltage programming, assistance in system low power state transitions, management of SoC(s) 1204 thermals and temperature sensors, and/or management of the SoC(s) 1204 power states. Each temperature sensor may be implemented as a ring-oscillator whose output frequency is proportional to temperature, and the SoC(s) 1204 may use the ring-oscillators to detect temperatures of the CPU(s) 1206, GPU(s) 1208, and/or accelerator(s) 1214. If temperatures are determined to exceed a threshold, the boot and power management processor may enter a temperature fault routine and put the SoC(s) 1204 into a lower power state and/or put the vehicle 1200 into a chauffeur to safe-stop mode (e.g., bring the vehicle 1200 to a safe stop).

The processor(s) 1210 may further include a set of embedded processors that may serve as an audio processing engine. The audio processing engine may be an audio subsystem that enables full hardware support for multi-channel audio over multiple interfaces, and a broad and flexible range of audio I/O interfaces. In some examples, the audio processing engine is a dedicated processor core with a digital signal processor with dedicated RAM.

The processor(s) 1210 may further include an always-on processor engine that may provide necessary hardware features to support low power sensor management and wake use cases. The always-on processor engine may include a processor core, a tightly coupled RAM, supporting peripherals (e.g., timers and interrupt controllers), various I/O controller peripherals, and routing logic.

The processor(s) 1210 may further include a safety cluster engine that includes a dedicated processor subsystem to handle safety management for automotive applications. The safety cluster engine may include two or more processor cores, a tightly coupled RAM, support peripherals (e.g., timers, an interrupt controller, etc.), and/or routing logic. In a safety mode, the two or more cores may operate in a lockstep mode and function as a single core with comparison logic to detect any differences between their operations.

The processor(s) 1210 may further include a real-time camera engine that may include a dedicated processor subsystem for handling real-time camera management.

The processor(s) 1210 may further include a high dynamic range signal processor that may include an image signal processor that is a hardware engine that is part of the camera processing pipeline.

The processor(s) 1210 may include a video image compositor that may be a processing block (e.g., implemented on a microprocessor) that implements video post-processing functions needed by a video playback application to produce the final image for the player window. The video image compositor may perform lens distortion correction on wide-view camera(s) 1270, surround camera(s) 1274, and/or on in-cabin monitoring camera sensors. An in-cabin monitoring camera sensor is preferably monitored by a neural network running on another instance of the advanced SoC, configured to identify in-cabin events and respond accordingly. An in-cabin system may perform lip reading to activate cellular service and place a phone call, dictate emails, change the vehicle's destination, activate or change the vehicle's infotainment system and settings, or provide voice-activated web surfing. Certain functions are available to the driver only when the vehicle is operating in an autonomous mode, and are disabled otherwise.

The video image compositor may include enhanced temporal noise reduction for both spatial and temporal noise reduction. For example, where motion occurs in a video, the noise reduction weights spatial information appropriately, decreasing the weight of information provided by adjacent frames. Where an image or portion of an image does not include motion, the temporal noise reduction performed by the video image compositor may use information from the previous image to reduce noise in the current image.

The video image compositor may also be configured to perform stereo rectification on input stereo lens frames. The video image compositor may further be used for user interface composition when the operating system desktop is in use, and the GPU(s) 1208 is not required to continuously render new surfaces. Even when the GPU(s) 1208 is powered on and actively performing 3D rendering, the video image compositor may be used to offload the GPU(s) 1208 to improve performance and responsiveness.

The SoC(s) 1204 may further include a mobile industry processor interface (MIPI) camera serial interface for receiving video and input from cameras, a high-speed interface, and/or a video input block that may be used for camera and related pixel input functions. The SoC(s) 1204 may further include an input/output controller(s) that may be controlled by software and may be used for receiving I/O signals that are uncommitted to a specific role.

The SoC(s) 1204 may further include a broad range of peripheral interfaces to enable communication with peripherals, audio codecs, power management, and/or other devices. The SoC(s) 1204 may be used to process data from cameras (e.g., connected over Gigabit Multimedia Serial Link and Ethernet), sensors (e.g., LIDAR sensor(s) 1264, RADAR sensor(s) 1260, etc. that may be connected over Ethernet), data from bus 1202 (e.g., speed of vehicle 1200, steering wheel position, etc.), data from GNSS sensor(s) 1258 (e.g., connected over Ethernet or CAN bus). The SoC(s) 1204 may further include dedicated high-performance mass storage controllers that may include their own DMA engines, and that may be used to free the CPU(s) 1206 from routine data management tasks.

The SoC(s) 1204 may be an end-to-end platform with a flexible architecture that spans automation levels 3-5, thereby providing a comprehensive functional safety architecture that leverages and makes efficient use of computer vision and ADAS techniques for diversity and redundancy, provides a platform for a flexible, reliable driving software stack, along with deep learning tools. The SoC(s) 1204 may be faster, more reliable, and even more energy-efficient and space-efficient than conventional systems. For example, the accelerator(s) 1214, when combined with the CPU(s) 1206, the GPU(s) 1208, and the data store(s) 1216, may provide for a fast, efficient platform for level 3-5 autonomous vehicles.

The technology thus provides capabilities and functionality that cannot be achieved by conventional systems. For example, computer vision algorithms may be executed on CPUs, which may be configured using high-level programming language, such as the C programming language, to execute a wide variety of processing algorithms across a wide variety of visual data. However, CPUs are oftentimes unable to meet the performance requirements of many computer vision applications, such as those related to execution time and power consumption, for example. In particular, many CPUs are unable to execute complex object detection algorithms in real-time, which is a requirement of in-vehicle ADAS applications, and a requirement for practical Level 3-5 autonomous vehicles.

In contrast to conventional systems, by providing a CPU complex, GPU complex, and a hardware acceleration cluster, the technology described herein allows for multiple neural networks to be performed simultaneously and/or sequentially, and for the results to be combined together to enable Level 3-5 autonomous driving functionality. For example, a CNN executing on the DLA or dGPU (e.g., the GPU(s) 1220) may include a text and word recognition, allowing the supercomputer to read and understand traffic signs, including signs for which the neural network has not been specifically trained. The DLA may further include a neural network that is able to identify, interpret, and provide semantic understanding of the sign, and to pass that semantic understanding to the path-planning modules running on the CPU Complex.

As another example, multiple neural networks may be run simultaneously, as is required for Level 3, 4, or 5 driving. For example, a warning sign consisting of "Caution: flashing lights indicate icy conditions," along with an electric light, may be independently or collectively interpreted by several neural networks. The sign itself may be identified as a traffic sign by a first deployed neural network (e.g., a neural network that has been trained), the text "Flashing lights indicate icy conditions" may be interpreted by a second deployed neural network, which informs the vehicle's path-planning software (preferably executing on the CPU Complex) that when flashing lights are detected, icy conditions exist. The flashing light may be identified by operating a third deployed neural network over multiple frames, informing the vehicle's path-planning software of the presence (or absence) of flashing lights. All three neural networks may run simultaneously, such as within the DLA and/or on the GPU(s) 1208.

In some examples, a CNN for facial recognition and vehicle owner identification may use data from camera sensors to identify the presence of an authorized driver and/or owner of the vehicle 1200. The always-on sensor processing engine may be used to unlock the vehicle when the owner approaches the driver door and turn on the lights, and, in security mode, to disable the vehicle when the owner leaves the vehicle. In this way, the SoC(s) 1204 provide for security against theft and/or carjacking.

In another example, a CNN for emergency vehicle detection and identification may use data from microphones 1296 to detect and identify emergency vehicle sirens. In contrast to conventional systems, which use general classifiers to detect sirens and manually extract features, the SoC(s) 1204 use the CNN for classifying environmental and urban sounds, as well as classifying visual data. In a preferred embodiment, the CNN running on the DLA is trained to identify the relative closing speed of the emergency vehicle (e.g., by using the Doppler Effect). The CNN may also be trained to identify emergency vehicles specific to the local area in which the vehicle is operating, as identified by GNSS sensor(s) 1258. Thus, for example, when operating in Europe the CNN will seek to detect European sirens, and when in the United States the CNN will seek to identify only North American sirens. Once an emergency vehicle is detected, a control program may be used to execute an emergency vehicle safety routine, slowing the vehicle, pulling over to the side of the road, parking the vehicle, and/or idling the vehicle, with the assistance of ultrasonic sensors 1262, until the emergency vehicle(s) passes.

The vehicle may include a CPU(s) 1218 (e.g., discrete CPU(s), or dCPU(s)), that may be coupled to the SoC(s) 1204 via a high-speed interconnect (e.g., PCIe). The CPU(s) 1218 may include an X86 processor, for example. The CPU(s) 1218 may be used to perform any of a variety of functions, including arbitrating potentially inconsistent results between ADAS sensors and the SoC(s) 1204, and/or monitoring the status and health of the controller(s) 1236 and/or infotainment SoC 1230, for example.

The vehicle 1200 may include a GPU(s) 1220 (e.g., discrete GPU(s), or dGPU(s)), that may be coupled to the SoC(s) 1204 via a high-speed interconnect (e.g., NVIDIA's NVLINK). The GPU(s) 1220 may provide additional artificial intelligence functionality, such as by executing redundant and/or different neural networks, and may be used to train and/or update neural networks based on input (e.g., sensor data) from sensors of the vehicle 1200.

The vehicle 1200 may further include the network interface 1224 which may include one or more wireless antennas 1226 (e.g., one or more wireless antennas for different communication protocols, such as a cellular antenna, a Bluetooth antenna, etc.). The network interface 1224 may be used to enable wireless connectivity over the Internet with the cloud (e.g., with the server(s) 1278 and/or other network devices), with other vehicles, and/or with computing devices (e.g., client devices of passengers). To communicate with other vehicles, a direct link may be established between the two vehicles and/or an indirect link may be established (e.g., across networks and over the Internet). Direct links may be provided using a vehicle-to-vehicle communication link. The vehicle-to-vehicle communication link may provide the vehicle 1200 information about vehicles in proximity to the vehicle 1200 (e.g., vehicles in front of, on the side of, and/or behind the vehicle 1200). This functionality may be part of a cooperative adaptive cruise control functionality of the vehicle 1200.

The network interface 1224 may include a SoC that provides modulation and demodulation functionality and enables the controller(s) 1236 to communicate over wireless networks. The network interface 1224 may include a radio frequency front-end for up-conversion from baseband to radio frequency, and down conversion from radio frequency to baseband. The frequency conversions may be performed through well-known processes, and/or may be performed using super-heterodyne processes. In some examples, the radio frequency front end functionality may be provided by a separate chip. The network interface may include wireless functionality for communicating over LTE, WCDMA, UMTS, GSM, CDMA2000, Bluetooth, Bluetooth LE, Wi-Fi, Z-Wave, ZigBee, LoRaWAN, and/or other wireless protocols.

The vehicle 1200 may further include data store(s) 1228, which may include off-chip (e.g., off the SoC(s) 1204) storage. The data store(s) 1228 may include one or more storage elements including RAM, SRAM, DRAM, VRAM, Flash, hard disks, and/or other components and/or devices that may store at least one bit of data.

The vehicle 1200 may further include GNSS sensor(s) 1258 (e.g., GPS and/or assisted GPS sensors), to assist in mapping, perception, occupancy grid generation, and/or path planning functions. Any number of GNSS sensor(s) 1258 may be used, including, for example and without limitation, a GPS using a USB connector with an Ethernet to serial (RS-232) bridge.

The vehicle 1200 may further include RADAR sensor(s) 1260. The RADAR sensor(s) 1260 may be used by the vehicle 1200 for long-range vehicle detection, even in darkness and/or severe weather conditions. RADAR functional safety levels may be ASIL B. The RADAR sensor(s) 1260 may use the CAN and/or the bus 1202 (e.g., to transmit data generated by the RADAR sensor(s) 1260) for control and to access object tracking data, with access to Ethernet to access raw data, in some examples. A wide variety of RADAR sensor types may be used. For example, and without limitation, the RADAR sensor(s) 1260 may be suitable for front, rear, and side RADAR use. In some example, Pulse Doppler RADAR sensor(s) are used.

The RADAR sensor(s) 1260 may include different configurations, such as long-range with narrow field of view, short-range with wide field of view, short-range side coverage, etc. In some examples, long-range RADAR may be used for adaptive cruise control functionality. The long-range RADAR systems may provide a broad field of view realized by two or more independent scans, such as within a 250 m range. The RADAR sensor(s) 1260 may help in distinguishing between static and moving objects, and may be used by ADAS systems for emergency brake assist and forward collision warning. Long-range RADAR sensors may include monostatic multimodal RADAR with multiple (e.g., six or more) fixed RADAR antennae and a high-speed CAN and FlexRay interface. In an example with six antennae, the central four antennae may create a focused beam pattern, designed to record the surrounding of the vehicle 1200 at higher speeds with minimal interference from traffic in adjacent lanes. The other two antennae may expand the field of view, making it possible to quickly detect vehicles entering or leaving the vehicle's 1200 lane.

Mid-range RADAR systems may include, as an example, a range of up to 1260 m (front) or 80 m (rear), and a field of view of up to 42 degrees (front) or 1250 degrees (rear). Short-range RADAR systems may include, without limitation, RADAR sensors designed to be installed at both ends of the rear bumper. When installed at both ends of the rear bumper, such a RADAR sensor system may create two beams that constantly monitor the blind spot in the rear and next to the vehicle.

Short-range RADAR systems may be used in an ADAS system for blind spot detection and/or lane change assist.

The vehicle 1200 may further include ultrasonic sensor(s) 1262. The ultrasonic sensor(s) 1262, which may be positioned at the front, back, and/or the sides of the vehicle 1200, may be used for park assist and/or to create and update an occupancy grid. A wide variety of ultrasonic sensor(s) 1262 may be used, and different ultrasonic sensor(s) 1262 may be used for different ranges of detection (e.g., 2.5 m, 4 m). The ultrasonic sensor(s) 1262 may operate at functional safety levels of ASIL B.

The vehicle 1200 may include LIDAR sensor(s) 1264. The LIDAR sensor(s) 1264 may be used for object and pedestrian detection, emergency braking, collision avoidance, and/or other functions. The LIDAR sensor(s) 1264 may be functional safety level ASIL B. In some examples, the vehicle 1200 may include multiple LIDAR sensors 1264 (e.g., two, four, six, etc.) that may use Ethernet (e.g., to provide data to a Gigabit Ethernet switch).

In some examples, the LIDAR sensor(s) 1264 may be capable of providing a list of objects and their distances for a 360-degree field of view. Commercially available LIDAR sensor(s) 1264 may have an advertised range of approximately 100 m, with an accuracy of 2 cm-3 cm, and with support for a 100 Mbps Ethernet connection, for example. In some examples, one or more non-protruding LIDAR sensors 1264 may be used. In such examples, the LIDAR sensor(s) 1264 may be implemented as a small device that may be embedded into the front, rear, sides, and/or corners of the vehicle 1200. The LIDAR sensor(s) 1264, in such examples, may provide up to a 120-degree horizontal and 35-degree vertical field-of-view, with a 200 m range even for low-reflectivity objects. Front-mounted LIDAR sensor(s) 1264 may be configured for a horizontal field of view between 45 degrees and 135 degrees.

In some examples, LIDAR technologies, such as 3D flash LIDAR, may also be used. 3D Flash LIDAR uses a flash of a laser as a transmission source, to illuminate vehicle surroundings up to approximately 200 m. A flash LIDAR unit includes a receptor, which records the laser pulse transit time and the reflected light on each pixel, which in turn corresponds to the range from the vehicle to the objects. Flash LIDAR may allow for highly accurate and distortion-free images of the surroundings to be generated with every laser flash. In some examples, four flash LIDAR sensors may be deployed, one at each side of the vehicle 1200. Available 3D flash LIDAR systems include a solid-state 3D staring array LIDAR camera with no moving parts other than a fan (e.g., a non-scanning LIDAR device). The flash LIDAR device may use a five nanosecond class I (eye-safe) laser pulse per frame and may capture the reflected laser light in the form of 3D range point clouds and co-registered intensity data. By using flash LIDAR, and because flash LIDAR is a solid-state device with no moving parts, the LIDAR sensor(s) 1264 may be less susceptible to motion blur, vibration, and/or shock.

The vehicle may further include IMU sensor(s) 1266. The IMU sensor(s) 1266 may be located at a center of the rear axle of the vehicle 1200, in some examples. The IMU sensor(s) 1266 may include, for example and without limitation, an accelerometer(s), a magnetometer(s), a gyroscope(s), a magnetic compass(es), and/or other sensor types. In some examples, such as in six-axis applications, the IMU sensor(s) 1266 may include accelerometers and gyroscopes, while in nine-axis applications, the IMU sensor(s) 1266 may include accelerometers, gyroscopes, and magnetometers.

In some embodiments, the IMU sensor(s) 1266 may be implemented as a miniature, high-performance GPS-Aided Inertial Navigation System (GPS/INS) that combines micro-electro-mechanical systems (MEMS) inertial sensors, a high-sensitivity GPS receiver, and advanced Kalman filtering algorithms to provide estimates of position, velocity, and attitude. As such, in some examples, the IMU sensor(s) 1266 may enable the vehicle 1200 to estimate heading without requiring input from a magnetic sensor by directly observing and correlating the changes in velocity from GPS to the IMU sensor(s) 1266. In some examples, the IMU sensor(s) 1266 and the GNSS sensor(s) 1258 may be combined in a single integrated unit.

The vehicle may include microphone(s) 1296 placed in and/or around the vehicle 1200. The microphone(s) 1296 may be used for emergency vehicle detection and identification, among other things.

The vehicle may further include any number of camera types, including stereo camera(s) 1268, wide-view camera(s) 1270, infrared camera(s) 1272, surround camera(s) 1274, long-range and/or mid-range camera(s) 1298, and/or other camera types. The cameras may be used to capture image data around an entire periphery of the vehicle 1200. The types of cameras used depends on the embodiments and requirements for the vehicle 1200, and any combination of camera types may be used to provide the necessary coverage around the vehicle 1200. In addition, the number of cameras may differ depending on the embodiment. For example, the vehicle may include six cameras, seven cameras, ten cameras, twelve cameras, and/or another number of cameras. The cameras may support, as an example and without limitation, Gigabit Multimedia Serial Link (GMSL) and/or Gigabit Ethernet. Each of the camera(s) is described with more detail herein with respect to FIG. 12 and FIG. 13.

The vehicle 1200 may further include vibration sensor(s) 1242. The vibration sensor(s) 1242 may measure vibrations of components of the vehicle, such as the axle(s). For example, changes in vibrations may indicate a change in road surfaces. In another example, when two or more vibration sensors 1242 are used, the differences between the vibrations may be used to determine friction or slippage of the road surface (e.g., when the difference in vibration is between a power-driven axle and a freely rotating axle).

The vehicle 1200 may include an ADAS system 1238. The ADAS system 1238 may include a SoC, in some examples. The ADAS system 1238 may include autonomous/adaptive/automatic cruise control (ACC), cooperative adaptive cruise control (CACC), forward crash warning (FCW), automatic emergency braking (AEB), lane departure warnings (LDW), lane keep assist (LKA), blind spot warning (BSW), rear cross-traffic warning (RCTW), collision warning systems (CWS), lane centering (LC), and/or other features and functionality.

The ACC systems may use RADAR sensor(s) 1260, LIDAR sensor(s) 1264, and/or a camera(s). The ACC systems may include longitudinal ACC and/or lateral ACC. Longitudinal ACC monitors and controls the distance to the vehicle immediately ahead of the vehicle 1200 and automatically adjusts the vehicle speed to maintain a safe distance from vehicles ahead. Lateral ACC performs distance keeping, and advises the vehicle 1200 to change lanes when necessary. Lateral ACC is related to other ADAS applications such as LC and CWS.

CACC uses information from other vehicles that may be received via the network interface 1224 and/or the wireless antenna(s) 1226 from other vehicles via a wireless link, or indirectly, over a network connection (e.g., over the Internet). Direct links may be provided by a vehicle-to-vehicle (V2V) communication link, while indirect links may be infrastructure-to-vehicle (I2V) communication links. In general, the V2V communication concept provides information about the immediately preceding vehicles (e.g., vehicles immediately ahead of and in the same lane as the vehicle 1200), while the I2V communication concept provides information about traffic farther ahead. CACC systems may include either or both I2V and V2V information sources. Given the information of the vehicles ahead of the vehicle 1200, CACC may be more reliable, and it has potential to improve traffic flow smoothness and reduce congestion on the road.

FCW systems are designed to alert the driver to a hazard, so that the driver may take corrective action. FCW systems use a front-facing camera and/or RADAR sensor(s) 1260, coupled to a dedicated processor, DSP, FPGA, and/or ASIC, that is electrically coupled to driver feedback, such as a display, speaker, and/or vibrating component. FCW systems may provide a warning, such as in the form of a sound, visual warning, vibration, and/or a quick brake pulse.

AEB systems detect an impending forward collision with another vehicle or other object, and may automatically apply the brakes if the driver does not take corrective action within a specified time or distance parameter. AEB systems may use front-facing camera(s) and/or RADAR sensor(s) 1260, coupled to a dedicated processor, DSP, FPGA, and/or ASIC. When the AEB system detects a hazard, it typically first alerts the driver to take corrective action to avoid the collision and, if the driver does not take corrective action, the AEB system may automatically apply the brakes in an effort to prevent, or at least mitigate, the impact of the predicted collision. AEB systems, may include techniques such as dynamic brake support and/or crash imminent braking.

LDW systems provide visual, audible, and/or tactile warnings, such as steering wheel or seat vibrations, to alert the driver when the vehicle 1200 crosses lane markings. An LDW system does not activate when the driver indicates an intentional lane departure, by activating a turn signal. LDW systems may use front-side facing cameras, coupled to a dedicated processor, DSP, FPGA, and/or ASIC, that is electrically coupled to driver feedback, such as a display, speaker, and/or vibrating component.

LKA systems are a variation of LDW systems. LKA systems provide steering input or braking to correct the vehicle 1200 if the vehicle 1200 starts to exit the lane.

BSW systems detect and warn the driver of vehicles in an automobile's blind spot. BSW systems may provide a visual, audible, and/or tactile alert to indicate that merging or changing lanes is unsafe. The system may provide an additional warning when the driver uses a turn signal. BSW systems may use rear-side facing camera(s) and/or RADAR sensor(s) 1260, coupled to a dedicated processor, DSP, FPGA, and/or ASIC, that is electrically coupled to driver feedback, such as a display, speaker, and/or vibrating component.

RCTW systems may provide visual, audible, and/or tactile notification when an object is detected outside the rear-camera range when the vehicle 1200 is backing up. Some RCTW systems include AEB to ensure that the vehicle brakes are applied to avoid a crash. RCTW systems may use one or more rear-facing RADAR sensor(s) 1260, coupled to a dedicated processor, DSP, FPGA, and/or ASIC, that is electrically coupled to driver feedback, such as a display, speaker, and/or vibrating component.

Conventional ADAS systems may be prone to false positive results, which may be annoying and distracting to a driver, but typically are not catastrophic, because the ADAS systems alert the driver and allow the driver to decide whether a safety condition truly exists and act accordingly. However, in an autonomous vehicle 1200, the vehicle 1200 itself must, in the case of conflicting results, decide whether to heed the result from a primary computer or a secondary computer (e.g., a first controller 1236 or a second controller 1236). For example, in some embodiments, the ADAS system 1238 may be a backup and/or secondary computer for providing perception information to a backup computer rationality module. The backup computer rationality monitor may run a redundant diverse software on hardware components to detect faults in perception and dynamic driving tasks. Outputs from the ADAS system 1238 may be provided to a supervisory MCU. If outputs from the primary computer and the secondary computer conflict, the supervisory MCU must determine how to reconcile the conflict to ensure safe operation.

In some examples, the primary computer may be configured to provide the supervisory MCU with a confidence score, indicating the primary computer's confidence in the chosen result. If the confidence score exceeds a threshold, the supervisory MCU may follow the primary computer's direction, regardless of whether the secondary computer provides a conflicting or inconsistent result. Where the confidence score does not meet the threshold, and where the primary and secondary computer indicate different results (e.g., the conflict), the supervisory MCU may arbitrate between the computers to determine the appropriate outcome.

The supervisory MCU may be configured to run a neural network(s) that is trained and configured to determine, based on outputs from the primary computer and the secondary computer, conditions under which the secondary computer provides false alarms. Thus, the neural network(s) in the supervisory MCU may learn when the secondary computer's output can be trusted, and when it cannot. For example, when the secondary computer is a RADAR-based FCW system, a neural network(s) in the supervisory MCU may learn when the FCW system is identifying metallic objects that are not, in fact, hazards, such as a drainage grate or manhole cover that triggers an alarm. Similarly, when the secondary computer is a camera-based LDW system, a neural network in the supervisory MCU may learn to override the LDW when bicyclists or pedestrians are present and a lane departure is, in fact, the safest maneuver. In embodiments that include a neural network(s) running on the supervisory MCU, the supervisory MCU may include at least one of a DLA or GPU suitable for running the neural network(s) with associated memory. In preferred embodiments, the supervisory MCU may include and/or be included as a component of the SoC(s) 1204.

In other examples, ADAS system 1238 may include a secondary computer that performs ADAS functionality using traditional rules of computer vision. As such, the secondary computer may use classic computer vision rules (if-then), and the presence of a neural network(s) in the supervisory MCU may improve reliability, safety, and performance. For example, the diverse implementation and intentional non-identity make the overall system more fault-tolerant, especially to faults caused by software (or software-hardware interface) functionality. For example, if there is a software bug or error in the software running on the primary computer, and the non-identical software code running on the secondary computer provides the same overall result, the supervisory MCU may have greater confidence that the overall result is correct, and the bug in software or hardware used by the primary computer is not causing material error.

In some examples, the output of the ADAS system 1238 may be fed into the primary computer's perception block and/or the primary computer's dynamic driving task block. For example, if the ADAS system 1238 indicates a forward crash warning due to an object immediately ahead, the perception block may use this information when identifying objects. In other examples, the secondary computer may have its own neural network that is trained and thus reduces the risk of false positives, as described herein.

The vehicle 1200 may further include the infotainment SoC 1230 (e.g., an in-vehicle infotainment system (IVI)). Although illustrated and described as a SoC, the infotainment system may not be a SoC, and may include two or more discrete components. The infotainment SoC 1230 may include a combination of hardware and software that may be used to provide audio (e.g., music, a personal digital assistant, navigational instructions, news, radio, etc.), video (e.g., TV, movies, streaming, etc.), phone (e.g., hands-free calling), network connectivity (e.g., LTE, Wi-Fi, etc.), and/or information services (e.g., navigation systems, rear-parking assistance, a radio data system, vehicle-related information such as fuel level, total distance covered, brake fuel level, oil level, door open/close, air filter information, etc.) to the vehicle 1200. For example, the infotainment SoC 1230 may include radios, disk players, navigation systems, video players, USB and Bluetooth connectivity, carputers, in-car entertainment, Wi-Fi, steering wheel audio controls, hands-free voice control, a heads-up display (HUD), an HMI display 1234, a telematics device, a control panel (e.g., for controlling and/or interacting with various components, features, and/or systems), and/or other components. The infotainment SoC 1230 may further be used to provide information (e.g., visual and/or audible) to a user(s) of the vehicle, such as information from the ADAS system 1238, autonomous driving information such as planned vehicle maneuvers, trajectories, surrounding environment information (e.g., intersection information, vehicle information, road information, etc.), and/or other information.

The infotainment SoC 1230 may include GPU functionality. The infotainment SoC 1230 may communicate over the bus 1202 (e.g., CAN bus, Ethernet, etc.) with other devices, systems, and/or components of the vehicle 1200. In some examples, the infotainment SoC 1230 may be coupled to a supervisory MCU such that the GPU of the infotainment system may perform some self-driving functions in the event that the primary controller(s) 1236 (e.g., the primary and/or backup computers of the vehicle 1200) fail. In such an example, the infotainment SoC 1230 may put the vehicle 1200 into a chauffeur to safe-stop mode, as described herein.

The vehicle 1200 may further include an instrument cluster 1232 (e.g., a digital dash, an electronic instrument cluster, a digital instrument panel, etc.). The instrument cluster 1232 may include a controller and/or supercomputer (e.g., a discrete controller or supercomputer). The instrument cluster 1232 may include a set of instrumentation such as a speedometer, fuel level, oil pressure, tachometer, odometer, turn indicators, gearshift position indicator, seat belt warning light(s), parking-brake warning light(s), engine-malfunction light(s), airbag (SRS) system information, lighting controls, safety system controls, navigation information, etc. In some examples, information may be displayed and/or shared among the infotainment SoC 1230 and the instrument cluster 1232. In other words, the instrument cluster 1232 may be included as part of the infotainment SoC 1230, or vice versa.

As mentioned above, in at least some embodiments, the automotive platform 100 (see FIG. 1) may be a component of the autonomous vehicle 1200. In such embodiments, the controller(s) 1236 include(s) the automotive SoC 104. For example, the automotive SoC 104 may be implemented as one of the SoC 1204.

Figure 15:
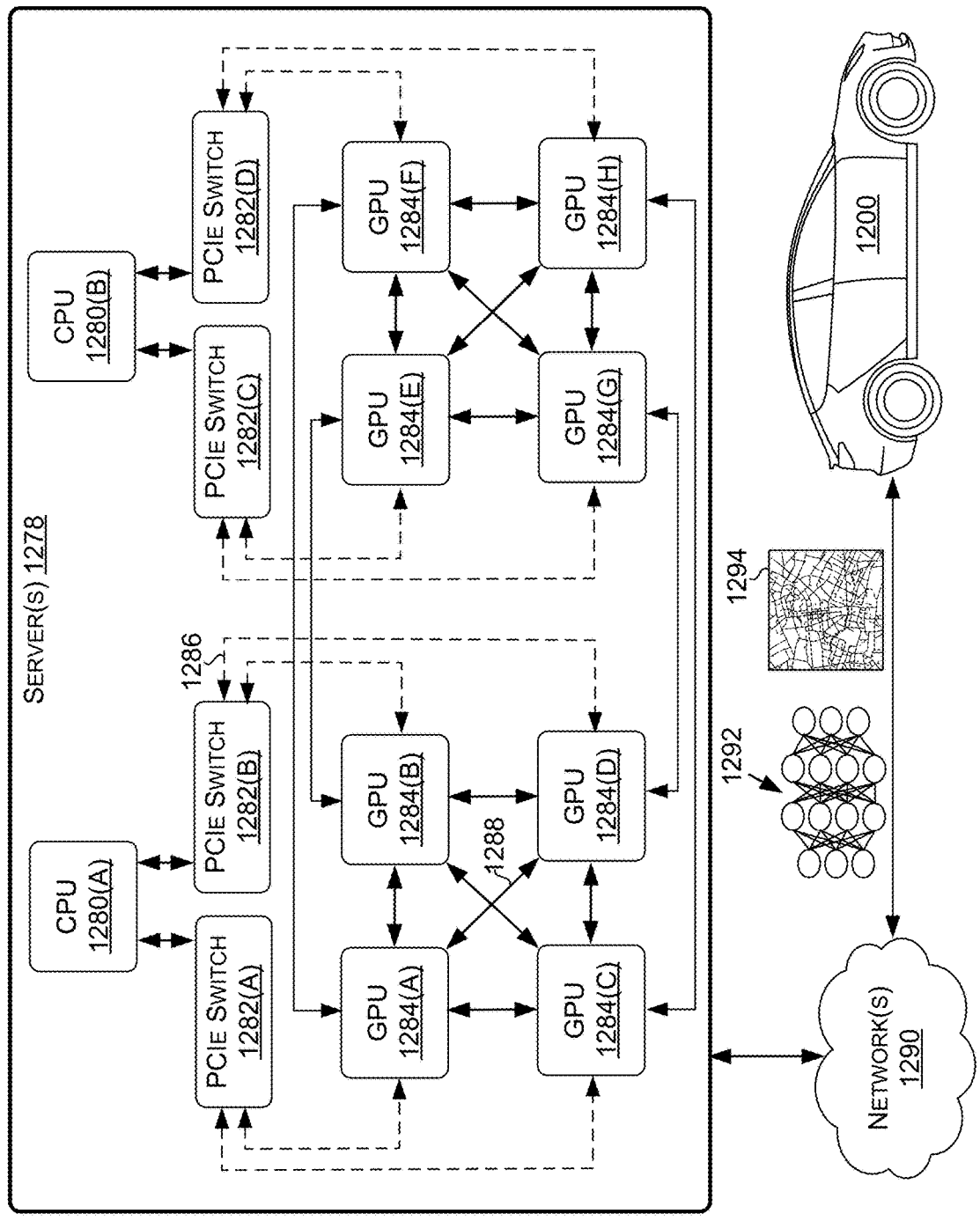
FIG. 15 is a system diagram for communication between cloud-based server(s) and the example autonomous vehicle of FIG. 12, in accordance with some embodiments of the present disclosure.

FIG. 15 is a system diagram for communication between cloud-based server(s) and the example autonomous vehicle 1200 of FIG. 12, in accordance with some embodiments of the present disclosure. The system 1276 may include server(s) 1278, network(s) 1290, and vehicles, including the vehicle 1200. The server(s) 1278 may include a plurality of GPUs 1284(A)-1284(H) (collectively referred to herein as GPUs 1284), PCIe switches 1282(A)-1282(H) (collectively referred to herein as PCIe switches 1282), and/or CPUs 1280(A)-1280(B) (collectively referred to herein as CPUs 1280). The GPUs 1284, the CPUs 1280, and the PCIe switches may be interconnected with high-speed interconnects such as, for example and without limitation, NVLink interfaces 1288 developed by NVIDIA and/or PCIe connections 1286. In some examples, the GPUs 1284 are connected via NVLink and/or NVSwitch SoC and the GPUs 1284 and the PCIe switches 1282 are connected via PCIe interconnects. Although eight GPUs 1284, two CPUs 1280, and two PCIe switches are illustrated, this is not intended to be limiting. Depending on the embodiment, each of the server(s) 1278 may include any number of GPUs 1284, CPUs 1280, and/or PCIe switches. For example, the server(s) 1278 may each include eight, sixteen, thirty-two, and/or more GPUs 1284.

The server(s) 1278 may receive, over the network(s) 1290 and from the vehicles, image data representative of images showing unexpected or changed road conditions, such as recently commenced roadwork. The server(s) 1278 may transmit, over the network(s) 1290 and to the vehicles, neural networks 1292, updated neural networks 1292, and/or map information 1294, including information regarding traffic and road conditions. The updates to the map information 1294 may include updates for the HD map 1222, such as information regarding construction sites, potholes, detours, flooding, and/or other obstructions. In some examples, the neural networks 1292, the updated neural networks 1292, and/or the map information 1294 may have resulted from new training and/or experiences represented in data received from any number of vehicles in the environment, and/or based on training performed at a datacenter (e.g., using the server(s) 1278 and/or other servers).

The server(s) 1278 may be used to train machine learning models (e.g., neural networks) based on training data. The training data may be generated by the vehicles, and/or may be generated in a simulation (e.g., using a game engine). In some examples, the training data is tagged (e.g., where the neural network benefits from supervised learning) and/or undergoes other pre-processing, while in other examples the training data is not tagged and/or pre-processed (e.g., where the neural network does not require supervised learning). Training may be executed according to any one or more classes of machine learning techniques, including, without limitation, classes such as: supervised training, semi-supervised training, unsupervised training, self-learning, reinforcement learning, federated learning, transfer learning, feature learning (including principal component and cluster analyses), multi-linear subspace learning, manifold learning, representation learning (including spare dictionary learning), rule-based machine learning, anomaly detection, and any variants or combinations therefor. Once the machine learning models are trained, the machine learning models may be used by the vehicles (e.g., transmitted to the vehicles over the network(s) 1290, and/or the machine learning models may be used by the server(s) 1278 to remotely monitor the vehicles.

In some examples, the server(s) 1278 may receive data from the vehicles and apply the data to up-to-date real-time neural networks for real-time intelligent inferencing. The server(s) 1278 may include deep-learning supercomputers and/or dedicated AI computers powered by GPU(s) 1284, such as a DGX and DGX Station machines developed by NVIDIA. However, in some examples, the server(s) 1278 may include deep learning infrastructure that use only CPU-powered datacenters.

The deep-learning infrastructure of the server(s) 1278 may be capable of fast, real-time inferencing, and may use that capability to evaluate and verify the health of the processors, software, and/or associated hardware in the vehicle 1200. For example, the deep-learning infrastructure may receive periodic updates from the vehicle 1200, such as a sequence of images and/or objects that the vehicle 1200 has located in that sequence of images (e.g., via computer vision and/or other machine learning object classification techniques). The deep-learning infrastructure may run its own neural network to identify the objects and compare them with the objects identified by the vehicle 1200 and, if the results do not match and the infrastructure concludes that the AI in the vehicle 1200 is malfunctioning, the server(s) 1278 may transmit a signal to the vehicle 1200 instructing a fail-safe computer of the vehicle 1200 to assume control, notify the passengers, and complete a safe parking maneuver.

For inferencing, the server(s) 1278 may include the GPU(s) 1284 and one or more programmable inference accelerators (e.g., NVIDIA's TensorRT). The combination of GPU-powered servers and inference acceleration may make real-time responsiveness possible. In other examples, such as where performance is less critical, servers powered by CPUs, FPGAs, and other processors may be used for inferencing.

Example Computing Device

Figure 16:
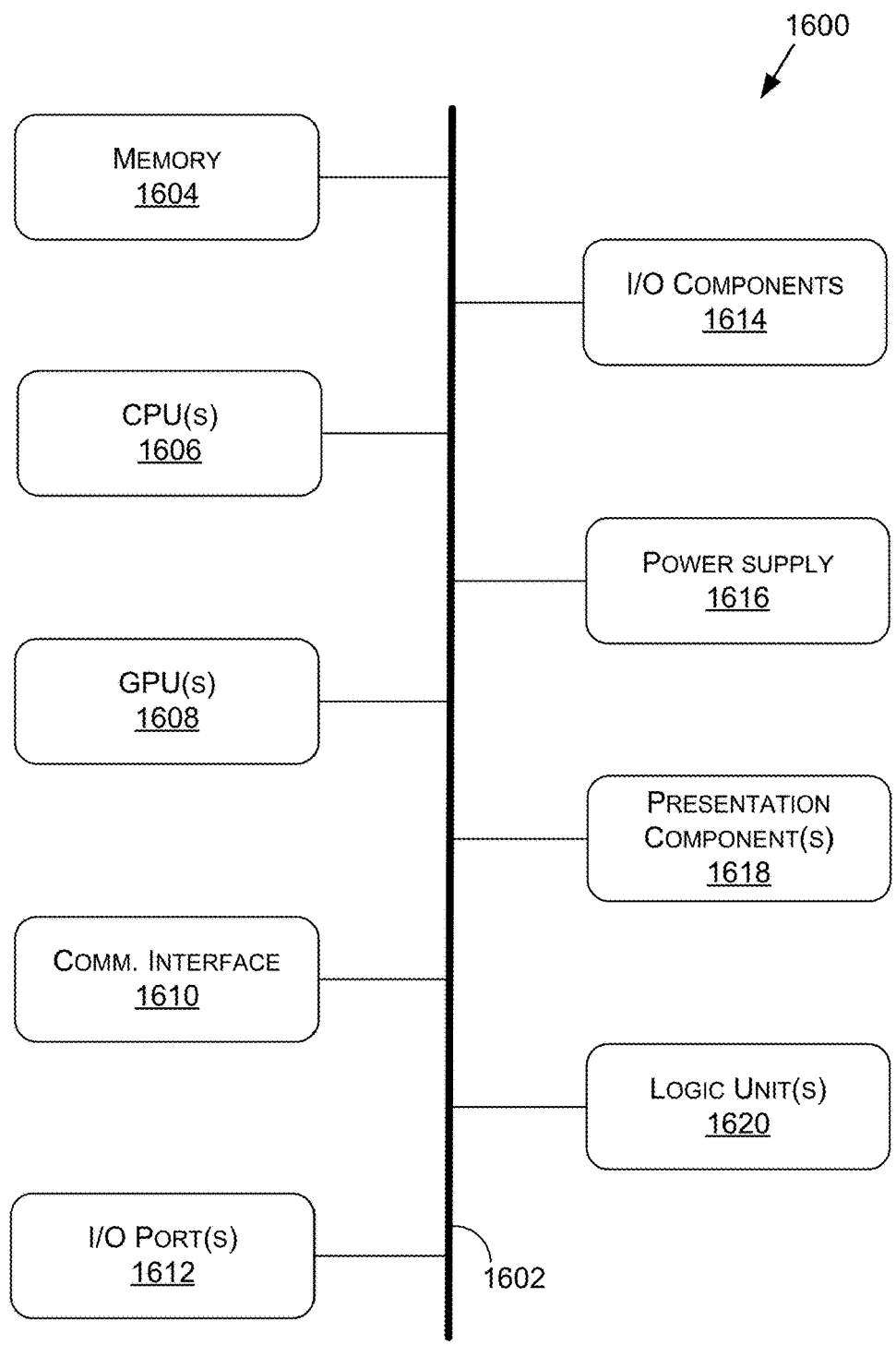
FIG. 16 is a block diagram of an example computing device suitable for use in implementing some embodiments of the present disclosure.

FIG. 16 is a block diagram of an example computing device(s) 1600 suitable for use in implementing some embodiments of the present disclosure. Computing device 1600 may include an interconnect system 1602 that directly or indirectly couples the following devices: memory 1604, one or more central processing units (CPUs) 1606, one or more graphics processing units (GPUs) 1608, a communication interface 1610, I/O ports 1612, input/output components 1614, a power supply 1616, one or more presentation components 1618 (e.g., display(s)), and one or more logic units 1620.

Although the various blocks of FIG. 16 are shown as connected via the interconnect system 1602 with lines, this is not intended to be limiting and is for clarity only. For example, in some embodiments, a presentation component 1618, such as a display device, may be considered an I/O component 1614 (e.g., if the display is a touch screen). As another example, the CPUs 1606 and/or GPUs 1608 may include memory (e.g., the memory 1604 may be representative of a storage device in addition to the memory of the GPUs 1608, the CPUs 1606, and/or other components). In other words, the computing device of FIG. 16 is merely illustrative. Distinction is not made between such categories as "workstation," "server," "laptop," "desktop," "tablet," "client device," "mobile device," "hand-held device," "game console," "electronic control unit (ECU)," "virtual reality system," "augmented reality system," and/or other device or system types, as all are contemplated within the scope of the computing device of FIG. 16.

The interconnect system 1602 may represent one or more links or busses, such as an address bus, a data bus, a control bus, or a combination thereof. The interconnect system 1602 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus or link. In some embodiments, there are direct connections between components. As an example, the CPU 1606 may be directly connected to the memory 1604. Further, the CPU 1606 may be directly connected to the GPU 1608. Where there is direct, or point-to-point, connection between components, the interconnect system 1602 may include a PCIe link to carry out the connection. In these examples, a PCI bus need not be included in the computing device 1600.

The memory 1604 may include any of a variety of computer-readable media. The computer-readable media may be any available media that may be accessed by the computing device 1600. The computer-readable media may include both volatile and nonvolatile media, and removable and non-removable media. By way of example, and not limitation, the computer-readable media may include computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 1604 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that may be used to store the desired information and that may be accessed by computing device 1600. As used herein, computer storage media does not include signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

The CPU(s) 1606 may be configured to execute at least some of the computer-readable instructions to control one or more components of the computing device 1600 to perform one or more of the methods and/or processes described herein. The CPU(s) 1606 may each include one or more cores (e.g., one, two, four, eight, twenty-eight, seventy-two, etc.) that are capable of handling a multitude of software threads simultaneously. The CPU(s) 1606 may include any type of processor, and may include different types of processors depending on the type of computing device 1600 implemented (e.g., processors with fewer cores for mobile devices and processors with more cores for servers). For example, depending on the type of computing device 1600, the processor may be an Advanced RISC Machines (ARM) processor implemented using Reduced Instruction Set Computing (RISC) or an x86 processor implemented using Complex Instruction Set Computing (CISC). The computing device 1600 may include one or more CPUs 1606 in addition to one or more microprocessors or supplementary co-processors, such as math co-processors.

In addition to or alternatively from the CPU(s) 1606, the GPU(s) 1608 may be configured to execute at least some of the computer-readable instructions to control one or more components of the computing device 1600 to perform one or more of the methods and/or processes described herein. One or more of the GPU(s) 1608 may be an integrated GPU (e.g., with one or more of the CPU(s) 1606 and/or one or more of the GPU(s) 1608 may be a discrete GPU. In embodiments, one or more of the GPU(s) 1608 may be a coprocessor of one or more of the CPU(s) 1606. The GPU(s) 1608 may be used by the computing device 1600 to render graphics (e.g., 3D graphics) or perform general purpose computations. For example, the GPU(s) 1608 may be used for General-Purpose computing on GPUs (GPGPU). The GPU(s) 1608 may include hundreds or thousands of cores that are capable of handling hundreds or thousands of software threads simultaneously. The GPU(s) 1608 may generate pixel data for output images in response to rendering commands (e.g., rendering commands from the CPU(s) 1606 received via a host interface). The GPU(s) 1608 may include graphics memory, such as display memory, for storing pixel data or any other suitable data, such as GPGPU data. The display memory may be included as part of the memory 1604. The GPU(s) 1608 may include two or more GPUs operating in parallel (e.g., via a link). The link may directly connect the GPUs (e.g., using NVLINK) or may connect the GPUs through a switch (e.g., using NVSwitch). When combined together, each GPU 1608 may generate pixel data or GPGPU data for different portions of an output or for different outputs (e.g., a first GPU for a first image and a second GPU for a second image). Each GPU may include its own memory, or may share memory with other GPUs.

In addition to or alternatively from the CPU(s) 1606 and/or the GPU(s) 1608, the logic unit(s) 1620 may be configured to execute at least some of the computer-readable instructions to control one or more components of the computing device 1600 to perform one or more of the methods and/or processes described herein. In embodiments, the CPU(s) 1606, the GPU(s) 1608, and/or the logic unit(s) 1620 may discretely or jointly perform any combination of the methods, processes, and/or portions thereof. One or more of the logic units 1620 may be part of and/or integrated in one or more of the CPU(s) 1606 and/or the GPU(s) 1608 and/or one or more of the logic units 1620 may be discrete components or otherwise external to the CPU(s) 1606 and/or the GPU(s) 1608. In embodiments, one or more of the logic units 1620 may be a coprocessor of one or more of the CPU(s) 1606 and/or one or more of the GPU(s) 1608.

Examples of the logic unit(s) 1620 include one or more processing cores and/or components thereof, such as Tensor Cores (TCs), Tensor Processing Units (TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), I/O elements, peripheral component interconnect (PCI) or peripheral component interconnect express (PCIe) elements, and/or the like.

The communication interface 1610 may include one or more receivers, transmitters, and/or transceivers that enable the computing device 1600 to communicate with other computing devices via an electronic communication network, including wired and/or wireless communications. The communication interface 1610 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet.

The I/O ports 1612 may enable the computing device 1600 to be logically coupled to other devices including the I/O components 1614, the presentation component(s) 1618, and/or other components, some of which may be built into (e.g., integrated in) the computing device 1600. Illustrative I/O components 1614 include a microphone, mouse, keyboard, joystick, game pad, game controller, satellite dish, scanner, printer, wireless device, etc. The I/O components 1614 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 1600. The computing device 1600 may include depth cameras, such as stereoscopic camera systems, infrared camera systems, RGB camera systems, touchscreen technology, and combinations of these, for gesture detection and recognition. Additionally, the computing device 1600 may include accelerometers or gyroscopes (e.g., as part of an inertia measurement unit (IMU)) that enable detection of motion. In some examples, the output of the accelerometers or gyroscopes may be used by the computing device 1600 to render immersive augmented reality or virtual reality.

The power supply 1616 may include a hard-wired power supply, a battery power supply, or a combination thereof. The power supply 1616 may provide power to the computing device 1600 to enable the components of the computing device 1600 to operate.

The presentation component(s) 1618 may include a display (e.g., a monitor, a touch screen, a television screen, a heads-up-display (HUD), other display types, or a combination thereof), speakers, and/or other presentation components. The presentation component(s) 1618 may receive data from other components (e.g., the GPU(s) 1608, the CPU(s) 1606, etc.), and output the data (e.g., as an image, video, sound, etc.).

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to codes that perform particular tasks or implement particular abstract data types. The disclosure may be practiced in a variety of system configurations, including hand-held devices, consumer electronics, general-purpose computers, more specialty computing devices, etc. The disclosure may also be practiced in distributed computing environments where tasks are performed by remote-processing devices that are linked through a communications network.

At least one embodiment of the disclosure can be described in view of the following clauses:

1. A system comprising: a memory operating in compliance with a first risk classification level; and circuitry operating in compliance with a second risk classification level that indicates a higher risk classification than the first risk classification level, the circuitry to determine an error detection code for data to be written to a first memory address within the memory, determine a second memory address within the memory based at least in part on the first memory address, and cause the data to be stored in the first memory address and the error detection code to be stored in the second memory address.

2. The system of clause 1, wherein after the data is stored in the first memory address and the error detection code is stored in the second memory address: the circuitry is to obtain the data from the first memory address, obtain the error detection code from the second memory address, generate a check code based on the first memory address and the data obtained from the first memory address, and generate a notification when the error detection code indicates the data contains at least one error.

3. The system of clause 2, wherein the error detection code indicates the data contains the at least one error when the error detection code does not match the check code.

4. The system of clauses 2 or 3, wherein the circuitry is to obtain the data from the first memory address during a first memory access, and obtain the error detection code from the second memory address during a second memory access.

5. The system of any one of the clauses 2-4, further comprising: a first interface over which the data is obtained from the first memory address; and a second interface over which the error detection code is obtained from the second memory address in parallel with the first interface obtaining the data, the first interface being different from the second interface.

6. The system of clause 4, wherein the circuitry introduces a time delay between the first and second memory accesses.

7. The system of any one of the clauses 1-6, wherein the memory comprises a first subsection and a second subsection, the first subsection comprises the first memory address, the second subsection comprises the second memory address, and the circuitry is to write a new error detection code to each memory address in the second subsection during a boot procedure.

8. The system of any one of the clauses 1-7, wherein the circuitry is to determine the error detection code based on the first memory address and the data before the data is written to a first memory address.

9. The system of any one of the clauses 1-8, wherein the circuitry comprises first and second blocks, the first block is to transmit a write request comprising the data and the first memory address to the second block, the second block is to receive the write request, determine the error detection code, determine the second memory address, and cause the data to be stored in the first memory address and the error detection code to be stored in the second memory address.

10. The system of clause 9, wherein the first block comprises a write timer that starts when the first block transmits the write request to the second block, and the first block is to generate a write error when the write timer indicates more than a predetermined amount of time has elapsed before the first block receives a response from the memory.

11. The system of clauses 9 or 10, wherein after the first block sends the write request: the first block is to send a read request to the second block for the data stored in the first memory address, and the second block is to receive the read request, obtain the data from the first memory address, obtain the error detection code from the second memory address, and transmit a notification to the first block when the second block determines the error detection code indicates the data contains the at least one error.

12. The system of clause 11, wherein the first block comprises a read timer that starts when the first block sends the read request, and the first block is to generate a read error when the read timer indicates more than a predetermined amount of time has elapsed before the first block receives the data.

13. The system of any one of the clauses 1-12, wherein the circuitry is to cause the data to be stored in the first memory address during a first memory access, and the error detection code to be stored in the second memory address during a second memory access.

14. The system of clause 13, wherein the circuitry introduces a first time delay between the first and second memory accesses.

15. The system of any one of the clauses 1-14 residing on a contiguous piece of semiconductor material.

16. The system of clause 15 implementing a portion of a System on a Chip ("SoC") corresponding to an automotive vehicle.

17. The system of any one of the clauses 1-16, wherein the first and second risk classification levels are each an Automotive Safety Integrity Level ("ASIL").

18. The system of any one of the clauses 1-17, wherein the error detection code is a cyclic redundancy check code or an error correction code.

19. A system comprising: a memory to operate within a first risk classification level, the memory comprising an isolated memory region comprising a first memory address storing data and a second memory address storing an error detection code; and circuitry to operate within a second risk classification level that indicates a higher level of risk than the first risk classification level, the circuitry to obtain the data from the first memory address, obtain the error detection code from the second memory address, and generate a notification when the error detection code indicates the data contains at least one error.

20. The system of clause 19, wherein the circuitry is to generate a check code based on the first memory address and the data obtained from the first memory address, the error detection code indicating the data contains the at least one error when the error detection code does not match the check code.

21. The system of clauses 19 or 20, wherein the circuitry comprises first and second blocks, the first block is to send a read request for the data stored in the first memory address to the second block, and the second block is to receive the read request, obtain the data, obtain the error detection code, and generate the notification when the error detection code indicates the data contains the at least one error.

22. The system of clause 21, wherein the first block comprises a read timer that starts when the first block sends the read request, and the first block is to generate an error when the read timer indicates more than a predetermined amount of time has elapsed before the first block receives the data.

23. The system of clauses 21 or 22, wherein before the first block sends the read request: the first block is to transmit the data and the first memory address to the second block, and the second block is to determine the error detection code, determine the second memory address, cause the data to be stored in the first memory address, and cause the error detection code to be stored in the second memory address.

24. The system of clause 23, wherein the first block comprises a write timer that starts when the first block transmits the data and the first memory address to the second block, and the first block is to generate a write error when the write timer indicates more than a first predetermined amount of time has elapsed before the first block receives a response from the memory.

25. The system of clause 24, wherein the first block comprises a read timer that starts when the first block sends the read request, and the first block is to generate a read error when the read timer indicates more than a second predetermined amount of time has elapsed before the first block receives the data from the memory.

26. The system of any one of the clauses 19-25, wherein the circuitry is to obtain the data from the first memory address during a first memory access, and obtain the error detection code from the second memory address during a second memory access.

27. The system of clause 26, wherein the circuitry introduces a time delay between the first and second memory accesses.

28. The system of any one of the clauses 19-27, wherein the circuitry wrote the error detection code to the second memory address during a boot procedure.

29. The system of any one of the clauses 19-28 residing on a contiguous piece of semiconductor material.

30. The system of clause 29 implementing a portion of a System on a Chip ("SoC") corresponding to an automotive vehicle.

31. The system of any one of the clauses 19-30, wherein the first and second risk classification levels are each an Automotive Safety Integrity Level ("ASIL").

32. The system of any one of the clauses 19-31, wherein the error detection code is a cyclic redundancy check code or an error correction code.

33. A method performed by circuitry operating at a first risk classification level, the method comprising: determining an error detection code for data to be written to a first memory address within a memory operating at a second risk classification level that indicates a lower level of risk than the first risk classification level; determining a second memory address within the memory based at least in part on the first memory address; and causing the data to be stored in the first memory address and the error detection code to be stored in the second memory address.

34. The method of clause 33, further comprising: obtaining the data from the first memory address after the data was stored in the first memory address; obtaining the error detection code from the second memory address after the error detection code was stored in the second memory address; generating a check code based on the first memory address and the data obtained from the first memory address; and generating a notification when the check code indicates the data contains at least one error.

35. The method of clause 34, wherein the error detection code was generated based on the first memory address and the data before the data was stored in the first memory address, and the check code indicates the data contains the at least one error when the check code does not match the error detection code.

36. The method of any one of the clauses 33-35, wherein the memory comprises a first subsection and a second subsection, the first subsection comprises the first memory address, the second subsection comprises the second memory address, and the method further comprises: writing a new error detection code to each memory address in the second subsection during a boot procedure.

37. A method performed by circuitry operating at a first risk classification level, the method comprising: obtaining data from a first memory address of a memory operating at a second risk classification level that indicates a lower level of risk than the first risk classification level; determining a second memory address within the memory based at least in part on the first memory address; obtaining an error detection code from the second memory address; and generating a notification when the error detection code indicates the data contains at least one error.

38. The method of clause 37, further comprising: generating a check code based on the first memory address and the data obtained from the first memory address; and determining whether the check code matches the error detection code, the error detection code indicating the data contains the at least one error when the error detection code does not match the check code.

39. The method of clauses 37 or 38, wherein the circuitry obtains the data from the first memory address during a first memory access, the circuitry obtains the error detection code from the second memory address during a second memory access, and the method further comprises: introducing a time delay between the first and second memory accesses.

40. The method of any one of the clauses 37-39, wherein the circuitry comprises first and second blocks, and the method further comprises: sending, by the first block, a read request to the second block for the data stored in the first memory address; and receiving, by the second block, the read request, the second block obtaining the data, obtaining the error detection code, and generating the notification when the error detection code indicates the data contains the at least one error.

41. The method of clause 40, wherein a read timer starts when the first block sends the read request, and the method further comprises: generating, by the first block, a read error when the read timer indicates more than a predetermined amount of time has elapsed before the first block receives the data.

42. The method of clauses 40 or 41, further comprising: transmitting, by the first block, a write request to the second block before the first block sends the read request, the write request comprising the data and the first memory address; determining, by the second block, the error detection code before the first block sends the read request; determining, by the second block, the second memory address before the first block sends the read request; and causing, by the second block, the data to be stored in the first memory address and the error detection code to be stored in the second memory before the first block sends the read request.

43. The method of clause 42, wherein a write timer starts when the first block sends the write request, and the method further comprises: generating, by the first block, a write error when the write timer indicates more than a first predetermined amount of time has elapsed before the first block receives a response from the memory.

44. The method of clause 43, wherein a read timer starts when the first block sends the read request, and the method further comprises: generating, by the first block, a read error when the read timer indicates more than a second predetermined amount of time has elapsed before the first block receives the data.

45. The method of any one of the clauses 42-44, wherein the second block causes the data to be stored in the first memory address during a first memory access, the second block causes the error detection code to be stored in the second memory address during a second memory access, and the method further comprises: introducing a time delay between the first and second memory accesses.

46. The method of any one of the clauses 37-45, further comprising: writing the error detection code to the second memory address during a boot procedure.

47. The method of any one of the clauses 37-46, wherein the first and second risk classification levels are each an Automotive Safety Integrity Level ("ASIL").

48. The method of any one of the clauses 37-47, wherein the error detection code is a cyclic redundancy check code or an error correction code.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. In at least one embodiment, use of term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). In at least one embodiment, a number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium. In at least one embodiment, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause computer system to perform operations described herein. A set of non-transitory computer-readable storage media, in at least one embodiment, comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors—in at least one embodiment, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, in at least one embodiment, software and/or hardware entities that perform work over time, such as tasks, threads, and intelligent agents. Also, each process may refer to multiple processes, for carrying out instructions in sequence or in parallel, continuously or intermittently. Terms "system" and "method" are used herein interchangeably insofar as system may embody one or more methods and methods may be considered a system.

In at least one embodiment, an arithmetic logic unit is a set of combinational logic circuitry that takes one or more inputs to produce a result. In at least one embodiment, an arithmetic logic unit is used by a processor to implement mathematical operation such as addition, subtraction, or multiplication. In at least one embodiment, an arithmetic logic unit is used to implement logical operations such as logical AND/OR or XOR. In at least one embodiment, an arithmetic logic unit is stateless, and made from physical switching components such as semiconductor transistors arranged to form logical gates. In at least one embodiment, an arithmetic logic unit may operate internally as a stateful logic circuit with an associated clock. In at least one embodiment, an arithmetic logic unit may be constructed as an asynchronous logic circuit with an internal state not maintained in an associated register set. In at least one embodiment, an arithmetic logic unit is used by a processor to combine operands stored in one or more registers of the processor and produce an output that can be stored by the processor in another register or a memory location.

In at least one embodiment, as a result of processing an instruction retrieved by the processor, the processor presents one or more inputs or operands to an arithmetic logic unit, causing the arithmetic logic unit to produce a result based at least in part on an instruction code provided to inputs of the arithmetic logic unit. In at least one embodiment, the instruction codes provided by the processor to the ALU are based at least in part on the instruction executed by the processor. In at least one embodiment combinational logic in the ALU processes the inputs and produces an output which is placed on a bus within the processor. In at least one embodiment, the processor selects a destination register, memory location, output device, or output storage location on the output bus so that clocking the processor causes the results produced by the ALU to be sent to the desired location.

In present document, references may be made to obtaining, acquiring, receiving, or inputting analog or digital data into a subsystem, computer system, or computer-implemented machine. In at least one embodiment, process of obtaining, acquiring, receiving, or inputting analog and digital data can be accomplished in a variety of ways such as by receiving data as a parameter of a function call or a call to an application programming interface. In some implementations, process of obtaining, acquiring, receiving, or inputting analog or digital data can be accomplished by transferring data via a serial or parallel interface. In another implementation, process of obtaining, acquiring, receiving, or inputting analog or digital data can be accomplished by transferring data via a computer network from providing entity to acquiring entity. References may also be made to providing, outputting, transmitting, sending, or presenting analog or digital data. In various examples, process of providing, outputting, transmitting, sending, or presenting analog or digital data can be accomplished by transferring data as an input or output parameter of a function call, a parameter of an application programming interface or interprocess communication mechanism.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

What is claimed is:

1. A system comprising:
 a memory operating in compliance with a first risk classification level; and
 circuitry operating in compliance with a second risk classification level that indicates a higher risk classification than the first risk classification level, the circuitry to determine an error detection code for data to be written to a first memory address within the memory, determine a second memory address within the memory based at least in part on the first memory address, and cause the data to be stored in the first memory address and the error detection code to be stored in the second memory address.

2. The system of claim 1, wherein after the data is stored in the first memory address and the error detection code is stored in the second memory address:
 the circuitry is to obtain the data from the first memory address, obtain the error detection code from the second memory address, generate a check code based on the first memory address and the data obtained from the first memory address, and generate a notification when the error detection code indicates the data contains at least one error.

3. The system of claim 2, wherein the error detection code indicates the data contains the at least one error when the error detection code does not match the check code.

4. The system of claim 2, wherein the circuitry is to obtain the data from the first memory address during a first memory access, and obtain the error detection code from the second memory address during a second memory access.

5. The system of claim 2, further comprising:
a first interface over which the data is obtained from the first memory address; and
a second interface over which the error detection code is obtained from the second memory address in parallel with the first interface obtaining the data, the first interface being different from the second interface.

6. The system of claim 4, wherein the circuitry introduces a time delay between the first and second memory accesses.

7. The system of claim 1, wherein the memory comprises a first subsection and a second subsection,
the first subsection comprises the first memory address,
the second subsection comprises the second memory address, and
the circuitry is to write a new error detection code to each memory address in the second subsection during a boot procedure.

8. The system of claim 1, wherein the circuitry is to determine the error detection code based on the first memory address and the data before the data is written to a first memory address.

9. The system of claim 1, wherein the circuitry comprises first and second blocks,
the first block is to transmit a write request comprising the data and the first memory address to the second block,
the second block is to receive the write request, determine the error detection code, determine the second memory address, and cause the data to be stored in the first memory address and the error detection code to be stored in the second memory address.

10. The system of claim 9, wherein the first block comprises a write timer that starts when the first block transmits the write request to the second block, and
the first block is to generate a write error when the write timer indicates more than a predetermined amount of time has elapsed before the first block receives a response from the memory.

11. The system of claim 9, wherein after the first block sends the write request:
the first block is to send a read request to the second block for the data stored in the first memory address, and
the second block is to receive the read request, obtain the data from the first memory address, obtain the error detection code from the second memory address, and transmit a notification to the first block when the second block determines the error detection code indicates the data contains at least one error.

12. The system of claim 11, wherein the first block comprises a read timer that starts when the first block sends the read request, and
the first block is to generate a read error when the read timer indicates more than a predetermined amount of time has elapsed before the first block receives the data.

13. The system of claim 1, wherein the circuitry is to cause the data to be stored in the first memory address during a first memory access, and the error detection code to be stored in the second memory address during a second memory access.

14. The system of claim 13, wherein the circuitry introduces a first time delay between the first and second memory accesses.

15. The system of claim 1 residing on a contiguous piece of semiconductor material.

16. The system of claim 15 implementing a portion of a System on a Chip ("SoC") corresponding to an automotive vehicle.

17. The system of claim 1, wherein the first and second risk classification levels are each an Automotive Safety Integrity Level ("ASIL").

18. The system of claim 1, wherein the error detection code is a cyclic redundancy check code or an error correction code.

19. A system comprising:
a memory to operate within a first risk classification level, the memory comprising an isolated memory region comprising a first memory address storing data and a second memory address storing an error detection code; and
circuitry to operate within a second risk classification level that indicates a higher level of risk than the first risk classification level, the circuitry to obtain the data from the first memory address, obtain the error detection code from the second memory address, and generate a notification when the error detection code indicates the data contains at least one error.

20. The system of claim 19, wherein the circuitry is to generate a check code based on the first memory address and the data obtained from the first memory address, the error detection code indicating the data contains the at least one error when the error detection code does not match the check code.

21. The system of claim 19, wherein the circuitry comprises first and second blocks,
the first block is to send a read request for the data stored in the first memory address to the second block, and
the second block is to receive the read request, obtain the data, obtain the error detection code, and generate the notification when the error detection code indicates the data contains the at least one error.

22. The system of claim 21, wherein the first block comprises a read timer that starts when the first block sends the read request, and the first block is to generate an error when the read timer indicates more than a predetermined amount of time has elapsed before the first block receives the data.

23. The system of claim 21, wherein before the first block sends the read request:
the first block is to transmit the data and the first memory address to the second block, and
the second block is to determine the error detection code, determine the second memory address, cause the data to be stored in the first memory address, and cause the error detection code to be stored in the second memory address.

24. The system of claim 23, wherein the first block comprises a write timer that starts when the first block transmits the data and the first memory address to the second block, and
the first block is to generate a write error when the write timer indicates more than a first predetermined amount of time has elapsed before the first block receives a response from the memory.

25. The system of claim 24, wherein the first block comprises a read timer that starts when the first block sends the read request, and the first block is to generate a read error when the read timer indicates more than a second predetermined amount of time has elapsed before the first block receives the data from the memory.

26. The system of claim 19, wherein the circuitry is to obtain the data from the first memory address during a first memory access, and obtain the error detection code from the second memory address during a second memory access.

27. The system of claim 26, wherein the circuitry introduces a time delay between the first and second memory accesses.

28. The system of claim 19, wherein the circuitry wrote the error detection code to the second memory address during a boot procedure.

29. The system of claim 19 residing on a contiguous piece of semiconductor material.

30. The system of claim 29 implementing a portion of a System on a Chip ("SoC") corresponding to an automotive vehicle.

31. The system of claim 19, wherein the first and second risk classification levels are each an Automotive Safety Integrity Level ("ASIL").

32. The system of claim 19, wherein the error detection code is a cyclic redundancy check code or an error correction code.

33. A method performed by circuitry operating at a first risk classification level, the method comprising:
   determining an error detection code for data to be written to a first memory address within a memory operating at a second risk classification level that indicates a lower level of risk than the first risk classification level;
   determining a second memory address within the memory based at least in part on the first memory address; and
   causing the data to be stored in the first memory address and the error detection code to be stored in the second memory address.

34. The method of claim 33, further comprising:
   obtaining the data from the first memory address after the data was stored in the first memory address;
   obtaining the error detection code from the second memory address after the error detection code was stored in the second memory address;
   generating a check code based on the first memory address and the data obtained from the first memory address; and
   generating a notification when the check code indicates the data contains at least one error.

35. The method of claim 34, wherein the error detection code was generated based on the first memory address and the data before the data was stored in the first memory address, and
   the check code indicates the data contains the at least one error when the check code does not match the error detection code.

36. The method of claim 33, wherein the memory comprises a first subsection and a second subsection, the first subsection comprises the first memory address, the second subsection comprises the second memory address, and the method further comprises:
   writing a new error detection code to each memory address in the second subsection during a boot procedure.

37. A method performed by circuitry operating at a first risk classification level, the method comprising:
   obtaining data from a first memory address of a memory operating at a second risk classification level that indicates a lower level of risk than the first risk classification level;
   determining a second memory address within the memory based at least in part on the first memory address;
   obtaining an error detection code from the second memory address; and
   generating a notification when the error detection code indicates the data contains at least one error.

38. The method of claim 37, further comprising:
   generating a check code based on the first memory address and the data obtained from the first memory address; and
   determining whether the check code matches the error detection code, the error detection code indicating the data contains the at least one error when the error detection code does not match the check code.

39. The method of claim 37, wherein the circuitry obtains the data from the first memory address during a first memory access, the circuitry obtains the error detection code from the second memory address during a second memory access, and the method further comprises:
   introducing a time delay between the first and second memory accesses.

40. The method of claim 37, wherein the circuitry comprises first and second blocks, and the method further comprises:
   sending, by the first block, a read request to the second block for the data stored in the first memory address; and
   receiving, by the second block, the read request, the second block obtaining the data, obtaining the error detection code, and generating the notification when the error detection code indicates the data contains the at least one error.

41. The method of claim 40, wherein a read timer starts when the first block sends the read request, and the method further comprises:
   generating, by the first block, a read error when the read timer indicates more than a predetermined amount of time has elapsed before the first block receives the data.

42. The method of claim 40, further comprising:
   transmitting, by the first block, a write request to the second block before the first block sends the read request, the write request comprising the data and the first memory address;
   determining, by the second block, the error detection code before the first block sends the read request;
   determining, by the second block, the second memory address before the first block sends the read request; and
   causing, by the second block, the data to be stored in the first memory address and the error detection code to be stored in the second memory before the first block sends the read request.

43. The method of claim 42, wherein a write timer starts when the first block sends the write request, and the method further comprises
   generating, by the first block, a write error when the write timer indicates more than a first predetermined amount of time has elapsed before the first block receives a response from the memory.

44. The method of claim 43, wherein a read timer starts when the first block sends the read request, and the method further comprises:
   generating, by the first block, a read error when the read timer indicates more than a second predetermined amount of time has elapsed before the first block receives the data.

45. The method of claim 42, wherein the second block causes the data to be stored in the first memory address during a first memory access, the second block causes the error detection code to be stored in the second memory address during a second memory access, and the method further comprises:

introducing a time delay between the first and second memory accesses.

46. The method of claim 37, further comprising:
writing the error detection code to the second memory address during a boot procedure.

47. The method of claim 37, wherein the first and second risk classification levels are each an Automotive Safety Integrity Level ("ASIL").

48. The method of claim 37, wherein the error detection code is a cyclic redundancy check code or an error correction code.

* * * * *